(12) United States Patent
Koike

(10) Patent No.: US 10,184,064 B2
(45) Date of Patent: Jan. 22, 2019

(54) INORGANIC COMPOSITION FOR TRANSFERRING A FINE UNEVENNESS

(75) Inventor: Jun Koike, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 698 days.

(21) Appl. No.: 13/983,726

(22) PCT Filed: Jun. 18, 2012

(86) PCT No.: PCT/JP2012/065456
§ 371 (c)(1),
(2), (4) Date: Oct. 10, 2013

(87) PCT Pub. No.: WO2012/176716
PCT Pub. Date: Dec. 27, 2012

(65) Prior Publication Data
US 2014/0128542 A1    May 8, 2014

(30) Foreign Application Priority Data

Jun. 21, 2011 (JP) ................. 2011-137449
Jun. 21, 2011 (JP) ................. 2011-137604
Jun. 21, 2011 (JP) ................. 2011-137719

(51) Int. Cl.
| | | |
|---|---|---|
| C09D 143/04 | (2006.01) | |
| C08L 83/04 | (2006.01) | |
| G03F 7/00 | (2006.01) | |
| C08G 77/56 | (2006.01) | |
| C08G 77/58 | (2006.01) | |
| C08L 83/14 | (2006.01) | |
| C09D 183/06 | (2006.01) | |
| C09D 185/04 | (2006.01) | |
| H01L 31/0216 | (2014.01) | |
| H01L 31/0236 | (2006.01) | |
| G02B 5/18 | (2006.01) | |

(52) U.S. Cl.
CPC ........... *C09D 143/04* (2013.01); *C08G 77/56* (2013.01); *C08G 77/58* (2013.01); *C08L 83/04* (2013.01); *C08L 83/14* (2013.01); *C09D 183/06* (2013.01); *C09D 185/04* (2013.01); *G02B 5/1809* (2013.01); *G03F 7/0002* (2013.01); *H01L 31/0236* (2013.01); *H01L 31/02168* (2013.01); *H01L 31/02363* (2013.01); *H01L 31/02366* (2013.01); *G02B 2207/107* (2013.01); *Y02E 10/50* (2013.01)

(58) Field of Classification Search
CPC .. C09D 143/04; C09D 183/06; C09D 185/04; C08G 77/56; C08L 83/04; C08L 83/14
See application file for complete search history.

(56) References Cited

U.S. PATENT DOCUMENTS

| | | |
|---|---|---|
| 6,849,350 B2 | 2/2005 | Minami et al. |
| 7,993,706 B2 | 8/2011 | Fujikawa et al. |
| 2001/0051311 A1 | 12/2001 | Hakata |
| 2003/0146415 A1 | 8/2003 | Minami et al. |
| 2008/0003373 A1 | 1/2008 | Yan et al. |
| 2008/0050564 A1 | 2/2008 | Fujikawa et al. |
| 2009/0155546 A1 | 6/2009 | Yamashita et al. |
| 2010/0093907 A1 | 4/2010 | Fujita et al. |
| 2013/0319522 A1 | 12/2013 | Koike et al. |

FOREIGN PATENT DOCUMENTS

| | | |
|---|---|---|
| JP | 4-275950 A | 10/1992 |
| JP | 2538527 B2 | 9/1996 |
| JP | 2000-89519 A | 3/2000 |
| JP | 2000-144116 A | 5/2000 |
| JP | 2002-338304 A | 11/2002 |
| JP | 2007-65093 A | 3/2007 |
| JP | 2008-162190 A | 7/2008 |
| JP | 2008-194894 A | 8/2008 |
| JP | 2008-541176 A | 11/2008 |
| JP | 2008-296441 A | 12/2008 |
| KR | 10-2007-0056035 A | 5/2007 |
| WO | WO 2005/121019 A1 | 12/2005 |
| WO | WO 2012/077738 A1 | 6/2012 |

OTHER PUBLICATIONS

Supplementary European Search Report for European Application No. 12802248.0 dated Feb. 6, 2014.
International Search Report, mailed Sep. 25, 2012, issued in PCT/JP2012/065456.

*Primary Examiner* — Kaj K Olsen
*Assistant Examiner* — Alexander Polyansky
(74) *Attorney, Agent, or Firm* — Birch, Stewart, Kolasch & Birch, LLP

(57) ABSTRACT

Disclosed is an inorganic composition for transferring a fine unevenness by which a fine unevenness made of an inorganic material capable of controlling a refractive index can be fabricated through a suitable transfer process. The composition according to the present invention contains a silicone compound and at least two types of metal alkoxides, wherein the metal alkoxides include a metal alkoxide having a metal species M1 (where M1 denotes at least one metal element selected from a group consisting of Ti, Zr, Zn, Sn, B, In, and Al) and a metal alkoxide having a metal species Si. In addition, a ratio between a molarity $C_{M1}$ of the metal alkoxide having the metal species M1 and a molarity $C_{Si}$ of the metal alkoxide having the metal species Si in the inorganic composition for transferring a fine unevenness satisfies a condition of $0.2 \leq C_{M1}/C_{Si} \leq 24$.

10 Claims, 9 Drawing Sheets

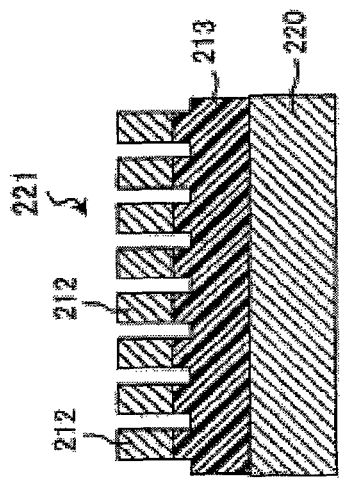
FIG. 7B
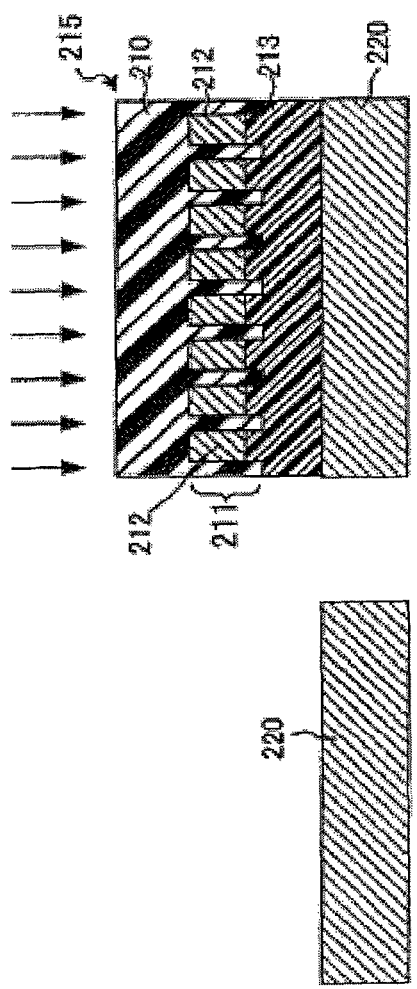
FIG. 7C
FIG. 7A
FIG. 7D
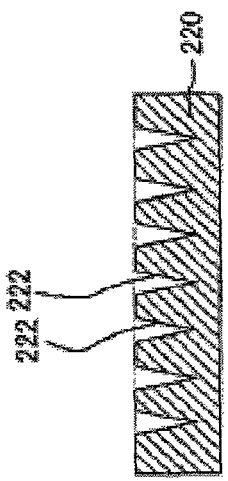
FIG. 7E
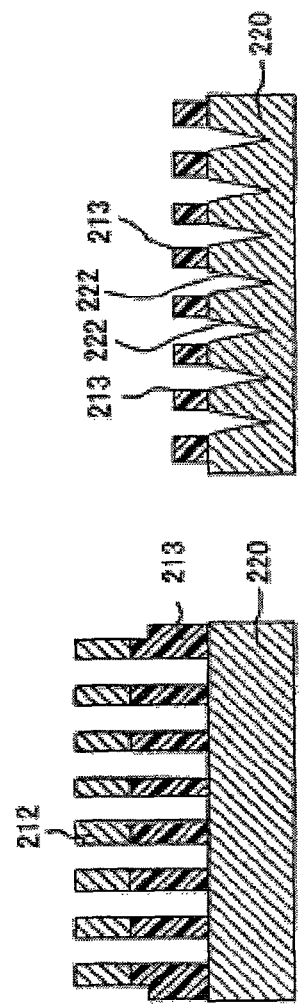
FIG. 7F

INORGANIC COMPOSITION FOR TRANSFERRING A FINE UNEVENNESS

TECHNICAL FIELD

The present invention relates to an inorganic composition for transferring a fine unevenness, and more in particular, to an inorganic composition containing a silicone compound and metal alkoxides having at least two types of metal species.

BACKGROUND ART

In development of an optical element or a biomaterial having a control target in a nano/micrometer scale area, a processing control of applied members significantly influences a control functionality. In particular, in the case of a consumer optical element, a wavelength control in several hundreds nanometer scale is desirable. Therefore, a processing precision in a several or several tens nanometers scale is important. Furthermore, from the viewpoint of productivity, a precise fabrication technology having an excellent reproducibility of the processing precision, uniformity, and throughput is desirable.

As an example of the fine fabrication technology, there has been proposed a method of obtaining a fine unevenness by solidifying (condensing) an inorganic precursor using a sol-gel technique (for example, refer to Patent Literature 1 and Patent Literature 2). For example, in the method of manufacturing a fine unevenness according to the sol-gel technique disclosed in Patent Literature 2, an inorganic precursor solution that can be solidified through a sol-gel technique is coated on a fine unevenness surface of a resin mold body (hereinafter, referred to as a "resin mold") having a fine unevenness on a surface, a solidification reaction progresses to obtain a solidified precursor, an adhesive made of an organic material is coated on a surface of the solidified precursor opposite to the resin mold, a processing target is put on, the adhesive is solidified, and then, the resin mold is released, so that a fine unevenness made of an inorganic material is formed on the processing target.

In Patent Literature 3, there is disclosed a metal oxide glass film and a method of fabricating spherical fine particles based on a sol-gel technique.

CITATION LIST

Patent Literatures

[Patent Literature 1] Japanese Unexamined Patent Application No. 2002-338304
[Patent Literature 2] Japanese Unexamined Patent Application No. 2008-162190
[Patent Literature 3] Japanese Patent No. 2,538,527

SUMMARY OF THE INVENTION

Technical Problem

However, the Patent Literature 1 does not disclose a transfer precision of the fine unevenness in a nanoscale. In addition, the fine unevenness obtained according to the Patent Literature 2 includes a processing target, an organic layer, and an inorganic layer having a fine unevenness. In this technique, since the organic layer is included, it is difficult to say that superior environmental resistance, heat resistance, or light resistance can be obtained.

In addition, in a case where the inorganic precursor is directly coated on the resin mold to form a fine unevenness, a leveling of the inorganic precursor is required. In a case where the adhesive layer is formed of an inorganic precursor to form a fine unevenness, the inorganic precursor is required to have a functionality of the adhesive. However, the Patent Literature 1 and the Patent Literature 2 fail to disclose a leveling and adhesiveness.

In a case where the fine unevenness is used in an optical element, it is necessary to match a refractive index of a substrate on which the fine unevenness is formed with a refractive index of a material for forming the fine unevenness. However, the Patent Literature 1 and the Patent Literature 2 fail to disclose refractive index variability. Meanwhile, although the Patent Literature 3 discloses refractive index variability, it also fails to disclose requirements other than the refractive index variability.

In the sol-gel technique, due to its reaction mechanism, solidification (condensation) progresses through a reaction between water vapor and the inorganic precursor. Since anti-moisture stability of the inorganic precursor significantly affects a transfer precision, an inorganic precursor solution having high anti-moisture stability is desirable. However, the Patent Literature 1 and the Patent Literature 2 fail to disclose anti-moisture stability of the inorganic precursor solution. In addition, since the solidification is performed through a slow-reaction hydrolysis/polycondensation, it is difficult to say that throughput of the solidification of the inorganic precursor solution is excellent.

The present invention has been made in view of the aforementioned problems, and an aim thereof is to provide an inorganic composition for transferring a fine unevenness by which a fine unevenness made of an inorganic material capable of controlling a refractive index can be fabricated through a suitable transfer process.

Solution to Problem

According to an aspect of the present invention, there is provided an inorganic composition for transferring a fine unevenness containing a silicone compound and at least two types of metal alkoxides, wherein the metal alkoxides include a metal alkoxide having a metal species M1 (where M1 denotes at least one metal element selected from a group consisting of Ti, Zr, Zn, Sn, B, In, and Al) and a metal alkoxide having a metal species Si, and a ratio between a molarity ($C_{M1}$) of the metal alkoxide having the metal species M1 and a molarity ($C_{Si}$) of the metal alkoxide having the metal species Si in the inorganic composition for transferring a fine unevenness satisfies a condition of Equation (1).

$$0.2 \leq C_{M1}/C_{Si} \leq 24 \tag{1}$$

According to another aspect of the present invention, there is provided an inorganic composition for transferring a fine unevenness containing a silicone compound, at least two types of metal alkoxides, and an photopolymerization initiator, wherein the metal alkoxides include a metal alkoxide having a metal species M1 (where M1 denotes at least one metal element selected from a group consisting of Ti, Zr, Zn, Sn, B, In, and Al) and a metal alkoxide having a metal species Si, the metal alkoxide having the metal species Si includes a metal alkoxide having any one of an acryl group, a methacryl group, an acryloyl group, a methacryloyl group, an acryloxy group, a methacryloxy group, a vinyl group, an epoxy group, or an oxetane group in a single molecule, and a ratio between a molarity $C_{M1}$ of the metal alkoxide having the metal species M1 and a molarity $C_{Si}$ of the metal alkoxide having the metal species Si in the inorganic composition for transferring a fine unevenness satisfies a condition of Equation (2).

$$0.04 \leq C_{M1}/C_{Si} \leq 4.56 \quad (2)$$

According to still another aspect of the present invention, there is provided an inorganic composition for transferring a fine unevenness containing a silicone compound, at least two types of metal alkoxides, and a photoacid generator, wherein the metal alkoxides include a metal alkoxide having a metal species M1 (where M1 denotes at least one metal element selected from a group consisting of Ti, Zr, Zn, Sn, B, In, and Al) and a metal alkoxide having a metal species Si, and a ratio between a molarity $C_{M1}$ of the metal alkoxide having the metal species M1 and a molarity $C_{Si}$ of the metal alkoxide having the metal species Si in the inorganic composition for transferring a fine unevenness satisfies a condition of Equation (3).

$$0.2 \leq C_{M1}/C_{Si} \leq 24 \quad (3)$$

According to further another aspect of the present invention, there is provided an inorganic composition for transferring a fine unevenness containing silicon (Si) and a metal element (M1) other than silicon (Si), wherein the silicon (Si) and the metal element (M1) are bound by interposing oxygen to make a metalloxane bond (—Si—O-M1-), the metal element (M1) other than silicon (Si) is at least a metal element selected from a group consisting of Ti, Zr, Zn, Sn, B, In, and Al, and a ratio $(C_{pM1}/C_{pSi})$ between a concentration $(C_{pSi})$ of silicon (Si) and a concentration $(C_{pM1})$ of the metal element (M1) other than silicon (Si) is 0.02 or higher and 20 or lower.

According to still further another aspect of the present invention, there is provided an inorganic composition for transferring a fine unevenness containing silicon (Si), a metal element (M1) other than silicon (Si), and a photopolymerization initiator, wherein the silicon (Si) and the metal element (M1) are bound by interposing oxygen to make a metalloxane bond (—Si—O-M1-), the metal element (M1) is at least a metal element selected from a group consisting of Ti, Zr, Zn, Sn, B, In, and Al, a ratio $(C_{pM1}/C_{pSi})$ between a concentration $(C_{pSi})$ of silicon (Si) and a concentration $(C_{pM1})$ of the metal element (M1) other than silicon (Si) is 0.01 or higher and 4.5 or lower, and the composition contains any one of an acryl group, a methacryl group, an acryloyl group, a methacryloyl group, an acryloxy group, a methacryloxy group, a vinyl group, an epoxy group, or an oxetane group.

Technical Advantage of the Invention

According to the present invention, it is possible to provide an inorganic composition for transferring a fine unevenness by which a fine unevenness made of an inorganic material capable of controlling a refractive index can be fabricated through a suitable transfer process.

BRIEF DESCRIPTION OF THE DRAWINGS

FIGS. 7A to 7F are schematic cross-sectional views illustrating a method of forming a fine unevenness on a processing target using an inorganic composition for transferring a fine unevenness according to the present embodiment;

DESCRIPTION OF EMBODIMENTS

Figure 1A:
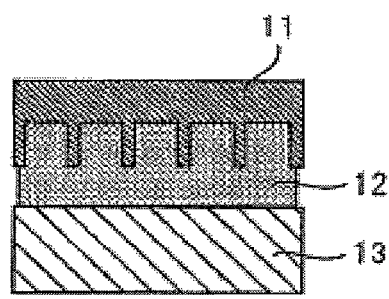
FIGS. 1A and 1B are schematic cross-sectional views illustrating a process of fabricating a structure having a fine unevenness according to an embodiment of the present invention.

Hereinafter, embodiments according to the present invention will be described in detail. In the following description, a chemical composition may be expressed in the form of -A-B-, which describes a chemical bond between elements A and B. This expression will be used even when the element A has three or more atomic bonds. That is, the notation -A-B- at least expresses a chemical bond between elements A and B and also includes a chemical bond between the element A and any element other than the element B.

Embodiment 1

The inventors find a fact that, in a fine unevenness having a composition for transferring a fine unevenness (1) (hereinafter, also referred to as a composition (1)) containing a silicone compound and at least two types of metal alkoxides including a metal alkoxide having a metal species M1 (where, M1 denotes at least a metal element selected from a group consisting of Ti, Zr, Zn, Sn, B, In, and Al) and a metal alkoxide having a metal species Si, all of a transfer precision, environmental resistance, heat resistance, light resistance, refractive index variability, anti-moisture stability as an inorganic precursor solution, a leveling, and adhesiveness are excellent if a ratio between a morality $C_{M1}$ of the metal alkoxide having a metal species M1 and a morality $C_{Si}$ of the metal alkoxide having a metal species Si satisfies a condition $0.2 \leq C_{M1}/C_{Si} \leq 24$, so that it is possible to fabricate a fine unevenness made of an inorganic material capable of controlling a refractive index through an suitable transfer process.

In the following description, a reference numeral (1-1) is inserted in front of a phrase that refers to improvement of a transfer precision of the fine unevenness as an advantage of the composition (1) according to Embodiment 1 of the present invention. A reference numeral (1-2) is inserted in front of a phrase that refers to improvement of environmental resistance, heat resistance, or light resistance of the fine unevenness as an advantage of the present invention. A reference numeral (1-3) is inserted in front of a phrase that refers to improvement of refractive index variability of the fine unevenness as an advantage of Embodiment 1. A reference numeral (1-4) is inserted in front of a phrase that refers to improvement of anti-moisture stability for an inorganic precursor solution as an advantage of the present invention. A reference numeral (1-5) is inserted in front of a phrase that refers to improvement of a leveling as an advantage of the present invention. A reference numeral (1-6) is inserted in front of a phrase that refers to improvement of adhesiveness as an advantage of the present invention.

If the composition (1) according to Embodiment 1 contains a silicone compound, (1-1) a transfer precision of the fine unevenness, (1-4) anti-moisture stability of an inorganic precursor solution, and (1-5) a leveling are improved. If a silicone compound is contained, (1-1) mold releasability unique to silicone is exhibited. Therefore, a transfer precision of the fine unevenness is improved when the resin mold is separated from a system including a resin mold, the composition (1), and a processing target. If a silicone compound is contained, (1-4) steric hindrance caused by the silicone compound is exhibited, a probability of collision (reaction) of an unreactive functional group of a metal alkoxide is reduced, and solution anti-moisture stability is improved. In particular, in a case where the metal species is a metal alkoxide other than silicon (Si), stability thereof can be significantly improved by adding the silicone compound while reactivity in only the metal alkoxide is very high. In order to (1-5) improve transfer precision, surface energy of a surface of the fine unevenness of the resin mold is typically lowered in nanoimprint. If a silicone compound is contained, a leveling of the resin mold for a surface of the fine unevenness is improved. In addition, since a silicone compound has excellent environmental resistance, heat resistance, and light resistance, (1-2) environmental resistance, heat resistance, or light resistance of the fine unevenness can be retained by adding the silicone compound.

If metal alkoxides having different metal species are contained in the composition (1) according to Embodiment 1, (1-3) refractive index variability is improved. A refractive index is associated with a density of the substance. By using different metal species in metal alkoxides and changing the amount thereof ($C_{M1}/C_{Si}$), it is possible to change an interatomic distance. As a result, it is possible to implement refractive index variability.

In particular, if the metal alkoxide is partially condensed, (1-1) a transfer precision, (1-3) refractive index variability, (1-4) anti-moisture stability, and (1-6) adhesiveness are further improved, which is desirable. If the metal alkoxide is partially condensed, a prepolymer in which metal species are chained by interposing oxygen elements can be obtained. That is, by performing the partial condensation, it is possible to make a prepolymer having a large molecular weight. If the metal alkoxide is partially condensed, and the composition (1) contains a prepolymer, (1-1) flexibility is given to the composition (1). As a result, it is possible to suppress a breakdown of the fine unevenness when the resin mold is released, so that a transfer precision is improved. (1-3) By performing the partial condensation, it is possible to form a structure in which metal species are chained by interposing oxygen in advance. If transfer is performed in this state, the number of unreacted functional groups is reduced so as to obtain a high density, in comparison with a case where the partial condensation is not performed. For this reason, it is possible to increase a refractive index. Since the number of unreacted functional groups is reduced, and the number of functional groups reacted with water vapor and the like is reduced by performing the partial condensation, (1-4) anti-moisture stability is improved. By performing the partial condensation, (1-6) the number of unreacted functional groups included in the metal alkoxide is reduced. If the metal alkoxide is condensed, alcohol corresponding to a functional group is generated based on a sol-gel reaction. For example, it is necessary to solidify the adhesive to put substances A and B together while the adhesive is interposed between substances A and B. If the number of unreacted functional groups is large, the generated alcohol also increases. If alcohol is not discharged from a gap between substances A and B, the condensation speed is lowered according to the Le Chatlier's law. By performing the partial condensation, it is possible to reduce the generated alcohol, and as a result, facilitate solidification in the interposed state.

If an aryl group exists in the composition (1) according to Embodiment 1, and in particular, the aryl group is bound with silicon, (1-2) environmental resistance, heat resistance, or light resistance is improved. In addition, since an aryl group has a large size, and the aforementioned effect of steric hindrance can be more remarkably exhibited, it is possible to suppress cohesion of metal alkoxides when the composition (1) is prepared.

In consideration of (1-1) a transfer precision, (1-4) anti-moisture stability, and (1-5) a leveling, the composition (1) according to the present invention preferably contains 0.2 or more and 47.6 or less parts by mass of a silicone compound with respect to 100 parts by mass of a metal alkoxide. If 0.2 or more and 23.8 or less parts by mass of a silicone compound is contained with respect to 100 parts by mass of the metal alkoxide, (1-1) a transfer precision, (1-4) anti-moisture stability, and (1-5) a leveling are further improved, which is desirable. It is more preferably that 0.5 or more and 23.8 or less parts by mass of a silicone compound be contained. If 1 or more and 23.8 or less parts by mass of a silicone compound is contained, it is possible to further exert the aforementioned advantages, which is desirable.

If the composition (1) according to Embodiment 1 contains a fluorine-contained silane coupling agent, the fluorine-contained silane coupling agent is biasedly precipitated to the resin mold side in order to lower the energy of the entire system when the system includes a resin mold having low surface energy, the composition (1), and a processing target. Therefore, (1-1) a transfer precision is improved. In addition, the transferred fine unevenness structure can have an antifouling property or a water-repellent property because fluorine is biasedly precipitated to a surface of the fine unevenness made of an inorganic material.

(A) Silicone Compound

A silicone compound contained in the composition (1) according to Embodiment 1 may include, but not particularly limited to, a siloxane material containing silicon and oxygen as a principal content excluding the metal alkoxide (B) described below. In addition, the composition (1) may contain a single type of the silicone compound or a plurality of types of the silicone compounds. By adding the siloxane material to the composition (1), it is possible to improve (1-1) a transfer precision, (1-4) anti-moisture stability, and (1-5) a leveling while (1-2) environmental resistance, heat resistance, and light resistance of the transferred fine unevenness is retained.

The silicone may include: for example, low-polymerization linear silicone oil exhibiting liquidity at a room temperature, such as polydimethylsiloxane (PDMS) which is a polymer of dimethyl chlorosilane, and its denatured silicone oil; high-polymerization linear PDMS; silicone rubber exhibiting a rubber-like elasticity by moderately crosslinking PDMS, and its denatured silicone rubber; silicone resin (or DQ resin) having a 3D mesh structure including resin-like silicone, PDMS, and tetrafunctional siloxane; and the like. The crosslinking agent may include an organic molecule or tetrafunctional siloxane (Q-unit).

The silicone compound contained in the composition (1) according to Embodiment 1 is preferably selected from a group consisting of PDMS, silicone oil, silicone resin, denatured silicone oil, or denatured silicone resin. By selecting the silicone compound contained in the composition (1) from such a group of silicone compounds, it is possible to improve (1-1) a transfer precision of the fine unevenness when the resin mold is released from a system including the resin mold, the composition (1), and the processing target, (1-4) stability of a metal alkoxide for steric hindrance described below, and (1-5) a leveling can be improved while (1-2) environmental resistance, heat resistance, and light resistance is retained, which is desirable. In order to further exert such advantages, the silicone compound contained in the composition (1) according to the present invention is more preferably selected from denatured silicone oil or denatured silicone resin. A single type of compound may be used for the silicone compound or a plurality of types of compounds may be mixedly used.

The denatured silicone oil or the denatured silicone resin is obtained by denaturing a side chain and/or a terminated end of polysiloxane and may be classified into reactive silicone and unreactive silicone. The reactive silicone preferably includes silicone containing a hydroxyl group (—OH), silicone containing an alkoxy group, silicone containing a trialkoxy group, or silicone containing an epoxy group. The unreactive silicone preferably includes silicone containing a phenyl group, silicone containing both a methyl group and a phenyl group, and the like. A combination of a single polysiloxane molecule and two or more denatured elements described above may also be used.

Specifically, commercially available denatured silicone may include, for example, TSF4421 (produced by GE TOSHIBA SILICONES Co., Ltd.), XF42-334 (produced by GE TOSHIBA SILICONES Co., Ltd.), XF42-B3629 (produced by GE TOSHIBA SILICONES Co., Ltd.), XF42-A3161 (produced by GE TOSHIBA SILICONES Co., Ltd.), FZ-3720 (produced by Dow Corning Toray Corporation), BY16-839 (produced by Dow Corning Toray Corporation), SF8411 (produced by Dow Corning Toray Corporation), FZ-3736 (produced by Dow Corning Toray Corporation), BY16-876 (produced by Dow Corning Toray Corporation), SF8421 (produced by Dow Corning Toray Corporation), SF8416 (produced by Dow Corning Toray Corporation), SH203 (produced by Dow Corning Toray Corporation), SH230 (produced by Dow Corning Toray Corporation), SH510 (produced by Dow Corning Toray Corporation), SH550 (produced by Dow Corning Toray Corporation), SH710 (produced by Dow Corning Toray Corporation), SF8419 (produced by Dow Corning Toray Corporation), SF8422 (produced by Dow Corning Toray Corporation), BY16 series (produced by Dow Corning Toray Corporation), FZ3785 (produced by Dow Corning Toray Corporation), KF-410 (produced by Shin-Etsu Chemical Co., Ltd.), KF-412 (produced by Shin-Etsu Chemical Co., Ltd.), KF-413 (produced by Shin-Etsu Chemical Co., Ltd.), KF-414 (produced by Shin-Etsu Chemical Co., Ltd.), KF-415 (produced by Shin-Etsu Chemical Co., Ltd.), KF-351A (produced by Shin-Etsu Chemical Co., Ltd.), KF-4003 (produced by Shin-Etsu Chemical Co., Ltd.), KF-4701 (produced by Shin-Etsu Chemical Co., Ltd.), KF-4917 (produced by Shin-Etsu Chemical Co., Ltd.), KF-7235B (produced by Shin-Etsu Chemical Co., Ltd.), KR213 (produced by Shin-Etsu Chemical Co., Ltd.), KR500 (produced by Shin-Etsu Chemical Co., Ltd.), KF-9701 (produced by Shin-Etsu Chemical Co., Ltd.), X21-5841 (produced by Shin-Etsu Chemical Co., Ltd.), X-22-2000 (produced by Shin-Etsu Chemical Co., Ltd.), X-22-3710 (produced by Shin-Etsu Chemical Co., Ltd.), X-22-7322 (produced by Shin-Etsu Chemical Co., Ltd.), X-22-1877 (produced by Shin-Etsu Chemical Co., Ltd.), X-22-2516 (produced by Shin-Etsu Chemical Co., Ltd.), PAM-E (produced by Shin-Etsu Chemical Co., Ltd.), and the like.

(B) Metal Alkoxide

The composition (1) according to Embodiment 1 contains at least two types of metal alkoxides including a metal alkoxide having a metal species M1 (where, M1 denotes at least one metal element selected from a group consisting of Ti, Zr, Zn, Sn, B, In, or Al) and a metal alkoxide having a metal species Si. If the metal alkoxide having a metal species M1 is contained, (1-3) a refractive index can be controllable. In addition, if the metal alkoxide having a metal species Si is contained, (1-1) a transfer precision of the fine unevenness when the resin mold is released from a system including the resin mold, the composition (1), and the processing target, (1-4) anti-moisture stability of the composition (1), and (1-6) adhesiveness are improved. Two or more metal alkoxides having the metal species M1 or two or more metal alkoxides having the metal species Si may also be used. In addition, a metal alkoxide having a metal species M2 (where, M2≠M1 and M2≠Si) may also be used instead of or in addition to the metal alkoxide having the metal species M1 and the metal alkoxide having the metal species Si. Similarly, a metal alkoxide having a metal species M3 (where, M3≠M2, M3≠M1, and M3≠Si) may also be used.

In the composition (1) according to Embodiment 1, an interatomic distance can be changed by changing a ratio between a molarity $C_{M1}$ of the metal alkoxide having the metal species M1 and a molarity $C_{Si}$ of the metal alkoxide having the metal species Si. As a result, a refractive index can be changed. Since a ratio between $C_{M1}$ and $C_{Si}$ can be selected within a range of $0.2 \leq C_{M1}/C_{Si} \leq 24$, (1-3) a refractive index can be flexibly changed. Here, the molarity $C_{Si}$ of the metal alkoxide having the metal species Si refers to a total concentration of the metal alkoxide having the metal species Si contained in the composition (1). Meanwhile, the molarity $C_{M1}$ of the metal alkoxide having the metal species M1 refers to a total sum of the molarities of overall metal alkoxides having metal species other than the metal alkoxide having the metal species Si contained in the composition (1). For example, when metal alkoxides having metal species Ti, Zr, and Al have molarities $C_{Ti}$, $C_{Zr}$, and $C_{Al}$, respectively, the molarity $C_{M1}$ becomes $C_{Ti}+C_{Zr}+C_{Al}$.

The metal alkoxide according to Embodiment 1 may include a group of compounds solidified as hydrolysis/polycondensation progresses by an effect of heat or catalysis. Such a group of compounds may include, but not particularly limited to, a metal alkoxide, a metal alcoholate, a metal chelate compound, a halogenated silane, liquid glass, spin-on glass, and a reactant thereof. These materials are collectively referred to as a metal alkoxide.

From the viewpoint of (1-3) refractive index variability, the metal species M1 may include at least one element selected from a group consisting of Ti, Zr, Zn, Sn, B, In, and Al. Which metal species is contained in the metal alkoxide may be selected based on functionalities to be provided to the fine unevenness structure having the solidified composition (1) according to the present invention or from the viewpoint of handling conveniences. For example, if a metal alkoxide having a metal species Ti or Zn is used, photocatalytic activity can be provided to the solidified composition (1). For example, if a metal alkoxide having a metal species of In, Sn, Zn, or the like is used, conductivity can be provided.

Metal alkoxides are a group of compounds obtained by combining the aforementioned metal species and a functional group such as a hydroxy group, a methoxy group, an ethoxy group, a propyl group, or an isopropyl group. Such a functional group generates a metalloxane bond (-Me-O-Me-), where Me denotes a metal species, by performing a hydrolysis/polycondensation reaction using water, an organic solvent, hydrolysis catalyst, and the like. For example, if a metal species Si is used, a metalloxane bond —Si—O—Si— (siloxane bond) is generated. When a metal alkoxide of a metal species M1 and a metal alkoxide of a metal species Si are used, for example, a bond -M1-O—Si— may be generated.

The metal alkoxide having a metal species Si may include, for example, dimethyldiethoxysilane, diphenyldiethoxysilane, phenyltriethoxysilane, methyltriethoxysilane, vinyltriethoxysilane, p-styryltriethoxysilane, methylphenyldiethoxysilane, tetraethoxysilane, p-styryltriethoxysilane, a compound obtained by substituting an ethoxy group of these compounds with a methoxy group, a propyl group, or a isopropyl group, and the like. In addition, a compound having a hydroxy group such as diphenylsilanediol or dimethylsilanediol may also be selected.

At least one of the aforementioned functional groups may be directly substituted with a phenyl group and the like without using an oxygen atom from the metal species. For example, diphenylsilanediol, dimethylsilanediol, or the like may be used. By using such compounds, it is possible to increase a density obtained after condensation and a refractive index. Therefore, in a case where the solidified composition (1) necessitates a high refractive index, such a metal alkoxide is preferably selected.

Halogenated silanes are a group of compounds obtained by substituting the metal species of the aforementioned metal alkoxide with silicon and substituting a functional group of hydrolysis/polycondensation with a halogen atom.

The liquid glass may include a TGA series produced by Apollo Rink Corporation, and the like. In addition, a sol-gel compound may be added depending on a desired material property.

A silsesquioxane compound may be used as the metal alkoxide according to Embodiment 1. Silsesquioxanes are a compound obtained by binding a single silicon atom, a single organic group, and three oxygen atoms. The silsesquioxane may include, but not particularly limited to, polysiloxane having a compositional formula $(RSiO_{3/2})_n$. The silsesquioxane may include polysiloxane having any structure such as a cage type, a ladder type, or a random type. Since physical stability for the solidified composition (1) is improved, polysiloxane preferably has a cage-type or ladder-type structure. In addition, in the compositional formula $(RSiO_{3/2})_n$, the symbol R may denote a substituent or non-substituent siloxy group or any other substituent group, and the number n is preferably set to 8 to 12. In order to obtain an excellent solidification property of the composition (1), n is more preferably set to 8 to 10, and further preferably, 8. The n groups R may be identical or different.

The silsesquioxane compound may include, for example, polyhdrogen silsesquioxane, polymethylsilsesquioxane, polyethylsilsesquioxane, polypropylsilsesquioxane, polyisopropylsilsesquioxane, polybutylsilsesquioxane, poly(-sec-butyl)silsesquioxane, poly(-tert-butyl)silsesquioxane, polyphenylsilsesquioxane, and the like. In addition, at least one of the n groups R in the silsesquioxane may be substituted with the substituent groups described below. The substituent groups may include, for example, trifluoromethyl, 2,2,2-trifluoro ethyl, 3,3,3-trifluoropropyl, 2,2,3,3-tetrafluoropropyl, 2,2,3,3,3-pentafluoropropyl, 2,2,2-trifluoro-1-trifluoromethylethyl, 2,2,3,4,4,4-hexafluorobutyl, 2,2,3,3,4,4,5,5-octafluoropentyl, 2,2,2-trifluoroethyl, 2,2,3,3-tetrafluoropropyl, 2,2,3,3,3-pentafluoropropyl, 2,2,3,3,4,4,5,5-octafluoropentyl, 3,3,3-trifluoropropyl, nonafluoro 1,1,2,2-tetrahydrohexyl, tridecafluoro-1,1,2,2-tetrahydrooctyl, heptadecafluoro 1,1,2,2-tetrahydrodecyl, perfluoro-1H,1H,2H,2H-dodecy 1, perfluoro-1H,1H,2H,2H-tetradecy 1,3, 3,4,4,5,5,6,6-nonafluorohexyl, an alkoxysiryl group, and the like. In addition, commercially available silsesquioxanes may be used. For example, the commercially available silsesquioxanes may include various cage-type silsesquioxane derivatives produced by Hybrid Plastics, Inc. or silsesquioxane derivatives produced by Sigma-Aldrich Co., LLC. and the like.

The metal alkoxide according to Embodiment 1 preferably has a prepolymer condition in which a polymerization reaction is partially generated, and unreacted functional groups remain. If the metal alkoxide is partially condensed, it is possible to obtain a prepolymer having metal species chained by interposing an oxygen element. That is, by performing the partial condensation, it is possible to produce a prepolymer having a large molecular weight. By partially condensing the metal alkoxide, (1-1) the composition (1) contains a prepolymer, so that flexibility is provided to the composition (1). As a result, it is possible to suppress a breakdown of the fine unevenness generated when the resin mold is released, and the like, so that a transfer precision is improved. By performing the partial condensation, (1-3) it is possible to form a structure having metal species chained by interposing oxygen in advance. If the fine unevenness is transferred in this state, the number of unreacted functional groups is reduced to obtain a high density, in comparison with a case where the partial condensation is not performed. For this reason, it is possible to make a change to increase the refractive index. By performing the partial condensation, (1-4) the number of unreacted functional groups and the number of functional groups reacted with water vapor and the like are reduced, so that stability is improved. By performing the partial condensation, (1-6) the number of unreacted functional groups of the metal alkoxide is reduced. As the metal alkoxide is condensed, alcohol corresponding to the functional group is generated based on the sol-gel reaction. It is necessary to solidify the adhesive to put substances A and B together while the adhesive is interposed between substances A and B. If the number of unreacted functional groups is large, the amount of generated alcohol is also large. In a case where the alcohol is not discharged from a gap between substances A and B, a condensation speed is lowered according to the Le Chatlier's law. By performing the partial condensation, it is possible to reduce the amount of generated alcohol and, as a result, facilitate solidification in the interposed state.

The partial condensation degree can be controlled by a reaction atmosphere, a composition of the metal alkoxide, and the like. What the partial condensation degree is used for a prepolymer state can be appropriately selected depending on a field of use or how to use, and is not particularly limited therefore. For example, the composition (1) containing the partially condensed material preferably has a viscosity of 50 cP or higher in order to more improve (1-1) a transfer precision, (1-3) refractive index variability, (1-4) anti-moisture stability. The composition (1) more preferably has a viscosity of 100 cP or higher, and most preferably 150 cP or higher. From the viewpoint of improvement of (1-1) a transfer precision, the composition (1) preferably has a viscosity of 10,000 cP or lower, more preferably 8,000 cP or lower, and, most preferably 5000 cP or lower. It is assumed that such a viscosity is measured at a temperature of 25° C. while, in particular, a solvent content in the composition (1) is equal to or smaller than 5%.

In the composition (1) according to the present invention, in a case where the metal alkoxide contains a prepolymer, it is possible to flexibly change (1-3) a refractive index and improve (1-1) a transfer precision by setting a ratio $C_{pM1}/C_{pSi}$ between a concentration $C_{pSi}$ of silicon (Si) in the entire composition and a total concentration $C_{pM1}$ of metal elements other than silicon (Si) to 0.02 or higher and 20 or lower. From the viewpoint of similar advantages, the ratio $C_{pM1}/C_{pSi}$ is preferably set to 0.05 or higher and 20 or lower, and most preferably 0.1 or higher and 15 or lower. Furthermore, from the viewpoint of improvement of a physical strength of the solidified transferred composition (1), the ratio $C_{pM1}/C_{pSi}$ is more preferably set to 0.3 or higher and 10 or lower, and most preferably 0.5 or higher and 5 or lower.

The prepolymer for promoting the partial condensation may be obtained by dehydration-based polycondensation and/or dealcoholization reaction-based polycondensation. For example, it is possible to obtain the prepolymer by heating a solution including a metal alkoxide, water, and a solvent (such as alcohol, ketone, or ether) within a temperature range of 20 to 150° C. and performing hydrolysis and polycondensation. The polycondensation degree can be controlled and appropriately selected based on a temperature, a reaction time, and a pressure (pressure deficit). If the hydrolysis/polycondensation is slowly performed by using moisture in the environmental atmosphere (water vapor based on humidity) without adding water, it is possible to reduce a molecular weight distribution of the prepolymer. Furthermore, in order to promote polycondensation, energy beams may be irradiated. Here, a light source of energy beams may be appropriately selected depending on a type of the metal alkoxide. The light source of energy beams may include, but not particularly limited to, a UV-LED light source, a metal halide light source, a high-pressure mercury lamp light source, and the like. In particular, if a photoacid generator is added to the metal alkoxide, and energy beams are irradiated onto the corresponding composition, photoacid is generated from the photoacid generator, and polycondensation of the metal alkoxide can be promoted by using the photoacid as a catalyst so as to obtain a prepolymer. Moreover, the prepolymer may be obtained by performing the aforementioned operation while the metal alkoxide is chelated in order to control a condensation degree and a steric arrangement of the prepolymer.

It is defined that the aforementioned prepolymer has a state in which at least four or more metal elements are chained by interposing oxygen atoms. That is, it is defined that the prepolymer has a state in which metal elements are condensed in a chain of —O-M1-O-M2-O-M3-O-M4-O— and so on. Here, M1, M2, M3, and M4 denote metal elements that may be identical or different. For example, in a case where a metalloxane bond containing a chain —O—Ti—O— is generated by preliminarily condensing a metal alkoxide having titanium as a metal species, a prepolymer expressed as a general formula [—O—Ti-]$_{11}$ is obtained (where n≥4). Similarly, for example, in a case where a metalloxane bond having a chain —O—Ti—O—Si—O— is generated by preliminarily condensing a metal alkoxide having titanium as a metal species and a metal alkoxide having silicon as a metal species, a prepolymer expressed as a general formula [—O—Ti—O—Si-]$_{11}$ is obtained (where n≥2). However, in a case where dissimilar metal elements are contained, it is not necessary to form an alternate arrangement such as —O—Ti—O—Si—. For this reason, the prepolymer has a general formula [—O-M-]$_n$ (where M=Ti or Si, and n≥4).

The metal alkoxide contained in the composition (1) according to Embodiment 1 may include a fluorine-contained silane coupling agent. If the fluorine-contained silane coupling agent is included, in a system including the resin mold of low surface energy, the composition (1), and the processing target, the fluorine-contained silane coupling agent is biasedly precipitated to the resin mold side in order to lower energy of the entire system. Therefore, (1-1) a transfer precision is improved. In addition, since fluorine is biasedly precipitated on a surface of the transferred fine unevenness made of an inorganic material, the fine unevenness structure has an antifouling property or a water-repellent property, which is desirable. A concentration of the fluorine element in the composition (1) is preferably set to 0 atm % or higher and 10 atm % or lower. In order to further improve (1-2) environmental resistance, heat resistance, light resistance, (1-5) a leveling, and (1-6) adhesiveness, a concentration of the fluorine element is preferably set to 0 atm % or higher and 5 atm % or lower, and more preferably 0 atm % or higher and 2 atm % or lower.

The fluorine-contained silane coupling agent may include, for example, a compound having a general formula $F_3C$—$(CF_2)_n$—$(CH_2)_m$—$Si(O-R)_3$ (where n denotes an integer of 1 to 11, m denotes an integer of 1 to 4, and R denotes an alkyl group having a carbon number of 1 to 3). The fluorine-contained silane coupling agent may contain a polyfluoroalkylene chain and/or a perfluoro(polyoxyalkylene) chain. More preferably, the fluorine-contained silane coupling agent contains a linear perfluoroalkylene group or a perfluoro oxyalkylene group in which an ether-like oxygen atom is inserted between a carbon atom and a carbon atom, and a trifluoromethyl group exists in a side chain. In particular, it is preferable that the fluorine-contained silane coupling agent contain a linear perfluoro(polyoxyalkylene) chain and/or a linear polyfluoroalkylene chain in which a trifluoromethyl group exists in a side chain or a molecular structure end. The polyfluoroalkylene chain preferably includes a polyfluoroalkylene group having a carbon number of 2 to 24. The perfluoro(polyoxyalkylene) chain preferably includes at least one or more perfluoro(oxyalkylene) unit selected from a group consisting of a $(CF_2CF_2O)$ unit, a $(CF_2CF(CF_3)O)$ unit, a $(CF_2CF_2CF_2O)$ unit, and a $(CF_2O)$ unit. More preferably, the perfluoro(polyoxyalkylene) chain preferably includes a $(CF_2CF_2O)$ unit, a $(CF_2CF(CF_3)O)$ unit, or a $(CF_2CF_2CF_2O)$ unit. In particular, it is preferable that the perfluoro(polyoxyalkylene) chain includes a $(CF_2CF_2O)$ unit because of an excellent surface biased-precipitation characteristic.

(C) Other Additives

The composition (1) according to Embodiment 1 may contain a polysilane. Polysilanes are a group of compounds having a silicon element in a main chain, in which a bond —Si—Si— is replicated. By irradiating ultraviolet rays onto the polysilane, the bond —Si—Si— is broken, and a siloxane bond is generated. For this reason, a siloxane bond can be effectively generated by providing a polysilane and irradiating ultraviolet rays, so that it is possible to improve (1-1) a transfer precision and (1-6) adhesiveness of the composition (1).

The composition (1) according to Embodiment 1 may contain metal oxide fine particles. Due to the metal oxide fine particles, it is possible to improve (1-2) environmental resistance, heat resistance, light resistance, and (1-3) refractive index variability. The metal oxide fine particles may include, for example, silica, alumina, zirconia, titania, indium tin oxide (ITO), tin oxide, zinc oxide, antimony oxide, composite particles thereof, and the like. In addition, the metal oxide fine particles may include a metal oxide filler. The metal oxide fine particles may have a chemically modified surface. For example, surfaces of fine particles such as silica, alumina, titania, ITO, and zinc oxide may be modified using a fluorine-contained silane coupling agent. If titania, zinc oxide, or composite fine particles thereof having photocatalytic activity is selected as the metal oxide fine particles, it is possible to allow the solidified composition (1) to have photocatalytic activity. In addition, if the composition (1) includes the metal oxide fine particles, for the fine unevenness having the solidified composition (1) transferred onto the processing target, a concentration gradient of the fine particles may be produced from an air interface side of the fine unevenness to a lateral side of the processing target side. In this case, since a concentration of the metal oxide fine particles is changed from the fine unevenness surface side to the processing target surface side, the refractive index changes continuously.

The composition (1) according to Embodiment 1 may include a solvent depending on an application (coating) method. The solvent may include, for example, water, N,N-dimethylformamide, N-methyl-2-pyrrolidone, N-ethyl-2-pyrrolidone, N-vinyl-2-pyrrolidone, N,N-dimethylacetamide, dimethyl sulfoxide, hexamethylphosphoramide, pyridine, cyclopentanone, γ-butyrolactone, α-acetyl-γ-butyrolactone, tetramethylurea, 1,3-dimethyl-2-imidazolinone, N-cyclohexyl-2-pyrrolidone, propylene glycol monomethyl ether, propylene glycol monomethyl ether acetate, propylene glycol monomethyl ether, acetone, methyl ethyl ketone, methyl isobutyl ketone, anisole, methyl acetate, ethyl acetate, ethyl lactate, butyl lactate, morpholine, methanol, ethanol, isopropyl alcohol, butanol, 2-butanol, and the like. They may be used solely or in a combination of two or more elements. Among these, a ketone-based solvent or an ether-based solvent is preferably used. In particular, if the solvent has a radius of inertia of 5 nm or smaller in a case where the composition (1) is dissolved in a solvent with a weight concentration of 3%, (1-1) a transfer precision is improved, which is desirable. In particular, the radius of inertia is preferably set to 3 nm or smaller, more preferably 1.5 nm or smaller, and most preferably 1 nm or smaller. Here, the radius of inertia refers to a radius computed by applying a Gunier plot to the measurement result obtained through a small-angle X-ray scattering measurement using an X-ray of a wavelength of 0.154 nm.

(D) Method of Transferring Fine Unevenness

A method of forming the fine unevenness using the composition (1) according to Embodiment 1 is not particularly limited if the fine unevenness provided on a surface of the resin mold (cast) can be transferred to a processing target. Here, a method of forming the fine unevenness of FIGS. 1A to 3C will be exemplarily described. FIGS. 1A to 3C are schematic cross-sectional views illustrating a process of fabricating a structure having the fine unevenness according to an embodiment of the present invention.

A method of forming the fine unevenness of FIGS. 1A and 1B will be described. First, as illustrated in FIG. 1A, the composition (1) 12 is coated on a surface of the processing target 13, and the resin mold 11 is pressedly bonded to a film of the composition (1) 12. Alternatively, first, a film of the composition (1) 12 may be coated on a surface of the resin mold 11 to form an uneven layer, and the uneven layer may be pressedly bonded to a surface of the inorganic substrate 13. Then, the composition (1) 12 interposed between the processing target 13 and the resin mold 11 (hereinafter, referred to as an uneven layer 12) is solidified (condensed). This solidification is preferably performed through heating within a temperature range of 20 to 200° C. from the viewpoint of a solidification (condensation) speed or (1-1) a transfer precision. In particular, the solidification is preferably performed through multistage heating for slowly performing the heating across 2 to 5 stages. Although a film thickness of the composition (1) depends on constituents of the composition (1) or a type of the fine unevenness, the film thickness is preferably set to, generally, 3 μm or smaller because it is possible to obtain a fast transfer speed and guarantee (1-1) a transfer precision, which is desirable. In order to further exert the advantages of the present invention, the film thickness is more preferably set to 1.5 μm or smaller, and most preferably 1.2 μm or smaller. In addition, the lower limit is preferably equal to or higher than a volume of the fine unevenness. In order to further improve a transfer precision, the lower limit is more preferably set to 1.2 times or greater of the volume of the fine unevenness, and most preferably 1.5 times of the volume of the fine unevenness. Since a solidification characteristic of the composition (1) 12 (uneven layer 12) interposed between the resin mold 11 and the processing target 13 is improved by using the resin mold 11, (1-1) a transfer precision is improved. This is because volatile components generated by solidification of the composition (1) are absorbed in the resin mold 11 or are discharged to the external side passing through the resin mold 11. As described above, in a case where the composition (1) according to the present invention is used, it is preferable that any one of the processing target that receives the fine unevenness having the composition (1) and the mold for transferring the fine unevenness to the composition (1) be made of resin.

Figure 1B:
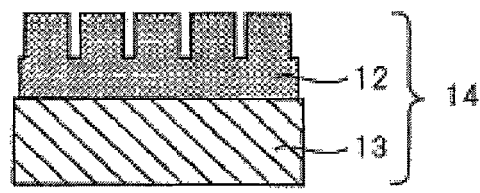

Subsequently, by releasing the resin mold 11, a structure 14 having the processing target 13 and the uneven layer 12 made of the solidified composition (1) is obtained as illustrated in FIG. 1B. Then, condensation may be further promoted by heating the structure 14.

Figure 2A:
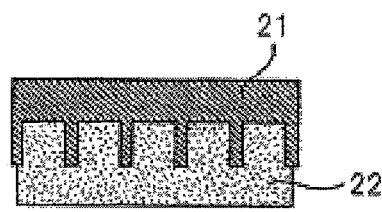
FIGS. 2A to 2C are schematic cross-sectional views illustrating a process of fabricating a structure having a fine unevenness according to an embodiment of the present invention.

Next, a method of forming the fine unevenness of FIGS. 2A to 2C will be described. First, as illustrated in FIG. 2A, the composition (1) is coated on a surface of the resin mold 21, and the uneven layer 22 having the composition (1) is gelated through a sol-gel reaction. Here, the gelation may be performed by disposing the uneven layer 22 at a room temperature, heating the uneven layer 22 within a temperature range equal to or higher than a room temperature and equal to or lower than 200° C., irradiating energy beams (especially, UV), spraying high-moisture air or vapor, or the like.

Figure 2B:
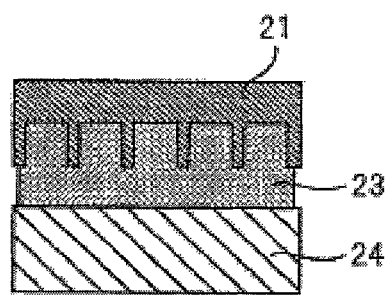

Subsequently, the gelated uneven layer 23 is put on a surface of the processing target 24 as illustrated in FIG. 2B, and the gelated composition (1) interposed between the processing target 24 and the resin mold 21 is solidified. This solidification is preferably performed through heating within a temperature range of 20 to 200° C. from the viewpoint of a solidification (condensation) speed or (1-1) a transfer precision. In particular, the solidification is preferably performed through multistage heating for slowly performing the heating across 2 to 5 stages. Although a film thickness of the composition (1) depends on constituents of the composition (1) or a type of the fine unevenness, the film thickness is preferably set to approximately 5 µm or smaller because it is possible to obtain a fast transfer speed and guarantee (1-1) a transfer precision, which is desirable. In order to further exert the advantages of the present invention, the film thickness is more preferably set to 3 µm or smaller, and most preferably 1.5 µm or smaller. In addition, the lower limit is preferably equal to or higher than a volume of the fine unevenness. In order to further improve a transfer precision, the lower limit is more preferably set to 1.2 times or higher of the volume of the fine unevenness, and most preferably 1.5 times or higher of the volume of the fine unevenness. Since a solidification characteristic of the composition (1) interposed between the resin mold 21 and the processing target 24 is improved by using the resin mold, (1-1) a transfer precision is improved. This is because volatile components generated by solidification of the composition (1) are absorbed in the resin mold 21 or are discharged to the external side passing through the resin mold 21. As described above, in a case where the composition (1) according to the present invention is used, it is preferable that any one of the processing target that receives the fine unevenness having the composition (1) and the mold for transferring the fine unevenness to the composition (1) be made of resin.

Figure 2C:
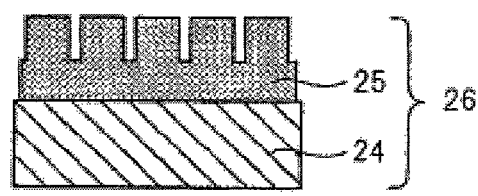

Subsequently, by releasing the resin mold 21, a structure 26 having the processing target 24 and the uneven layer 25 made of the solidified composition (1) is obtained as illustrated in FIG. 2C. Then, condensation may be further promoted by heating the structure 26.

Figure 3A:
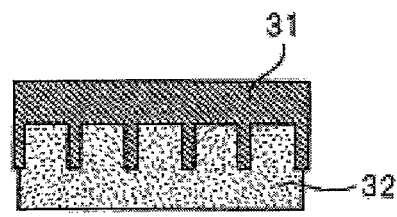
FIGS. 3A to 3C are schematic cross-sectional views illustrating a process of fabricating a structure having a fine unevenness according to an embodiment of the present invention.

Next, a method of forming the fine unevenness of FIGS. 3A to 3C will be described. First, as illustrated in FIG. 3A, the composition (1) is coated on a surface of the resin mold 31 to form an uneven layer 32, and the composition (1) is solidified until a surface stickiness is eliminated. This solidification is preferably performed through heating within a temperature range of 20 to 200° C. from the viewpoint of a solidification (condensation) speed or (1-1) or a transfer precision. In particular, the solidification is preferably performed through multistage heating for slowly performing the heating across 2 to 5 stages. In addition, along with the aforementioned heating, the uneven layer 32 may be disposed under a decompressive atmosphere. If the uneven layer 32 is disposed under a decompressive atmosphere, it is possible to remove water or alcohol generated in the sol-gel reaction and increase a reaction speed toward condensation in the sol-gel reaction.

Figure 3B:
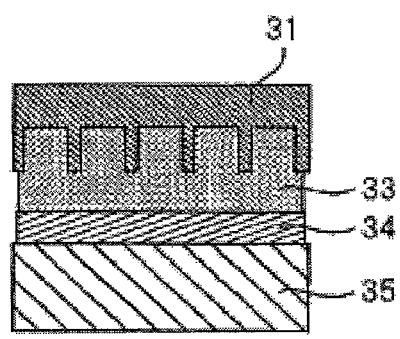

Then, as illustrated in FIG. 3B, an adhesive layer 34 made of the composition (1) is formed on a surface of the processing target 35. Here, the uneven layer 32 illustrated in FIG. 3A and the adhesive layer 34 may be formed of the same composition (1) or may be formed of different compositions.

Subsequently, as illustrated in FIG. 3B, the solidified uneven layer 33 is put on a surface of the adhesive layer 34. Then, the adhesive layer 34 is solidified. Then, as illustrated in FIG. 3C, the resin mold 31 is released, so that a structure 37 including the processing target 35, the solidified adhesive layer 36, and the solidified uneven layer 33 is obtained. Then, condensation may be further promoted by heating the structure 37. This solidification of the adhesive layer 34 is preferably performed through heating within a temperature range of 20 to 200° C. from the viewpoint of a solidification (condensation) speed or (1-1) a transfer precision. In particular, the solidification is preferably performed through multistage heating for slowly performing the heating across 2 to 5 stages. Although a thickness of the adhesive layer 34 depends on constituents of the adhesive layer 34 or a type of the fine unevenness, the thickness of the adhesive layer 34 is preferably set to approximately 3 µm or smaller because it is possible to obtain a fast transfer speed and guarantee (1-1) a transfer precision, which is desirable. In order to further exert the advantages of the present invention, the thickness of the adhesive layer 34 is more preferably set to 1.5 µm or smaller, and most preferably 1.2 µm or smaller. In addition, the lower limit is preferably set to 30 nm or higher in order to improve adhesiveness. The lower limit is more preferably set to 100 nm or higher, and most preferably, 300 nm or higher. Since a solidification characteristic of the adhesive layer 34 is improved by using the resin mold, (1-1) a transfer precision is improved. This is because volatile components generated by solidification of the adhesive layer 34 are absorbed in the resin mold 31 or are discharged to the external side passing through the resin mold 31. As described above, in a case where the adhesive layer according to the present invention is used, it is preferable that any one of the processing target being put the fine unevenness and the mold be made of resin.

In addition, as a method of forming the uneven layer 32 comprised of the composition (1) on a surface of the resin mold 31, the composition (1) may be directly coated on a surface of the resin mold 31, or a transfer film may be made by coating the composition (1) on another substrate and then contacting it face to face with the resin mold 31 to transfer.

According to the method of forming the fine unevenness illustrated in FIGS. 1A to 3C, it is possible to manufacture layered products 14, 26, and 37 through a simple lamination process by using a reel-like resin mold as the resin molds 11, 21, and 31. If a roll-to-roll process is applied, it is possible to windingly collect the resin mold having the composition (1). By winding out the resin mold, it is possible to produce the fine unevenness in a large area.

Such a fine unevenness may be transferred to, for example, a transparent conductive oxide (TCO) surface of an LED element manufactured through a wire method (hereinafter, referred to as a TCO surface) or sapphire of an LED element manufactured through a flip-chip method (hereinafter, referred to as a sapphire surface). By transferring such a fine unevenness, it is possible to obtain overall advantages of Embodiment 1 including (1-1) a transfer precision, (1-2) environmental resistance, heat resistance, light resistance, (1-3) refractive index variability, (1-4) anti-moisture stability, (1-5) a leveling, and (1-6) adhesiveness and more effectively emit light with an LED element.

The fine unevenness is transferred to the TCO surface or the sapphire surface of an LED element through the following process.

First, the composition (1) according to Embodiment 1 is coated on a fine uneven surface of the resin mold having a fine unevenness on its surface. Here, the coating needs to be performed in a uniform manner, so that (1-4) anti-moisture stability and (1-5) a leveling as an advantage of Embodiment 1 are exerted. Subsequently, curing is performed until stickiness of the composition (1) is eliminated. Then, a cover film is put on the surface of the composition (1).

A thin film of the composition (1) serving as an adhesive layer is formed on the TCO surface (sapphire surface), and partial condensation is promoted. Here, (1-4) anti-moisture stability as an advantage of Embodiment 1 is also exerted. Subsequently, the surface of the composition (1) obtained after releasing the cover film is put on the adhesive layer formed on the TCO surface (sapphire surface). This state means a state in which the fine unevenness formed of the solidified composition (1) on the TCO surface (sapphire surface) is protected by the resin mold in a fine unevenness scale. In addition, it is not necessary to use the adhesive layer. Furthermore, the composition (1) used to form the fine unevenness and the composition (1) used to serve as the adhesive layer may be identical to or different from each other if they are formed according to Embodiment 1.

Then, a system including the TCO surface (sapphire surface), the adhesive layer, the composition (1), and the resin mold is cured to solidify the adhesive layer. In addition, an interface between the adhesive layer and the TCO (sapphire) and an interface between the adhesive layer and the composition (1) are combined and bonded. Here, (1-6) adhesiveness as an advantage of Embodiment 1 is exerted. Then, the resin mold is released, so that a fine unevenness made of the solidified composition (1) may be formed on the TCO surface (sapphire surface). Since an inversion structure of the fine unevenness of the resin mold is transferred to the fine unevenness made of the solidified composition (1) with a high precision, (1-1) a transfer precision as an advantage of Embodiment 1 is exerted. Finally, a heating process is performed to further, promote condensation of the composition (1). In addition, the composition (1) according to Embodiment 1 may be coated on the fine uneven surface of the resin mold having the fine unevenness on its surface, a protection film may be put on, and the resulting material may be windingly recovered while the composition (1) is stably gelated, so that the fine unevenness can be similarly transferred to the TCO surface (sapphire surface) without using the adhesive layer in the aforementioned operation.

If a refractive index of a material forming the fine unevenness made of an inorganic material on the TCO surface (sapphire surface) matches with a refractive index of the TCO surface (sapphire surface), it is possible to suppress reflection of light on the formed interface and more effectively emit light with an LED element. Here, (1-3) refractive index variability as an advantage of Embodiment 1 is exerted. In addition, an LED element generates heat during the use because a light source generates ultraviolet light. Furthermore, for use in several tens of thousands of hours or for a long time, the fabricated fine unevenness is required to have ultraviolet resistance and heat resistance. Here, (1-2) environmental resistance, heat resistance, or light resistance as an advantage of Embodiment 1 is exerted.

In addition, using the same method, the fine unevenness may be applied to a surface of a solar cell to improve electricity generating efficiency of the solar cell or may be applied to an antireflection structure (fine unevenness structure) in various types of glass, a wire grid structure (fine unevenness structure), and the like. In any case, it is necessary to allow the fine unevenness to exhibit a desired functionality. In any optical use, it is necessary to provide a refractive index suitable for each processing target. Furthermore, in the case of use for a solar cell or the antireflection structure used in a window, it is necessary to provide integrity against solar light, wind, or rain. In the case of a wire grid structure used in short-wavelength light, it is necessary to provide heat resistance for a long time. Any requirement can be satisfied by exerting overall advantages of Embodiment 1 including (1-1) a transfer precision, (1-2) environmental resistance, heat resistance, light resistance, (1-3) refractive index variability, (1-4) anti-moisture stability, (1-5) a leveling, and (1-6) adhesiveness or exerting five advantages except for (1-5) the leveling depending on a method of forming the fine unevenness.

If overall advantages of Embodiment 1 including (1-1) a transfer precision, (1-2) environmental resistance, heat resistance, light resistance, (1-3) refractive index variability, (1-4) anti-moisture stability, (1-5) a leveling, and (1-6) adhesiveness are exerted, fine fabrication may be easily applied to a difficult-to-process material such as a sapphire substrate of an LED described above. In this case, (1-2) environmental resistance, heat resistance, light resistance, and (1-3) refractive index variability may be recognized as a strength of dry-etching resistance to an organic material.

Figure 4A:
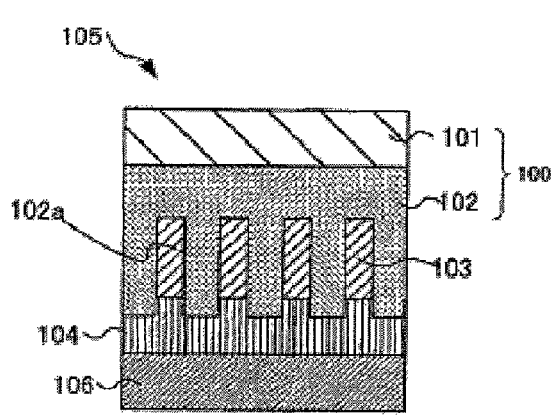
FIGS. 4A to 4F are schematic cross-sectional views illustrating a method of forming a fine unevenness on a processing target using a layered product obtained by using an inorganic composition for transferring a fine unevenness according to the present embodiment.

FIGS. 4A to 4F are schematic cross-sectional views illustrating a method of forming a fine unevenness on a processing target using a layered product obtained by using the inorganic composition for transferring a fine unevenness according to the present embodiment. As illustrated in FIG. 4A, a mold 100 includes a support substrate 101 and a fine uneven layer 102 provided on the support substrate 101. An inner side of a concave portion 102a of the fine uneven layer 102 is filled with the composition (1) according to Embodiment 1 to form a filling layer 103. Here, the filling is performed by coating a solution obtained by diluting the composition (1) on a surface of the fine uneven layer 102 of the mold 101. Here, (1-4) anti-moisture stability and (1-5) a leveling of the advantages of Embodiment 1 are exerted.

Subsequently, an organic layer 104 is formed on a surface of the fine uneven layer 102 of the mold (including a surface of the filling layer 103 of the concave portion 102a).

A surface of the organic layer 104 of the layered product 105 including the support substrate 101, the fine uneven layer 102, the filling layer 103, and the organic layer 104 is put on the processing target 106 as illustrated in FIG. 4A. Instead, the composition (1) filled inside the concave portion 102a of the fine uneven layer 102 of the mold 100 may be put on the organic layer 104 formed on the processing target 106.

Figure 4B:
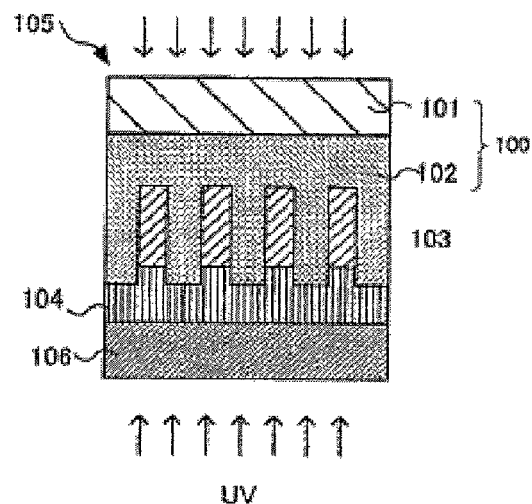

Subsequently, as illustrated in FIG. 4B, the filling layer 103 and the organic layer 104 are bonded to each other, and adhesiveness between the adhesive layer 104 and the processing target 106 is fixed. The bonding may be preferably performed through energy beam irradiation, and further through a heating treatment. Here, (1-6) adhesiveness as an advantage of Embodiment 1 is exerted.

Figure 4C:
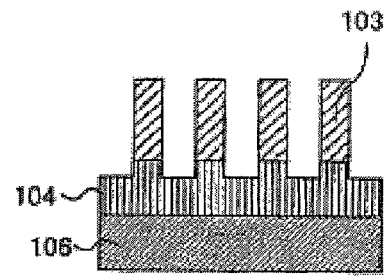

Subsequently, as illustrated in FIG. 4C, by releasing the mold 100, the filling layer 103 and the organic layer 104 may be transferred onto the processing target 106. Here, (1) a transfer precision as an advantage of Embodiment 1 is exerted.

Figure 4D:
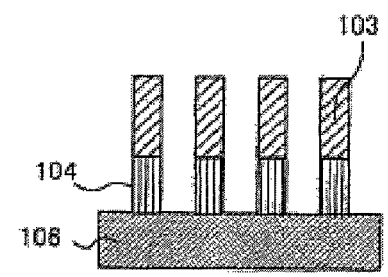
Figure 4E:
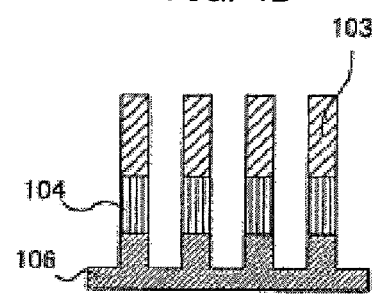
Figure 4F:

Then, as illustrated in FIG. 4D, by performing dry etching from the filling layer 103 side, it is possible to easily perform fine fabrication of the organic layer 104. Here, advantages of Embodiment 1 and dry-etching resistance to an organic material (including (1-2) environmental resistance, heat resistance, light resistance, (1-3) and refractive index variability) are exerted. The dry-etching resistance to an organic material may be exerted if the composition (1) is robust to an external environment, and control is made to obtain a high refractive index. In particular, if a metal alkoxide is contained as in the composition (1) according to the present invention, it is possible to reduce an etching selectivity between the filling layer 103 and the organic layer 104 (a dry etching rate of the filling layer 103 over a dry etching rate of the organic layer 104). In addition, since the metal alkoxide in the filling layer 103 moves to the side face of the organic layer 104 during the dry etching process, it is possible to easily process the organic layer 104. As illustrated in FIG. 4E, by using a fine mask pattern, having a high aspect ratio, including the obtained filling layer 103 and the obtained organic layer 104 as a mask, it is possible to easily fabricate the processing target 106 as illustrated in FIG. 4F. Since the processing target 104 can be processed in this manner, it is possible to easily process a difficult-to-process substrate such as sapphire. For example, a surface of the sapphire substrate may be easily fabricated using the aforementioned method. An LED may be manufactured by forming a semiconductor light-emitting element on the fabricated sapphire surface. In particular, if the fine uneven layer 102 of the mold 100 has a pitch of 100 nm to 500 nm and a height of 50 nm to 500 nm, internal quantum efficiency of an LED can be improved by using nanofabricated sapphire. Furthermore, if the fine uneven layer 102 of the mold 100 has a nano-scale normalized array in which holes are arranged with high periodicity in a micro-scale, and modulation is applied to a pitch having a micro-scale period, it is possible to improve light emitting efficiency and manufacture a high-efficiency LED using the nanofabricated sapphire.

The resin mold, that is used to transfer the composition (1) and has a fine unevenness on a surface, is preferably made of a silicone material such as polydimethylsiloxane, fluorine resin, and fluorine-contained resin. In particular, the mold is preferably made of a silicone material such as polydimethylsiloxane (PDMS) or a high water vapor permeable material such as triacetylcellulose (TAC) in order to improve a transfer speed while (1-1) a transfer precision is retained. In addition, in order to improve (1-1) a transfer precision, the mold is preferably made of fluorine resin, fluorine-contained resin, and the like. More preferably, fluorine elements are biasedly precipitated to a surface of the resin mold. Such a resin mold is characterized in that a concentration of fluorine elements on a surface (Es) of the fine unevenness surface (outermost layer) is sufficiently higher than an average concentration of fluorine elements in the resin (Eb) of the resin mold. If a ratio between the concentration Es of fluorine elements on the fine unevenness surface (outermost layer) and the average concentration Eb of fluorine elements has a range of 1<Es/Eb≤1500, and more preferably 20≤Es/Eb≤200, the concentration Es of fluorine elements on the resin mold surface (outermost layer) becomes sufficiently higher than the average concentration Eb of fluorine elements of the resin mold, and free energy on the resin surface is effectively reduced, so that mold releasability with the composition (1) is improved. If the ratio between the concentrations Es/Eb has a range of 26≤Es/Eb≤189, it is possible to further reduce free energy on a resin surface and obtain an excellent repetitive transfer precision by using the composition (1) as a transfer material, which is desirable. Furthermore, if the ratio Es/Eb between the concentrations has a range of 30≤Es/Eb≤160, it is possible to reduce free energy on a resin surface, retain a resin strength, and improve a repetitive transfer precision, which is desirable. The range of the ratio Es/Eb between the concentrations may be more preferably set to 31≤Es/Eb≤155, and further more preferably 46≤Es/Eb≤155 in order to more effectively exhibit the aforementioned advantages.

In particular, it is preferable that the resin mold contain fluorine-contained (meth)acrylate as a fluorine component. More specifically, it is preferable that the resin mold contain fluorine-contained (meth)acrylate which is fluorine-contained urethane(meth)acrylate expressed as the following general formula (1) because it is possible obtain excellent mold releasability (separability) with the composition (1) and further improve a transfer precision. Such urethane (meth)acrylate may include, for example, "OPTOOL DAC" produced by DAIKIN INDUSTRIES, Ltd.

[Chemical Formula 1]

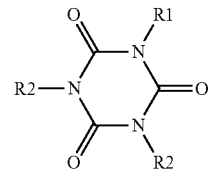

where R1 and R2 can be obtained from Chemical Formulas 2 and 3, respectively.

[Chemical Formula 2]

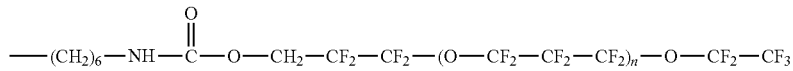

where n denotes any integer between 1 and 6.

[Chemical Formula 3]

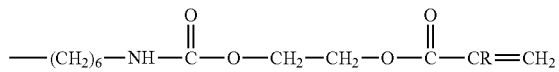

where R denotes H or $CH_3$.

The processing target for forming a fine unevenness made of the solidified composition (1) according to Embodiment 1 may include, for example, but not particularly limited to, an inorganic substrate such as a soda glass substrate, a quartz glass substrate, a sapphire substrate, a silicon substrate, a SiC substrate, a GaN substrate, a ZnO substrate, a metal substrate, a ceramic substrate, and a semiconductor substrate (nitride semiconductor substrate). Depending on a field of use, the processing target may be required to be transparent. In an optical use, it is preferable that the processing target be optically transparent in a visible light wavelength range of 400 nm to 780 nm. In quartz glass or sapphire, it is known that transmissivity of ultraviolet rays is high, which is desirable. In order to obtain a hard coat property, a gas barrier, and the like, a resin substrate may be used. In addition, as described in conjunction with FIGS. 4A to 4F, in a case where the composition (1) is used as a mask, a material of the processing target may be appropriately selected depending on a field of use. For example, in order to manufacture a high-efficiency LED, a sapphire substrate, a silicon substrate, a SiC substrate, a ZnO substrate, a nitride semiconductor substrate, or the like may be used. In addition, in order to manufacture a high-efficiency organic EL element, a glass plate or a transparent conductive material (such as ITO) may be used.

A configuration of the fine unevenness according to Embodiment 1 may preferably include, but not limited to, a line-and-space structure or a pillar configuration having a plurality of convex portions having a circular conical shape, a pyramid shape, or an elliptical conical shape. More preferably, the fine unevenness has a pillar configuration having a plurality of convex portions having a circular conical shape, a pyramid shape, or an elliptical conical shape. In addition, in this configuration, a bottom or lateral surface may be warped. In the pillar configuration, the pillars may adjoin one another through a smooth concave portion. Furthermore, the pillar configuration may be formed on a large uneven structure. Alternatively, the fine unevenness preferably has a hole configuration including a plurality of concave portions having a circular conical shape, a pyramid shape, or an elliptical conical shape. In addition, in this configuration, a bottom or lateral surface may be warped. In the hole configuration, the holes may adjoin one another through a smooth convex portion. Furthermore, the hole configuration may be formed on a large uneven structure. Here, the "pillar configuration" refers to a "configuration having a plurality of pillar-like bodies (conical state)", and the "hole configuration" refers to a "configuration having a plurality of holes having a pillar shape (or a conical shape)". In the unevenness structure, a distance between the convex portions (or concave portions) is preferably set to 1 nm or longer and 2000 nm or shorter, and a height (or depth) of the convex portion (or concave portion) is preferably set to 1 nm or higher and 5000 nm or lower. In particular, in order to further exert the advantages (1-1) to (1-6) of Embodiment 1, in the unevenness structure, a distance between the convex portions (or concave portions) is preferably set to 50 nm or longer and 1000 nm or shorter, and a height (or depth) of the convex portion (or concave portion) is preferably set to 50 nm or higher and 1000 nm or lower. Depending on a field of use, it is preferable that an adjacent distance between the convex portions (or concave portions) (a distance between apexes of the convex portions or a distance between the centers of the openings of the concave portions) be short, and a height of the convex portion (or concave portion) (a height from the bottom of the concave portion to the apex of the convex portion) be high. Here, the convex portion refers to a portion higher than an average height of the fine unevenness, and the concave portion refers to a portion lower than an average height of the fine unevenness. The configuration of the fine unevenness may be appropriately designed depending on a wavelength or crystallinity to be applied.

Figure 5:
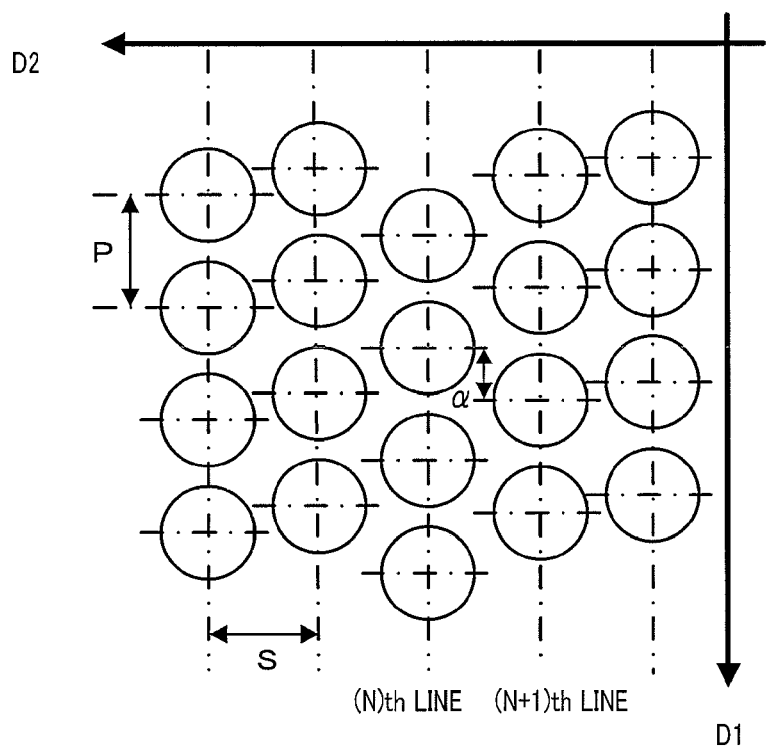
FIG. 5 is a schematic diagram illustrating an array of concave or convex portions of the fine unevenness according to the present embodiment.

As illustrated in FIG. 5, for first and second directions D1 and D2 perpendicular to each other in a plane, the convex portions (or concave portions) may be arranged with a pitch P along a first direction D1, and convex portions (or concave portions) may be arranged with a pitch S along a second direction D2. In addition, a positional difference a in the first direction D1 of the convex portions (or concave portions) lined in parallel with the second direction D2 may have a low regularity, and the array may have both periodicity and aperiodicity. Since the pitches P and S may be appropriately designed depending on a field of use, the pitches P and S may be identical. In FIG. 5, the convex portions (or concave portions) are illustrated independently without being overlapped. However, the convex portions (or concave portions) arranged in the first direction D1 and/or the second direction D2 may be overlapped. The positional difference a refers to a distance between lines (second direction D2) passing through the centers of the convex portions most adjacent to the neighboring line (first direction D1). More specifically, for example, as illustrated in FIG. 5, the positional difference a refers to a distance between a line of the second direction D2 passing through the center of the convex portion (or concave portion) arranged in the (N)th line out of the lines of the first direction D1 and a line of the second direction D2 passing through the center of the convex portion (or concave portion) arranged in the (N+1)th line closest to the convex portion (or the concave portion). In each line of the convex portions, a positional difference a in the first direction D1 between each line of the convex portions neighboring in the second direction D2 may be periodic or aperiodic. The array of the fine unevenness 12 may include a cubic array, a hexagonal array, a quasi-cubic array, a quasi-hexagonal array, and the like in addition to the example of FIG. 5. In addition, the pitches P and S may be appropriately designed depending on a field of use.

For example, in order to suppress reflectance and increase transmissivity in a visible light range (having a wavelength of 400 to 780 nm) in the field of a display or the like, a neighboring distance between the convex portions is preferably set to 1 nm or longer and 300 nm or shorter, and more preferably 1 nm or longer and 150 nm or shorter. In this manner, if a neighboring distance between the convex portions is equal to or shorter than 150 nm, it is also possible to suppress angle dependence of reflectance without generating diffraction light in the visible light range. Similarly, a height of the convex portion is preferably set to 1 nm or higher and 1000 nm or lower, and more preferably 100 nm or higher and 500 nm or lower. The height of the convex portion is preferably high. However, if an aspect ratio as a ratio between a diameter of the bottom and a height of the convex portion is equal to or greater than 3, a transfer precision of the composition (1) according to Embodiment 1 is degraded. For this reason, it is preferable that the fine unevenness be appropriately designed to have an aspect ratio smaller than 3 based on the design concept described above.

For example, since a spectral sensitivity of a crystalline silicon solar cell has a peak in a near infrared range (having a wavelength of 700 nm to 1000 nm), an outermost surface member of the solar cell is desired to have excellent transmissivity in this wavelength range. In this manner, in order to suppress reflectance and increase transmissivity in a near infrared range, a neighboring distance between the convex portions is preferably set to 300 nm or longer and 2000 nm or shorter, and more preferably 500 nm or longer and 1000 nm or shorter. In addition, the height of the convex portion is preferably set to 1 nm or higher and 5000 nm or lower, and more preferably 1000 nm or higher and 5000 nm or lower. Similarly, in this case, it is preferable that the fine unevenness be designed to have an aspect ratio smaller than 3.

For example, in a case where a high-efficiency LED is manufactured by fabricating a sapphire substrate (processing target 106) using the method described above in conjunction with FIGS. 4A to 4F, and the fine unevenness 102 of the mold 100 has a pitch of 100 nm to 500 nm and a height of 50 nm to 500 nm, it is possible to improve internal quantum efficiency when manufacturing an LED on the processed sapphire substrate. Furthermore, if the fine unevenness 102 of the mold 100 has a nano-scale normalized array in which holes are arranged with high periodicity in a micro-scale, and modulation is applied to a pitch having a micro-scale period, it is possible to improve both internal quantum efficiency and light-emitting efficiency when manufacturing an LED on the fabricated sapphire substrate. As a result, external quantum efficiency is significantly improved. Furthermore, if an aperture ratio of the fine unevenness 102 of the mold 100 is equal to or higher than 45%, it is possible to improve both an arrangement precision of the fine unevenness 102 of the mold 100 of the composition (1) and (1-1) a transfer precision. In particular, the aperture ratio of the fine unevenness 102 is preferably set to 50% or higher, more preferably 55% or higher, and most preferably 65% or higher. Moreover, if a composition of the surface side of the fine uneven layer 102 of the mold 100 is set to hydrophobicity (having a water contact angle of 90° or greater), it is possible to further exert the advantages described above.

As described above, in the configuration of Embodiment 1, if the composition (1) contains a silicone compound, mold releasability unique to silicone is exhibited. Therefore, a transfer precision of the fine unevenness is improved when the resin mold is released from a system including the resin mold, the composition (1), and the processing target. In addition, a leveling for the fine uneven surface of the resin mold is improved. Furthermore, since the steric hindrance caused by a silicone compound is exhibited so as to reduce a probability of collision of unreacted functional groups of metal alkoxides, solution anti-moisture stability is improved. Moreover, it is possible to retain environmental resistance, heat resistance, or light resistance of the fine unevenness.

In the configuration of Embodiment 1, if metal alkoxides having different metal species are contained in the composition (1), the interatomic distance can be modified by changing the amount thereof ($C_{M1}/C_{Si}$), so that it is possible to implement refractive index variability.

Embodiment 2

Hereinafter, Embodiment 2 of the present invention will be described in detail.

In the following description, a (meth)acrylic group includes an acryl group and a methacrylic group. A (meth)acryloyl group includes an acryloyl group and a methacryloyl group. A (meth)acryloxy group includes an acryloxy group and a methacryloxy group.

The inventors found a fact that, in a fine unevenness made of an inorganic composition for transferring a fine unevenness (2) (hereinafter, referred to as a composition (2)) that contains a silicone compound, at least two types of metal alkoxides including a metal alkoxide having a metal species M1 (where M1 denotes at least one metal element selected from a group consisting of Ti, Zr, Zn, Sn, B, In, and Al) and a metal alkoxide having a metal species Si having any one of a (meth)acrylic group, a (meth)acryloyl group, a (meth)acryloxy group, a vinyl group, an epoxy group, or an oxetane group in the same molecule, and an photopolymerization initiator, all of a transfer precision, environmental resistance, heat resistance, light resistance, refractive index variability, throughput during an inorganic precursor solution solidification, and anti-moisture stability of an inorganic precursor solution are excellent if a ratio between a morality $C_{M1}$ of the metal alkoxide having a metal species M1 and a morality $C_{Si}$ of the metal alkoxide having a metal species Si satisfies a condition of $0.04 \le C_{M1}/C_{Si} \le 4.56$, so that the fine unevenness made of an inorganic material capable of controlling a refractive index can be fabricated through an suitable transfer process.

In the following description, a reference numeral (2-1) is inserted in front of a phrase that refers to improvement of a transfer precision of the fine unevenness as an advantage of the composition (2) according to Embodiment 2. A reference numeral (2-2) is inserted in front of a phrase that refers to improvement of environmental resistance, heat resistance, or light resistance of the fine unevenness as an advantage of Embodiment 2. A reference numeral (2-3) is inserted in front of a phrase that refers to improvement of refractive index variability of the fine unevenness as an advantage of Embodiment 2. A reference numeral (2-4) is inserted in front of a phrase that refers to improvement of throughput in solidification of an inorganic precursor solution as an advantage of Embodiment 2. A reference numeral (2-5) is inserted in front of a phrase that refers to improvement of anti-moisture stability of an inorganic precursor solution as an advantage of Embodiment 2.

The composition (2) according to Embodiment 2 is solidified through two solidification processes including a steep viscosity increase or solidification process caused by photopolymerization and a solidification process caused by polycondensation.

Similar to Embodiment 1, if a silicone compound is contained in the composition (2) according to Embodiment 2, (2-1) a transfer precision of the fine unevenness and (2-5) anti-moisture stability of an inorganic precursor solution are improved. If a silicone compound is contained, (2-1) mold releasability unique to silicone is exhibited, so that a transfer precision of the fine unevenness is improved when the resin mold is released from a system including a resin mold, the composition (2), and a processing target. In addition, if a silicone compound is contained, (2-5) steric hindrance caused by the silicone compound is exhibited, so that a probability of collision (reaction) of unreacted functional groups of metal alkoxides is reduced, and anti-moisture stability of the solution is improved. In particular, in a case where the metal species includes a metal alkoxide other than silicon (Si), stability thereof can be significantly improved by adding the silicone compound while reactivity of only the metal alkoxide is very high. Furthermore, since the silicone compound has excellent environmental resistance, heat resistance, or light resistance, it is possible to retain (2-2) environmental resistance, heat resistance, or light resistance of the fine unevenness if the silicone compound is contained.

If the composition (2) according to Embodiment 2 contains a metal alkoxide having a metal species Si including any one of a (meth)acrylic group, a (meth)acryloyl group, a (meth)acryloxy group, a vinyl group, an epoxy group, or an oxetane group in the same molecule and an photopolymerization initiator, it is possible to make a steep viscosity increase (or solidification process) caused by photopolymerization and obtain (2-4) a solidification speed (throughput) in solidification of the inorganic precursor solution suitable for a roll-to-roll process. In addition, if the metal alkoxide is contained, it is possible to perform a polycondensation-based solidification process based on a sol-gel reaction, so that physical integrity of the composition (2) subjected to the solidification is improved. As described above, if the composition (2) contains a metal alkoxide having a metal species Si including any one of a (meth)acrylic group, a (meth)acryloyl group, a (meth)acryloxy group, a vinyl group, an epoxy group, or an oxetane group in the same molecule, it is possible to obtain both flexibility caused by photopolymerization and rigidity caused by the sol-gel reaction. As a result, (2-1) a transfer precision of the fine unevenness is improved. In addition, if the metal alkoxide having a metal species Si is contained, it is possible to improve stability of the metal alkoxide when it is used together with the metal alkoxide having a metal species other than silicon (Si).

Similar to Embodiment 1, if the composition (2) of Embodiment 2 contains metal alkoxides having different metal species, (2-3) refractive index variability is improved. A refractive index is associated with a density of a substance. By using different metal species in metal alkoxides and changing the amount thereof ($C_{M1}/C_{Si}$), it is possible to change an interatomic distance. As a result, it is possible to implement refractive index variability. The metal alkoxide having a metal species Si in the composition (2) according to Embodiment 2 includes a metal alkoxide (silane coupling agent) containing at least one of a (meth)acrylic group, a (meth)acryloyl group, a (meth)acryloxy group, a vinyl group, an epoxy group, or an oxetane group in the same molecule. That is, instead of or in addition to the silane coupling agent, a metal alkoxide having a metal species Si may be contained. For this reason, a morality $C_{Si}$ of the metal alkoxide having a metal species Si means a total morality of metal alkoxides having a metal species Si.

In particular, if the metal alkoxide is partially condensed, (2-1) a transfer precision, (2-3) refractive index variability, and (2-5) anti-moisture stability are further improved, which is desirable. If the metal alkoxide is partially condensed, it is possible to obtain a prepolymer having metal species chained by interposing oxygen elements. That is, by performing the partial condensation, it is possible to make a prepolymer having a large molecular weight. If (2-1) the metal alkoxide is partially condensed, the composition (2) contains a prepolymer, therefore flexibility is provided to the composition (2). As a result, it is possible to suppress a breakdown of the fine unevenness and the like when the resin mold is released, so that a transfer precision is improved. (2-3) By performing the partial condensation, it is possible to form a structure in which metal species are chained by interposing oxygen in advance. If transfer is performed in this state, the number of unreacted functional groups is reduced so as to obtain a high density, compared to a case where the partial condensation is not performed. For this reason, it is possible to increase a refractive index. (2-5) By performing the partial condensation, the number of unreacted functional groups is reduced, and the number of functional groups reacted with water vapor and the like is reduced, so that anti-moisture stability is improved.

If the composition (2) according to Embodiment 2 contains an aryl group, and particularly, the aryl group is bound with a silicon element, (2-2) environmental resistance, heat resistance, or light resistance is improved as in Embodiment 1. In addition, since the aryl group has a large size and is capable of more remarkably exhibiting the aforementioned effect of steric hindrance, it is possible to suppress cohesion of metal alkoxides when the composition (2) is prepared.

Similar to Embodiment 1, in consideration of (2-1) a transfer precision and (2-5) anti-moisture stability, the composition (2) according to Embodiment 2 preferably contains 0.5 or more and 47.6 or less parts by mass of a silicone compound with respect to 100 parts by mass of a metal alkoxide. If 0.5 or more and 23.8 or less parts by mass of a silicone compound is contained with respect to 100 parts by mass of a metal alkoxide, (2-1) a transfer precision and (2-5) anti-moisture stability are further improved, which is desirable. It is more preferable that 1 or more and 23.8 or less parts by mass of a silicone compound be contained. If 4.8 or more and 23.8 or less parts by mass of a silicone compound is contained, it is possible to more exert the aforementioned advantages, which is desirable.

Similar to Embodiment 1, if the composition (2) according to Embodiment 2 contains the fluorine-contained silane coupling agent, when a system including a resin mold having low surface energy, the composition (2), and a processing target is being formed, the fluorine-contained silane coupling agent is biasedly precipitated to the resin mold side so as to lower the energy of the entire system. Therefore, (2-1) a transfer precision is improved. In addition, the transferred fine unevenness structure can have an antifouling property or a water-repellent property because fluorine is biasedly precipitated to a surface of the fine unevenness made of an inorganic material.

If the composition (2) according to Embodiment 2 contains a silicone compound including any one of a vinyl group, a methacrylic group, an amino group, an epoxy group, or an alicyclic epoxy group, a steep viscosity increase caused by photopolymerization of the composition (2) is more effectively facilitated, so that (2-1) a transfer precision is improved, and a roll-to-roll process can be suitably performed, which is desirable.

(A) Silicone Compound

A silicone compound contained in the composition (2) according to Embodiment 2 may include, but not particularly limited to, the silicone compound used in the composition (1) described above, which includes a siloxane material containing silicon and oxygen as a main constituent, except for the metal alkoxides (B) described below. The composition (2) may contain a single type of the silicone compound or a plurality of types of silicone compounds. By adding a siloxane material to the composition (2), it is possible to improve (2-1) a transfer precision of the fine unevenness and (2-5) anti-moisture stability of the inorganic precursor while (2-2) environmental resistance, heat resistance, or light resistance of the transferred fine unevenness is retained.

Out of the silicone compounds used in the composition (2), for example, the following silicone compounds may be excluded from the silicone compounds used in the composition (1):

Reactive silicone may include, for example, amino-modified silicone, epoxy-modified silicone, carboxyl-modified silicone, carbinol-modified silicone, methacryl-modified silicone, vinyl-modified silicone, mercapto-modified silicone, phenol-modified silicone, single end-reactive silicone, hetero-functional group modified silicone, and the like.

If the composition (2) according to Embodiment 2 contains a silicone compound including any one of a vinyl group, a methacrylic group, an amino group, an epoxy group, or an alicyclic epoxy group, a steep viscosity increase caused by light irradiation is more effectively facilitated, so that (2-4) throughput during inorganic precursor solution solidification is further improved, and (2-1) a transfer precision is improved, which is desirable. In particular, if a silicone compound containing any one of a vinyl group, a methacrylic group, an epoxy group, or an alicyclic epoxy group is included, (2-1) a transfer precision and (2-4) throughput can be further exerted, which is desirable.

From the viewpoint of solidification of the composition (2), the silicone compound preferably includes any one of a vinyl group or a methacrylic group. In addition, from the viewpoint of adhesiveness to the processing target, the silicone compound preferably includes any one of an epoxy group or an acrylic epoxy group. A single type or a plurality of types of the silicone compounds including any one of a vinyl group, a methacrylic group, an amino group, an epoxy group, or an alicyclic epoxy group may also be used.

The silicone having a photopolymerizable group and the silicone that do not have a photopolymerizable group may be used solely or as a combination. Meanwhile, if the photopolymerizable group is included in a silicone molecule contained in the composition (2), (2-4) throughput during solidification is improved, which is desirable.

The silicone compound containing a vinyl group may include, for example, KR-2020 (produced by Shin-Etsu Silicone Co., Ltd.), X-40-2667 (produced by Shin-Etsu Silicone Co., Ltd.), CY52-162 (produced by Dow Corning Toray Corporation), CY52-190 (produced by Dow Corning Toray Corporation), CY52-276 (produced by Dow Corning Toray Corporation), CY52-205 (produced by Dow Corning Toray Corporation), SE1885 (produced by Dow Corning Toray Corporation), SE1886 (produced by Dow Corning Toray Corporation), SR-7010 (produced by Dow Corning Toray Corporation), XE5844 (produced by GE TOSHIBA SILICONES Co., Ltd.), and the like.

The silicone compound containing a methacrylic group may include, for example, X-22-164 (produced by Shin-Etsu Silicone Co., Ltd.), X-22-164AS (produced by Shin-Etsu Silicone Co., Ltd.), X-22-164A (produced by Shin-Etsu Silicone Co., Ltd.), X-22-164B (produced by Shin-Etsu Silicone Co., Ltd.), X-22-164C (produced by Shin-Etsu Silicone Co., Ltd.), X-22-164E (produced by Shin-Etsu Silicone Co., Ltd.), and the like.

The silicone compound containing an amino group may include, for example, PAM-E (produced by Shin-Etsu Silicone Co., Ltd.), KF-8010 (produced by Shin-Etsu Silicone Co., Ltd.), X-22-161A (produced by Shin-Etsu Silicone Co., Ltd.), X-22-161B (produced by Shin-Etsu Silicone Co., Ltd.), KF-8012 (produced by Shin-Etsu Silicone Co., Ltd.), KF-8008 (produced by Shin-Etsu Silicone Co., Ltd.), X-22-166B-3 (produced by Shin-Etsu Silicone Co., Ltd.), TSF4700 (produced by Momentive Performance Materials Inc.), TSF4701 (produced by Momentive Performance Materials Inc.), TSF4702 (produced by Momentive Performance Materials Inc.), TSF4703 (produced by Momentive Performance Materials Inc.), TSF4704 (produced by Momentive Performance Materials Inc.), TSF4705 (produced by Momentive Performance Materials Inc.), TSF4706 (produced by Momentive Performance Materials Inc.), TSF4707 (produced by Momentive Performance Materials Inc.), TSF4708 (produced by Momentive Performance Materials Inc.), TSF4709 (produced by Momentive Performance Materials Inc.), and the like.

The silicone compound containing an epoxy group may include, for example, X-22-163 (produced by Shin-Etsu Silicone Co., Ltd.), KF-105 (produced by Shin-Etsu Silicone Co., Ltd.), X-22-163A (produced by Shin-Etsu Silicone Co., Ltd.), X-22-163B (produced by Shin-Etsu Silicone Co., Ltd.), X-22-163C (produced by Shin-Etsu Silicone Co., Ltd.), TSF-4730 (produced by Momentive Performance Materials Inc.), YF3965 (produced by Momentive Performance Materials Inc.), and the like.

The silicone compound containing an alicyclic epoxy group may include, for example, X-22-169AS (produced by Shin-Etsu Silicone Co., Ltd.), X-22-169B (produced by Shin-Etsu Silicone Co., Ltd.), and the like.

(B) Metal Alkoxide

The composition (2) according to Embodiment 2 contains at least two types of metal alkoxides including a metal alkoxide having a metal species M1 (where, M1 denotes at least one metal element selected from a group consisting of Ti, Zr, Zn, Sn, B, In, or Al) and a metal alkoxide having a metal species Si. If the metal alkoxide having a metal species M1 is included, (2-3) a refractive index of the fine unevenness can be controlled. In addition, if the metal alkoxide having a metal species Si is included, (2-5) anti-moisture stability of the composition (2) is improved. Two or more metal alkoxides having the metal species M1 or two or more metal alkoxides having a metal species Si may also be used. In addition, a metal alkoxide having a metal species M2 (where, M2≠M1 and M2≠Si) may also be used instead of or in addition to the metal alkoxide having the metal species M1 and the metal alkoxide having the metal species Si. Similarly, a metal alkoxide having a metal species M3 (where, M3≠M2, M3≠M1, and M3≠Si) may also be used.

In the composition (2) according to Embodiment 2, an interatomic distance can be changed by changing a ratio $C_{M1}/C_{Si}$ between a molarity $C_{M1}$ of the metal alkoxide having a metal species M1 and a molarity $C_{Si}$ of the metal alkoxide having a metal species Si. As a result, a refractive index can be changed. Since the ratio $C_{M1}/C_{Si}$ between $C_{M1}$ and $C_{Si}$ can be selected within a range of $0.04 \leq C_{M1}/C_{Si} \leq 4.56$, (2-3) a refractive index can be flexibly changed. Here, as described in Embodiment 1, the molarity $C_{Si}$ of the metal alkoxide having a metal species Si refers to a total concentration of the metal alkoxides having a metal species Si contained in the composition (2). Meanwhile, as described in Embodiment 1, the molarity $C_{M1}$ of the metal alkoxide having a metal species M1 refers to a total sum of the molarities of overall metal alkoxides having metal species other than the metal alkoxides having a metal species Si contained in the composition (2). For example, when metal alkoxides having metal species Ti, Zr, and Al have molarities $C_{Ti}$, $C_{Zr}$, and $C_{Al}$, respectively, the molarity $C_{M1}$ becomes $C_{Ti}+C_{Zr}+C_{Al}$.

The metal alkoxide contained in the composition (2) may include the metal alkoxides used in the composition (1) described above. Out of the metal alkoxides used in the composition (2), for example, the following metal alkoxides may be excluded from the metal alkoxides used in the composition (1):

One or more functional groups of the metal alkoxides used in the composition (1) may include a photopolymerizable group such as an acryloyl group, a methacryloyl group, an acryloxy group, a methacryloxy group, an acryl group, a methacrylic group, a vinyl group, an epoxy group, an allyl group, and an oxetanyl group. In particular, if the metal alkoxide includes a metal species Si and any one of a (meth)acrylic group, a (meth)acryloyl group, a (meth)acryloxy group, an epoxy group, or an oxetane group in the same molecule, solidification of the first stage using light irradiation can be easily performed, (2-4) throughput (solidification speed) suitable for a roll-to-roll process can be obtained, and (2-5) an excellent patterning characteristic can be obtained, which is desirable. Furthermore, it is possible to suppress phase separation in the solidified composition (2) of a metal alkoxide having a metal species other than silicon (Si), which is desirable.

Such a metal alkoxide may include, for example, vinyltrimethoxysilane such as KBM-1003 (produced by Shin-Etsu Silicone Co., Ltd.), vinyltriethoxysilane such as KBE-1003 (produced by Shin-Etsu Silicone Co., Ltd.), vinyltrimethoxysilane such as SZ-6300 (produced by Dow Corning Toray Corporation), vinyltriacetoxysilane such as SZ-6075 (produced by Dow Corning Toray Corporation), vinyltrimethoxysilane such as TSL8310 (produced by GE TOSHIBA SILICONES Co., Ltd.), vinyltriethoxysilane such as TSL8311 (produced by GE TOSHIBA SILICONES Co., Ltd.), 3-methacryloxypropylmethyldimethoxysilane such as KMB-502 (produced by Shin-Etsu Silicone Co., Ltd.), 3-methacryloxypropyltrimethoxysilane such as KMB-503 (produced by Shin-Etsu Silicone Co., Ltd.), 3-methacryloxypropylmethyldiethoxysilane such as KME-502 (produced by Shin-Etsu Silicone Co., Ltd.), 3-methacryloxypropyltriethoxysilane such as KBM-503 (produced by Shin-Etsu Silicone Co., Ltd.), γ-methacryloxypropyltrimethoxysilane such as SZ-6030 (produced by GE TOSHIBA SILICONES Co., Ltd.), γ-methacryloxypropyltrimethoxysilane such as TSL8370 (produced by GE TOSHIBA SILICONES Co., Ltd.), γ-methacryloxypropylmethyldimethoxysilane such as TSL8375 (produced by GE TOSHIBA SILICONES Co., Ltd.), 3-acryloxypropyltrimethoxysilane such as KBM-5103 (produced by Shin-Etsu Silicone Co., Ltd.), 2-(3,4-epoxycyclohexyl)ethyltrimethoxysilane such as KBM-303 (produced by Shin-Etsu Silicone Co., Ltd.), 3-glycidoxypropylmethylmethoxysilane such as KBM-402 (produced by Shin-Etsu Silicone Co., Ltd.), 3-glycidoxypropyltrimethoxysilane such as KBM-403 (produced by Shin-Etsu Silicone Co., Ltd.), 3-glycidoxypropylmethylethoxysilane such as KBE-402 (produced by Shin-Etsu Silicone Co., Ltd.), 3-glycidoxypropyltriethoxysilane such as KBE-403 (produced by Shin-Etsu Silicone Co., Ltd.), P-Styryltrimethoxysilane such as KBM-1403 (produced by Shin-Etsu Silicone Co., Ltd.), and the like.

In addition, the composition (2) may contain a metal chelate compound. The metal chelate compound may include titanium diisopropoxy bis(acetylacetonate), titanium tetrakis(acethylacetonate), titanium dibutoxy-bis(octyleneglycolate), zirconium tetrakis(acethylacetonate), zirconium dibutoxy-bis(acetylacetonate), aluminum tris(acetylacetonate), aluminum dibutoxy-mono(acetylacetonate), zinc bis(acetylacetonate), indium tris(acetylacetonate), poly-titanium (acetylacetonate), and the like. Using such compounds, it is possible to improve (2-5) anti-moisture stability while (2-3) refractive index variability is retained.

The aforementioned metal alkoxide may have a prepolymer state in which a polymerization reaction partially progresses, and unreactive functional groups remain. If the metal alkoxide is partially condensed, it is possible to obtain a prepolymer in which metal species are chained by interposing an oxygen element. That is, by performing the partial condensation, it is possible to make a prepolymer having a large molecular weight. By partially condensing the metal alkoxide, the composition (2) contains a prepolymer, (2-1) so that flexibility is provided to the composition (2). As a result, it is possible to suppress a breakdown of the fine unevenness generated when the resin mold is released, and the like, and improve a transfer precision. By performing the partial condensation, (2-3) it is possible to form a structure having metal species chained by interposing oxygen in advance. If the fine unevenness is transferred in this state, the number of unreacted functional groups is reduced to obtain a high density, in comparison with a case where the partial condensation is not performed. For this reason, it is possible to make a change to increase the refractive index. By performing the partial condensation, (2-5) the number of unreacted functional groups and the number of functional groups reacted with water vapor and the like are reduced, so that stability is improved.

A definition of the prepolymer, a condensation degree (viscosity range), a reaction atmosphere, and the like described in regard to the composition (1) may be similarly employed.

In the composition (2) according to the present invention, in a case where the metal alkoxide contains a prepolymer, it is possible to flexibly change (2-3) a refractive index and improve (2-1) a transfer precision by setting a ratio $C_{pM1}/C_{pSi}$ between a concentration $C_{pSi}$ of silicon (Si) in the entire composition and a total concentration $C_{pM1}$ of metal elements other than silicon (Si) to 0.01 or higher and 4.5 or lower. From the viewpoint of similar advantages, the ratio $C_{pM1}/C_{pSi}$ is preferably set to 0.05 or higher and 4 or lower, and most preferably 0.1 or higher and 3.5 or lower. Furthermore, from the viewpoint of improvement of a physical strength of the solidified transferred composition (2), the ratio $C_{pM1}/C_{pSi}$ is more preferably set to 0.3 or higher and 3 or lower and, most preferably 0.5 or higher and 2.5 or lower.

Similar to the composition (1), the metal alkoxide according to Embodiment 2 may contain a fluorine-contained silane coupling agent.

If a weight percentage of the metal alkoxide containing a photopolymerizable group in the composition (2) according to Embodiment 2 is set to 15 weight % or higher with respect to all of metal alkoxides and silicone, both of (2-1) a transfer precision and (2-4) throughput are improved, which is desirable. If a weight percentage of the metal alkoxide containing a photopolymerizable group is set to 30% or higher, the aforementioned advantages are further exerted, which is desirable. It is preferable that a weight percentage of the metal alkoxide containing a photopolymerizable group be set to 45 weight % or higher.

In the aforementioned range, if a weight percentage of the metal alkoxide containing a photopolymerizable group is set to 50 weight % or higher, the composition (2) can be patterned through light irradiation, which is desirable. In order to further exert the aforementioned advantages, it is more preferable that a weight percentage of the metal alkoxide containing a photopolymerizable group be set to 55 weight % or higher. In this range, it is possible to form a fine unevenness made of the patterned solidified composition (2).

(C) Photopolymerization Initiator

A photopolymerization initiator used in the composition (2) according to Embodiment 2 preferably includes a radical reactive photopolymerization initiator that can generate a radical reaction or an ionic reaction using light. In addition, the photopolymerization initiator according to Embodiment 2 includes an initiator for a cation-curable composition, that is, a photoacid generator. The photopolymerization initiator may include the following photopolymerization initiators. If the addition amount of the photopolymerization initiator is set to 0.05 to 10 weight % with respect to a metal alkoxide (silane coupling agent) containing a metal species Si having a (meth)acrylic group, a (meth)acryloyl group, a (meth)acryloxy group, a vinyl group, an epoxy group, or an oxetane group in the same molecule, a photopolymerization characteristic, (2-1) a transfer precision, and (2-4) throughput are improved, which is preferable. In particular, in order to further exert the aforementioned advantages, the addition amount of the photopolymerization initiator is preferably set to 0.1 to 10 weight %, more preferably 0.5 to 9 weight %, and most preferably 1 to 9 weight %. Furthermore, since a bleed-out of the composition (2) for the solidified material can be reduced, the addition amount is preferably set to 1 to 8 weight %.

The following photopolymerization initiators known in the art may be used solely or as a combination: an acetophenone-based photopolymerization initiator such as acetophenone, p-tert-butyltrichloroacetophenone, chloroacetophenone, 2,2-diethoxyacetophenone, hydroxyacetophenone, 2,2-dimethoxy-2'-phenylacetophenone, 2-aminoacetophenone, and dialkylamino acetophenone; a benzoin-based photopolymerization initiator such as benzyl, benzoin, benzoinmethyl ether, benzoin ethyl ether, benzoin isopropyl ether, benzoin isobutyl ether, 1-hydroxy cyclohexyl phenyl ketone, 2-hydroxy-2-methyl-1-phenyl-2-methyl propane-1-one, 1-(4-isopropylphenyl)-2-hydroxy-2-methyl propane-1-one, and benzyl dimethyl ketal; a benzophenone-based photopolymerization initiator such as benzophenone, benzoyl benzoic acid, benzoyl benzoic acidmethyl, methyl-o-benzoylbenzoate, 4-phenylbenzophenone, hydroxybenzophenone, hydroxypropylbenzophenone, acrylbenzophenone, 4,4'-bis (dimethylamino)benzophenone, and perfluorobenzophenone; a thioxanthone-based photopolymerization initiator such as thioxanthone, 2-chlorothioxanthone, 2-methylthioxanthone, diethylthioxanthone, and dimethylthioxanthone; an anthraquinone-based photopolymerization initiator such as 2-methylanthraquinone, 2-ethylanthraquinone, 2-tert-butylanthraquinone, 1-chloroanthraquinone, and 2-amylanthraquinone; a ketal-based photopolymerization initiator such as acetophenone dimethyl ketal and benzyl dimethyl ketal; other photopolymerization initiators such as α-acyloxime ester, benzyl-(o-ethoxycarbonyl)-α-monooxime, acyl phosphine oxide, glyoxy ester, 3-ketocoumarine, 2-ethylanthraquinone, camphorquinone, tetramethylthiuram disulfide, azobisisobutyronitrile, benzoyl peroxide, dialkylperoxide, and tert-butyl peroxy pivalate; a fluorine-contained photopolymerization initiator such as perfluoro-tert-butyl peroxide, perfluorobenzoyl peroxide; and the like.

Instead of or in addition to the photopolymerization initiator, a photosensitizer may be included. A specific example of the photosensitizer, a single phtosensitizer or a combination of two or more photosensitizers known in the art may be used. Photosensitizers known in the art include amines such as n-butylamine, di-n-butylamine, tri-n-butylphophine, allylthiourea, s-benzylisothiouronium-p-toluensulfonate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-(dimethylamino) benzoate, triethylamine, and triethanolamine.

Commercially available initiators include, for example, an "IRGACURE" series (such as IRGACURE651, 184, 500, 2959, 127, 754, 907, 369, 379, 379 EG, 819, 1800, 784, OXE01, and OXE02), a "DAROCUR" series (such as DAROCUR1173, MBF, TPO, and 4265) produced by BASF Corporation, and the like.

The photopolymerization initiators used in the composition (2) according to Embodiment 2 may be used solely or as a combination of two or more initiators. When two or more types of photopolymerization initiators are used together, the photopolymerization initiators may be selected in consideration of a solidifiability of the composition (2), light absorption of the composition (2) for the solidified material, and environmental resistance. For example, an α-hydroxy ketone-based photopolymerization initiator and an α-amino ketone-based photopolymerization initiator may be used together. For example, as a combination of two or more types of photopolymerization initiators, a combination of "Irgacure" series or a combination of "Irgacure" and "Darocur" series may be used. Specifically, a combination of two or more types of photopolymerization initiators may include, for example, a combination of Darocur1173 and Irgacure819, a combination of Irgacure379 and Irgacure127, a combination of Irgacure819 and Irgacure127, a combination of Irgacure250 and Irgacure127, a combination of Irgacure184 and Irgacure369, a combination of Irgacure184 and Irgacure379EG, a combination of Irgacure184 and Irgacure907, a combination of Irgacure127 and Irgacure379EG, a combination of Irgacure819 and Irgacure184, a combination of DarocurTPO and Irgacure184, and the like.

The photoacid generator may include a compound that generates acid by receiving active energy such as ultraviolet rays. For example, the photoacid generator may include aromatic onium salts such as sulfonium salts and iodonium salts. Cation-curable monomers are polymerized by the acid generated by the photoacid generator.

Sulfonium salts may include, for example, triphenyl sulfonium, diphenyl-4-thiophenoxysulfonium, and the like. Iodonium salts may include, for example, diphenyliodonium, bis(dodecylphenyl)iodonium, 4-isopropyl-4'-methyl-diphenyliodonium, and the like. As the photoacid generator, photoacid generators known in the art may be used solely or as a combination of two or more types.

Counter anions of the aromatic onium salts described above may include, for example, tetrafluoroborate, hexafluoro phosphate, hexafluoroantimonate, hexafluoroarsenate, hexachloroantimonate, tetrakis(pentafluorophenyl) borate, perchlorate ions, trifluoromethanesulfonic acid ions, bis(trifluoromethane sulfonyl)imidic acid ions, bis(pentafluoroethylsulfonyl)imidic acid ions, and the like.

The composition (2) according to Embodiment 2 may contain a sensitizer. Available sensitizers may include, for example, anthracene, 1,9-dimethoxyanthracene, 1,9-dipropoxyanthracene, carbazol, phenothiazine, perylene, xanthone, thioxanthone, benzophenonethioxanthone, 2-4-diethyl-9H-thioxanthene-1-one, and the like. Sensitizers known in the art may be used solely or as a combination of two or more types.

(D) Other Additives

Similar to the composition (1), the composition (2) according to Embodiment 2 may contain a polysilane. If the polysilane is contained, a siloxane bond can be effectively generated by irradiating ultraviolet rays, so that (2-1) the transfer precision of the composition (2) is improved. In addition, the aforementioned patterning effect is also improved.

Similar to the composition (1), the composition (2) according to Embodiment 2 may contain metal oxide fine particles. If the metal oxide fine particles are contained, (2-2) environmental resistance, heat resistance, light resistance, or (2-3) refractive index variability is improved.

Similar to the composition (1), the composition (2) according to Embodiment 2 may contain a solvent. Similar to the solvent used in the composition (2), a solvent satisfying a condition of the radius of inertia may be preferably selected.

(E) Method of Transferring Fine Unevenness

A method of forming a fine unevenness using the composition (2) according to Embodiment 2 is not particularly limited if the fine unevenness provided on a surface of a resin mold (cast) can be transferred to a processing target. The method of forming the fine unevenness of FIGS. 1A to 3C described above in conjunction with Embodiment 1 may be used in the composition (2). In addition, the advantages of the composition (2) are as follows. Here, unless specified otherwise, it is assumed that the composition (2) has the advantages similar to those of Embodiment 1.

First, in the method of forming the fine unevenness illustrated in FIGS. 1A and 1B, light irradiation may be effectively used to solidify the composition (2) included in the uneven layer 12 illustrated in FIG. 1A. Using the light irradiation, a photopolymerizable portion in the composition (2) is polymerized, so that a viscosity of the composition (2) abruptly increases. In addition, if the heat generated along with polymerization is used as a driving force, it is possible to further promote polycondensation of the metal alkoxide. Here, since a light source for light irradiation may be appropriately selected depending on constituents of the composition (2), a UV-LED light source, a metal halide light source, a high-pressure mercury lamp light source, and the like may be employed without a particular limitation. In addition, an integral light amount from the start of light irradiation to the end of the irradiation is preferably set to 500 to 5000 mJ/cm$^2$ from the viewpoint of improvement of a transfer precision. More preferably, the integral light amount is set to 800 to 2500 mJ/cm$^2$. Furthermore, light irradiation may be performed using a plurality of light sources. Both the light irradiation and the heating may be used together. Here, "used together" means that the light irradiation and the heating may be performed simultaneously, or the heating is performed after the light irradiation. By performing the heating, it is possible to further promote polycondensation of the metal alkoxide, so that it is possible to improve (2-1) a transfer precision. The heating temperature may be appropriately selected depending on a material of the resin mold 11 and the composition (2). Preferably, the heating temperature may be set to approximately 45° C. to 180° C. In addition, the heating time may be preferably set to 15 seconds to 30 minutes.

Although a film thickness of the composition (2) depends on constituents of the composition (2) or a type of the fine unevenness, the film thickness is preferably set to approximately 3 µm or smaller because it is possible to obtain a fast transfer speed and guarantee (2-1) a transfer precision, which is desirable. In order to further exert the advantages of the present invention, the film thickness is more preferably set to 1.5 µm or smaller, and most preferably 1.2 µm or smaller. In addition, the lower limit is preferably equal to or higher than a volume of the fine unevenness. In order to further improve a transfer precision, the lower limit is more preferably set to 1.2 times or greater of the volume of the fine unevenness, and most preferably 1.5 times or greater of the volume of the fine unevenness.

In the method of forming the fine unevenness of FIGS. 2A to 2C, light irradiation may be effectively used to solidify the uneven layer 23 made of the gelated composition (2) interposed between the processing target 24 and the resin mold 21 illustrated in FIG. 2B. By performing the light irradiation, a photopolymerizable portion included in the composition (2) is polymerized, and a viscosity of the composition (2) abruptly increases. By using the heat generated along with polymerization as a driving force, it is possible to further promote polycondensation of the metal alkoxide. Here, since a light source for light irradiation may be appropriately selected depending on constituents of the composition (2), a UV-LED light source, a metal halide light source, a high-pressure mercury lamp light source, and the like may be employed without a particular limitation. In addition, an integral light amount from the start of light irradiation to the end of the irradiation is preferably set to 500 to 5000 mJ/cm$^2$ from the viewpoint of improvement of a transfer precision. More preferably, the integral light amount is set to 800 to 2500 mJ/cm$^2$. Furthermore, light irradiation may be performed using a plurality of light sources. Both the light irradiation and the heating may be used together. Here, "used together" means that the light irradiation and the heating may be performed simultaneously, or the heating is performed after the light irradiation. By performing the heating, it is possible to further promote polycondensation of the metal alkoxide, so that it is possible to improve (2-1) a transfer precision. The heating temperature may be appropriately selected depending on a material of the resin mold 11 and the composition (2). Preferably, the heating temperature may be set to approximately 45° C. to 180° C. In addition, the heating time may be preferably set to 15 seconds to 30 minutes. Although a film thickness of the composition (2) depends on constituents of the composition (2) or a type of the fine unevenness, the film thickness is preferably set to approximately 5 µm or smaller because it is possible to obtain a fast transfer speed and guarantee (2-1) a transfer precision, which is desirable. In order to further exert the advantages of the present invention, the film thickness is more preferably set to 3 µm or smaller, and most preferably 1.5 µm or smaller. In addition, the lower limit is preferably equal to or higher than a volume of the fine unevenness. In order to further improve a transfer precision, the lower limit is more preferably set to 1.2 times or greater of the volume of the fine unevenness, and most preferably 1.5 times or greater of the volume of the fine unevenness.

In the case of the composition (2), after the structure 26 of FIG. 2C is obtained, the structure 26 may be baked to volatilize organic components.

Figure 3C:
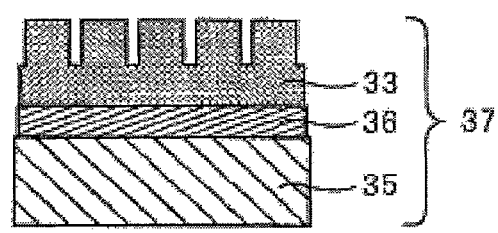

Next, in the method of forming the fine unevenness illustrated in FIGS. 3A to 3C, the solidification of the uneven layer 32 of FIG. 3A is preferably performed through heating within a temperature range of 20 to 200° C. from the viewpoint of a solidification (condensation) speed or (2-1) a transfer precision. In particular, the solidification is preferably performed through multistage heating for slowly performing the heating across 2 to 5 stages. In addition, along with the aforementioned heating, the uneven layer 32 may be disposed under a decompressive atmosphere. If the uneven layer 32 is disposed under a decompressive atmosphere, it is possible to remove water or alcohol generated in the sol-gel reaction and increase a reaction speed toward condensation in the sol-gel reaction.

In the solidification of the adhesive layer 34 illustrated in FIG. 3B, light irradiation may be effectively used. Using the light irradiation, a photopolymerizable portion in the composition (2) is polymerized, so that a viscosity of the composition (2) abruptly increases. In addition, if the heat generated along with polymerization is used as a driving force, it is possible to further promote polycondensation of the metal alkoxide. Here, since a light source for light irradiation may be appropriately selected depending on constituents of the composition (2), a UV-LED light source, a metal halide light source, a high-pressure mercury lamp light source, and the like may be employed without a particular limitation. In addition, an integral light amount from the start of light irradiation to the end of the irradiation is preferably set to 500 to 5000 mJ/cm$^2$ from the viewpoint of improvement of a transfer precision. More preferably, the integral light amount is set to 800 to 2500 mJ/cm$^2$. Furthermore, the light irradiation may be performed using a plurality of light sources. Both the light irradiation and the heating may be used together. Here, "used together" means that the light irradiation and the heating may be performed simultaneously, or the heating is performed after the light irradiation. By performing the heating, it is possible to further promote polycondensation of the metal alkoxide, so that it is possible to improve (2-1) a transfer precision. The heating temperature may be appropriately selected depending on a material of the resin mold 11 and the composition (2). Preferably, the heating temperature may be set to approximately 45° C. to 180° C. In addition, the heating time may be preferably set to 15 seconds to 30 minutes. Although a thickness of the adhesive layer 34 depends on constituents of the adhesive layer 34 or a type of the fine unevenness, the thickness is preferably set to approximately 3 µm or smaller because it is possible to obtain a fast transfer speed and guarantee a transfer precision, which is desirable. In order to further exert the advantages of the present invention, the thickness is more preferably set to 1.5 µm or smaller, and most preferably 1.2 µm or smaller. In addition, the lower limit is preferably set to 30 nm or higher, more preferably 100 nm or higher, and most preferably 300 nm or higher from the viewpoint of improvement of adhesiveness.

The condensation may be further promoted by performing heating for the structure 37 of FIG. 3C. Alternatively, baking may be performed for the structure 37 to volatilize organic components. In particular, in a case where the structure 37 is used at an atmosphere in which solar light or ultraviolet light is continuously irradiated, it is preferable that organic components be volatilized through baking in order to suppress deterioration. The baking temperature is preferably set to 200 to 800° C., and more preferably 250 to 550° C.

Although the baking time may be set variably depending on a volume of the composition (2) and the amount of the photopolymerizable group, the baking time is preferably set to approximately 10 to 90 minutes, and more preferably 30 to 60 minutes.

In the overall processes described above, if a weight percentage of the metal alkoxide containing a photopolymerizable group is set to 50 weight % or higher, and more preferably 55 weight % or higher, only the portion where light is irradiated is photopolymerized by forming a mask on the resin mold used in light irradiation, so that it is possible to perform patterning through development (negative development). In addition, in the process exemplarily described in conjunction with FIGS. 3A to 3C, the patterning may be performed such that a weight percentage of the metal alkoxide having a photopolymerizable group in the composition (2) of the adhesive layer 34 is preferably set to 50 weight % or higher, and more preferably 55 weight % or higher even when the photopolymerizable component is excluded from the composition (2) of the uneven layer 32.

In the method of forming the fine unevenness illustrated in FIGS. 1A to 3C, by using a reel-like resin mold in the resin molds 11, 21, and 31, it is possible to fabricate the layered products 14, 26, and 37 through a lamination process. If a roll-to-roll process is applied, it is possible to windingly recover the resin mold having the composition (2). By winding out the resin mold having the composition (2), it is possible to fabricate the fine unevenness in a large area.

Such a fine unevenness may be transferred to, for example, a transparent conductive oxide (TCO) surface of an LED element manufactured through a wire method. By transferring such a fine unevenness, it is possible to obtain overall advantages of Embodiment 2 including (2-1) a transfer precision, (2-2) environmental resistance, heat resistance, light resistance, (2-3) refractive index variability, (2-4) throughput, (2-5) anti-moisture stability, and more effectively emit light with an LED element.

The fine unevenness is transferred to the TCO surface of an LED element through the following process.

First, the composition (2) according to Embodiment 2 is coated on a fine uneven surface of the resin mold having a fine unevenness on its surface. Here, the coating needs to be performed in a uniform manner, so that (2-5) anti-moisture stability as an advantage of Embodiment 2 is exerted. Subsequently, curing is performed until stickiness of the composition (2) is eliminated. Then, a cover film is put on the surface of the composition (2).

A thin film of the composition (2) serving as an adhesive layer is formed on the TCO surface, and partial condensation is promoted through a sol-gel reaction. Here, (2-5) anti-moisture stability as an advantage of Embodiment 2 is also exerted. Subsequently, the surface of the composition (2) obtained after releasing the cover film is put on the adhesive layer formed on the TCO surface. This state means a state in which the fine unevenness formed of the solidified composition (2) on the TCO surface is protected by the resin mold in a fine unevenness scale. In addition, the composition (2) used to form the fine unevenness and the composition (2) used as the adhesive layer may be identical to or different from each other if they are formed according to Embodiment 2.

Then, light is irradiated from the resin mold to a system including the TCO surface, the adhesive layer, the composition (2), and the resin mold. Subsequently, the resin mold is released, so that the fine unevenness made of the solidified composition (2) may be formed on the TCO surface. Since an inversion structure of the fine unevenness of the resin mold is transferred to the fine unevenness made of the solidified composition (2) with a high precision, (2-1) a transfer precision as an advantage of Embodiment 2 is exerted.

Since a solidification speed of the composition (2) increases using the photopolymerization, (2-4) throughput as an advantage of Embodiment 2 is exerted. Finally, by performing baking, condensation is further promoted, and organic components are volatilized.

In addition, the composition (2) according to Embodiment 2 may be coated on the fine uneven surface of the resin mold having the fine unevenness on its surface, a protection film may be bonded, and then, the resulting material may be windingly recovered while the composition (2) is stably gelated, so that the fine unevenness can be similarly transferred to the TCO surface (sapphire surface) without using the adhesive layer in the aforementioned operation.

Meanwhile, if a weight percentage of the photopolymerizable group used in the composition (2) for forming the fine unevenness and/or the adhesive layer is set to 50 weight % or higher, and more preferably 55 weight % or higher, it is possible to perform patterning for the fine unevenness. The patterning is performed by irradiating light from the resin mold through a mask and then performing development. As a result, it is possible to form the patterned fine unevenness made of the solidified composition (2) on the TCO surface. Through the patterning, a portion where the fine unevenness exists and a portion where no fine unevenness exists are formed. The portion where no fine unevenness is formed serves as an electrode portion of an LED element.

If a refractive index of the fine unevenness made of an inorganic material on the TCO surface matches with a refractive index of the TCO surface, it is possible to suppress reflection of light on the formed interface and more effectively emit light with an LED element. Here, (2-3) refractive index variability as an advantage of Embodiment 2 is exerted. In addition, an LED element generates heat during the use because a light source generates ultraviolet light. Furthermore, for use in several tens of thousands of hours or for a long time, the fabricated fine unevenness is required to have ultraviolet resistance and heat resistance. Here, (2-2) environmental resistance, heat resistance, or light resistance as an advantage of Embodiment 2 is exerted.

In addition, using the same method, the fine unevenness may be applied to a surface of a solar cell in order to improve electricity generating efficiency of the solar cell or may be applied to an antireflection structure (fine unevenness structure) in various types of glass, a wire grid structure (fine unevenness structure), and the like. In any case, it is necessary to allow the fine unevenness to exhibit a desired functionality. In any optical use, it is necessary to provide a refractive index suitable for each processing target. Furthermore, in the case of use for a solar cell or the antireflection structure used in a window, it is necessary to provide integrity against solar light, wind, or rain. In the case of a wire grid structure used in short-wavelength light, it is necessary to provide heat resistance for a long time. Any requirement can be satisfied by exerting overall advantages of Embodiment 2 including (2-1) a transfer precision, (2-2) environmental resistance, heat resistance, light resistance, (2-3) refractive index variability, (2-4) throughput, and (2-5) anti-moisture stability.

If overall advantages of Embodiment 2 including (2-1) a transfer precision, (2-2) environmental resistance, heat resistance, light resistance, (2-3) refractive index variability, (2-4) throughput, (2-5) anti-moisture stability are exerted, fine fabrication may be easily applied to a difficult-to-process material such as the sapphire substrate of an LED described above. In this case, (2-2) environmental resistance, heat resistance, light resistance, and (2-3) refractive index variability may be recognized as a strength of dry-etching resistance to an organic material.

Similar to the composition (1) according to Embodiment 1, the composition (2) according to Embodiment 2 may be used as a method of forming a fine unevenness on a processing target as described in conjunction with FIGS. 4A to 4F. The advantages of the composition (2) are as follows. Here, unless specified otherwise, it is assumed that the composition (2) has the same advantages as those described above in Embodiment 1.

For filling the concave portion 102a of the fine uneven layer 102 of the mold 100 illustrated in FIG. 4A, (2-5) anti-moisture stability as an advantage of Embodiment 2 is exerted.

The bonding between the organic layer 104 and the filling layer 103 made of the composition (2) described in conjunction with FIG. 4B may be preferably performed through energy beam irradiation. By performing heating after the energy beam irradiation, it is possible to further promote polycondensation of the composition (2). Here, (2-4) throughput as an advantage of Embodiment 2 is exerted.

In the transferring of the filling layer 103 and the organic layer 104 onto the processing target 106 described in conjunction with FIG. 4C, (2-1) a transfer precision as an advantage of Embodiment 2 is exerted.

In the dry etching of the organic layer 104 illustrated in FIG. 4D, dry etching resistance to an organic material, (2-2) environmental resistance, heat resistance, light resistance, (2-3) refractive index variability are exerted as an advantage of Embodiment 2. In addition, the dry etching resistance to an organic material may be exerted if the composition (2) is robust to an external environment, and control is made to obtain a high refractive index.

As the resin mold that has the fine unevenness on a surface and is used to transfer the composition (2), the mold used to transfer the composition (1) may be used.

The processing target for forming the fine unevenness made of the solidified composition (2) may include, but not particularly limited to, the processing target used to form the fine unevenness made of the solidified composition (1) described above.

As a configuration of the fine unevenness according to Embodiment 2 or a relationship between the configuration and the field of use thereof, the configurations of the fine unevenness of the composition (1) described above may be employed.

As described above, in the configuration of Embodiment 2, since the composition (2) contains a silicone compound, mold releasability unique to silicone is exhibited. Therefore, a transfer precision of the fine unevenness is improved when the resin mold is released from a system including the resin mold, the composition (2), and the processing target. In addition, since the steric hindrance caused by a silicone compound is exhibited so as to reduce a probability of collision of unreacted functional groups of metal alkoxides, solution anti-moisture stability is improved. Moreover, it is possible to retain environmental resistance, heat resistance, or light resistance of the fine unevenness.

In the configuration of Embodiment 2, since the composition (2) contains a metal alkoxide including a metal species Si having any one of a (meth)acrylic group, a (meth)acryloyl group, a (meth)acryloxy group, a vinyl group, an epoxy group, or an oxetane group in the same molecule and a photopolymerization initiator, it is possible to provide a steep viscosity increase (or solidification process) through photopolymerization. Therefore, a transfer precision is improved, and it is possible to obtain a solidification speed (throughput) when the inorganic precursor solution suitable for a roll-to-roll process is solidified.

Furthermore, in the configuration of Embodiment 2 described above, since metal alkoxides having different metal species are contained in the composition (2), it is possible to change an interatomic distance by changing the amount thereof ($C_{M1}/C_{Si}$) and implement refractive index variability.

Embodiment 3

Hereinafter, Embodiment 3 of the present invention will be described in detail.

In the following description, a (meth)acrylic group includes an acryl group and a methacrylic group. A (meth)acryloyl group includes an acryloyl group and a methacryloyl group. A (meth)acryloxy group includes an acryloxy group and a methacryloxy group.

The inventors found a fact that, in a fine unevenness made of an inorganic composition for transferring a fine unevenness (hereinafter, referred to as a composition (3)) that contains a silicone compound, at least two types of metal alkoxides including a metal alkoxide having a metal species M1 (where M1 denotes at least one metal element selected from a group consisting of Ti, Zr, Zn, Sn, B, In, and Al) and a metal alkoxide having a metal species Si, and a photoacid generator, all of a transfer precision, environmental resistance, heat resistance, light resistance, refractive index variability, throughput in solidification of an inorganic precursor solution, and anti-moisture stability of an inorganic precursor solution are excellent if a ratio between a morality $C_{M1}$ of the metal alkoxide having a metal species M1 and a morality $C_{Si}$ of the metal alkoxide having a metal species Si satisfies a condition of $0.2 \leq C_{M1}/C_{Si} \leq 24$, so that the fine unevenness made of an inorganic material capable of controlling a refractive index can be fabricated through an suitable transfer process.

In the following description, a reference numeral (3-1) is inserted in front of a phrase that refers to improvement of a transfer precision of the fine unevenness as an advantage of the composition (3) according to Embodiment 3. A reference numeral (3-2) is inserted in front of a phrase that refers to improvement of environmental resistance, heat resistance, or light resistance of the fine unevenness as an advantage of Embodiment 3. A reference numeral (3-3) is inserted in front of a phrase that refers to improvement of refractive index variability of the fine unevenness as an advantage of Embodiment 3. A reference numeral (3-4) is inserted in front of a phrase that refers to improvement of throughput in solidification of an inorganic precursor solution as an advantage of Embodiment 3. A reference numeral (3-5) is inserted in front of a phrase that refers to improvement of anti-moisture stability of an inorganic precursor solution as an advantage of Embodiment 3.

Similar to Embodiment 1, if a silicone compound is contained in the composition (3) according to Embodiment 3, (3-1) a transfer precision of the fine unevenness and (3-5) anti-moisture stability are improved. If a silicone compound is contained, (3-1) mold releasability unique to silicone is exhibited, so that a transfer precision of the fine unevenness is improved when the resin mold is released from a system including a resin mold, the composition (3), and a processing target. In addition, if a silicone compound is contained, (3-5) steric hindrance caused by the silicone compound is exhibited, so that a probability of collision (reaction) of unreacted functional groups of metal alkoxides is reduced, and anti-moisture stability of the solution is improved. In particular, in a case where a metal alkoxide has a metal species other than silicon (Si), stability thereof can be significantly improved by adding the silicone compound while reactivity of only the metal alkoxide is very high. Furthermore, since the silicone compound has excellent environmental resistance, heat resistance, or light resistance, it is possible to retain (3-2) environmental resistance, heat resistance, or light resistance of the fine unevenness if a silicone compound is contained.

If the photoacid generator is included in the composition (3) according to Embodiment 3, (3-4) throughput is improved. If light is irradiated onto the composition (3), the photoacid generator generates (strong) acid. Since the (strong) acid serves as a catalyst for promoting a sol-gel reaction, a solidification speed is improved, and as a result, it is possible to obtain (3-4) excellent throughput.

Similar to Embodiment 1, if the composition (3) according to Embodiment 3 contains metal alkoxides having different metal species, (3-3) refractive index variability is improved. A refractive index is associated with a density of a substance. By using different metal species in metal alkoxides and changing the amount thereof ($C_{M1}/C_{Si}$), it is possible to change an interatomic distance. As a result, it is possible to implement refractive index variability.

In particular, if the metal alkoxide is partially condensed, (3-1) a transfer precision, (3-3) refractive index variability, and (3-5) anti-moisture stability are further improved, which is desirable. If the metal alkoxide is partially condensed, it is possible to obtain a prepolymer having metal species chained by interposing oxygen elements. That is, by performing the partial condensation, it is possible to make a prepolymer having a large molecular weight. If the metal alkoxide is partially condensed, the composition (3) contains a prepolymer, (3-1) flexibility is provided to the composition (3). As a result, it is possible to suppress a breakdown of the fine unevenness and the like when the resin mold is released, so that a transfer precision is improved. By performing the partial condensation, (3-3) it is possible to form a structure in which metal species are chained by interposing oxygen in advance. If transfer is performed in this state, the number of unreacted functional groups is reduced so as to obtain a high density, in comparison with a case where the partial condensation is not performed. For this reason, it is possible to increase a refractive index. By performing the partial condensation, (3-5) the number of unreacted functional groups and the number of functional groups reacted with water vapor and the like are reduced, so that anti-moisture stability is improved.

If the composition (3) according to Embodiment 3 contains an aryl group, and in particular, the aryl group is bound with silicon, (3-2) environmental resistance, heat resistance, or light resistance is improved as in Embodiment 1. In addition, since the aryl group has a large size and is capable of more remarkably exhibiting the aforementioned effect of steric hindrance, it is possible to suppress cohesion of metal alkoxides when the composition (3) is prepared.

In the composition (3) according to Embodiment 3, if the functional groups of the metal alkoxides are partially chelated, (3-5) anti-moisture stability is significantly improved, which is desirable. By performing chelation, it is possible to suppress aggravated condensation caused by a sol-gel reaction and improve stability accordingly.

Similar to Embodiment 1, in consideration of (3-1) a transfer precision and (3-5) anti-moisture stability, the composition (3) according to Embodiment 3 preferably contains 0.2 or more and 47.6 or less parts by mass of a silicone compound with respect to 100 parts by mass of a metal alkoxide. If 0.2 or more and 23.8 or less parts by mass of a silicone compound is contained with respect to 100 parts by mass of a metal alkoxide, (3-1) a transfer precision and (3-5) anti-moisture stability are further improved, which is desirable. It is more preferably that 0.5 or more and 23.8 or less parts by mass of a silicone compound be contained. If 1 or more and 23.8 or less parts by mass of a silicone compound is contained, it is possible to further exert the aforementioned advantages, which is desirable.

Similar to Embodiment 1, if the composition (3) according to Embodiment 3 contains a fluorine-contained silane coupling agent, when a system includes a resin mold having low surface energy, the composition (3), and a processing target, the fluorine-contained silane coupling agent is biasedly precipitated to the resin mold side to lower the energy of the entire system. Therefore, (3-1) a transfer precision is improved. In addition, the transferred fine unevenness structure can have an antifouling property or a water-repellent property because fluorine is biasedly precipitated to a surface of the fine unevenness made of an inorganic material.

(A) Silicone Compound

A silicone compound contained in the composition (3) according to Embodiment 3 may include, but not particularly limited to, the silicone compound used in the composition (2) described above, which includes a siloxane material containing silicon and oxygen as a main constituent, except for (B) metal alkoxides described below. The composition (3) may contain a single type of the silicone compound or a plurality of types of the silicone compounds. By adding the siloxane material to the composition (3), it is possible to improve (3-1) a transfer precision and (3-5) anti-moisture stability while (3-2) environmental resistance, heat resistance, or light resistance of the transferred fine unevenness is retained.

(B) Metal Alkoxide

The composition (3) according to Embodiment 3 contains at least two types of metal alkoxides including a metal alkoxide having a metal species M1 (where M1 denotes at least one metal element selected from a group consisting of Ti, Zr, Zn, Sn, B, In, or Al) and a metal alkoxide having a metal species Si. If the metal alkoxide having a metal species M1 is contained, (3-3) a refractive index of the fine unevenness can be controlled. In addition, if the metal alkoxide having a metal species Si is contained, (3-5) anti-moisture stability of the composition (3) is improved. Two or more metal alkoxides having a metal species M1 or two or more metal alkoxides having a metal species Si may also be used. In addition, a metal alkoxide having a metal species M2 (where, M2≠M1 and M2≠Si) may also be used instead of or in addition to the metal alkoxide having a metal species M1 and the metal alkoxide having a metal species Si. Similarly, a metal alkoxide having a metal species M3 (where, M3≠M2, M3≠M1, and M3≠Si) may also be used.

In the composition (3) according to Embodiment 3, an interatomic distance can be changed by changing a ratio between a molarity $C_{M1}$ of the metal alkoxide having a metal species M1 and a molarity $C_{Si}$ of the metal alkoxide having a metal species Si. As a result, a refractive index can be changed. Since a ratio between $C_{M1}$ and $C_{Si}$ can be selected within a range of $0.2 \leq C_{M1}/C_{Si} \leq 24$, (3-3) a refractive index can be flexibly changed. Here, as described in Embodiment 2, the molarity $C_{Si}$ of the metal alkoxide having a metal species Si refers to a total concentration of the metal alkoxide having a metal species Si in the composition (3).

Meanwhile, as described in Embodiment 1 and 2, the molarity $C_{M1}$ of the metal alkoxide having a metal species M1 refers to a total sum of the molarities of overall metal alkoxides having metal species other than a metal species Si in the composition (3). For example, when metal alkoxides having metal species Ti, Zr, and Al have molarities $C_{Ti}$, $C_{Zr}$, and $C_{Al}$, respectively, the molarity $C_{M1}$ becomes $C_{Ti}+C_{Zr}+C_{Al}$.

The metal alkoxides contained in the composition (3) may include the metal alkoxides used in the composition (2) described above.

The metal chelate compound contained in the composition (3) may include the metal chelate compound used in the composition (2) described above.

The metal alkoxides contained in the composition (3) may have a prepolymer state in which a polymerization reaction partially progresses, and unreactive functional groups remain. If the metal alkoxide is partially condensed, it is possible to obtain a prepolymer in which metal species are chained by interposing an oxygen element. That is, by performing the partial condensation, it is possible to produce a prepolymer having a large molecular weight. By partially condensing the metal alkoxide, the composition (3) contains a prepolymer, (3-1) so that flexibility is provided to the composition (3). As a result, it is possible to suppress a breakdown of the fine unevenness generated when the resin mold is released, and the like, and improve a transfer precision. By performing the partial condensation, (3-3) it is possible to form a structure having metal species chained by interposing oxygen in advance. If the fine unevenness is transferred in this state, the number of unreacted functional groups is reduced to obtain a high density, in comparison with a case where the partial condensation is not performed. For this reason, it is possible to make a change to increase the refractive index. By performing the partial condensation, (3-5) the number of unreacted functional groups and the number of functional groups reacted with water vapor and the like are reduced, so that stability is improved. For a definition of the prepolymer, a condensation degree (viscosity range), a reaction atmosphere, and the like, the condition described in the composition (1) may be employed.

In the composition (3) according to the present invention, if the metal alkoxide contains a prepolymer, it is possible to flexibly change (3-3) a refractive index and improve (3-1) a transfer precision by setting a ratio $C_{pM1}/C_{pSi}$ between a concentration $C_{pSi}$ of silicon (Si) in the entire composition and a total concentration $C_{pM1}$ of metal elements other than silicon (Si) to 0.02 or higher and 20 or lower. From the viewpoint of similar advantages, the ratio $C_{pM1}/C_{pSi}$ is preferably set to 0.05 or higher and 20 or lower, and most preferably 0.1 or higher and 15 or lower. Furthermore, from the viewpoint of improvement of a physical strength of the solidified transferred composition (3), the ratio $C_{pM1}/C_{pSi}$ is more preferably set to 0.3 or higher and 10 or lower, and most preferably 0.5 or higher and 5 or lower.

The metal alkoxide contained in the composition (3) according to Embodiment 3 may include the fluorine-contained silane coupling agent used in the composition (2).

(C) Photoacid Generator

A photoacid generator used in the composition (3) according to Embodiment 3 is not particularly limited if it generates photoacid through light irradiation. For example, the photoacid generator may include aromatic onium salts such as sulfonium salts and iodonium salts. The photoacid generator may include, for example, sulfonium hexafluoroantimonate, benzyl triphenylphophnium hexafluorophosphate, benzyl pyridinium hexafluorophosphate, diphenyliodonium hexafluorophosphate, triphenyl sulfonium hexafluorophosphate, benzoin tosylate, ADEKA OPTOMER sp-170 (produced by ADEKA CORPORATION), ADEKA OPTOMER sp-172 (produced by ADEKA CORPORATION), WPAG-145 (produced by Wako Pure Chemical Industries, Ltd.), WPAG-170 (produced by Wako Pure Chemical Industries, Ltd.), WPAG-199 (produced by Wako Pure Chemical Industries, Ltd.), WPAG-281 (produced by Wako Pure Chemical Industries, Ltd.), WPAG-336 (produced by Wako Pure Chemical Industries, Ltd.), WPAG-367 (produced by Wako Pure Chemical Industries, Ltd.), CPI-100P (produced by San-Apro, Ltd.), CPI-101A (produced by San-Apro, Ltd.), CPI-200K (produced by San-Apro, Ltd.), CPI-210S (produced by San-Apro, Ltd.), DTS-102 (produced by Midori Kagaku Co., Ltd.), TPS-TF (produced by Toyo Gosei CO., Ltd.), DTBPI-PFBS (produced by Toyo Gosei CO., Ltd.), and the like.

In the method of mixing the photoacid generator with the composition (3), it is preferable that a photoacid generator diluted with a solvent be used from the viewpoint of stability of the metal alkoxide having a metal species M1. The solvent used to dissolve the photoacid generator is not particularly limited if it can dissolve the photoacid generator. For example, the solvent may include propylene carbonate or a mixture of propylene carbonate and a solvent such as an alcohol-based solvent, an ether-based solvent, and a ketone-based solvent. As the alcohol-based solvent, the ether-based solvent, or the ketone-based solvent, the solvent used in the composition (1) may be used. A mixing ratio between propylene carbonate and the solvent is set such that a weight percentage of solvent/propylene carbonate becomes 5 or higher in order to obtain an excellent mutual solubility, which is desirable.

If the composition (3) contains the photoacid generator, it is possible to improve (3-4) throughput and provide a patterning characteristic. Since only the light-irradiated portion is solidified through a sol-gel reaction, it is possible to perform negative patterning by irradiating light using a mask, performing solidification, and then performing a rinse (development).

(D) Chelating Agent

The composition (3) according to Embodiment 3 may contain a chelating agent as a stabilizer of the metal alkoxide. The chelating agent is a generic term of substances in which a plurality of atoms in a ligand molecule are bound with metal ions to form a metal chelate complex. Any chelating agent may be employed without a particular limitation if it can chelate the metal alkoxide and is cleaved through light irradiation. For example, the chelating agent may include a β-diketone compound or a β-keto ester compound. For example, the β-diketone may include β-diketones having a carbon number of 5 to 13 such as acetylacetone, benzoylacetone, dibenzoylmethane, 2,2,6,6-tetramethyl-3,5-heptanedione, and vinyl acetylacetone. In particular, if acetylacetone or benzoylacetone is used, an anti-moisture stabilization effect becomes significant, which is desirable.

The addition amount of the chelating agent is preferably set to 0.25 mol or more with respect to a functional group of the metal alkoxide having a metal species M1 (M1≠Si) of 1 mol. If the addition amount is set to 0.4 mol or more, it is possible to further exert (3-5) anti-moisture stability, which is desirable. More preferably, the addition amount is set to 0.5 mol or more. Although the upper limit is not particularly determined, the upper limit is preferably set to 1 mol or less from the viewpoint of solidification after light irradiation.

If the chelating agent is contained, it is possible to improve (3-5) anti-moisture stability and a patterning characteristic. Since only the light-irradiated portion is solidified through a sol-gel reaction, it is possible to perform negative patterning by irradiating light using a mask, performing a solidification, and then performing a rinse (development).

(E) Other Additives

The composition (3) according to Embodiment 3 may contain a photopolymerization initiator. As the photopolymerization initiator, the photopolymerization initiator used in the composition (2) described above may be selected. Instead of or in addition to the photopolymerization initiator, the photosensitizer used in the composition (2) may be included.

The composition (3) according to Embodiment 3 may contain the polysilane used in the composition (2) described above.

The composition (3) according to Embodiment 3 may contain the metal oxide fine particles used in the composition (2) described above.

The composition (3) according to Embodiment 3 may contain the solvent used in the composition (2) described above. As the solvent used in the composition (3), a solvent satisfying a condition of the radius of inertia may be preferably selected as in the composition (2).

(F) Method of Transferring Fine Unevenness

A method of forming a fine unevenness using the composition (3) according to Embodiment 3 is not particularly limited if the fine unevenness provided on a surface of a resin mold (cast) can be transferred to a processing target.

The method of forming the fine unevenness of FIGS. 1A to 3C described above in conjunction with Embodiment 1 may be used in the composition (3). In addition, the advantages of the composition (3) are as follows. Here, unless specified otherwise, it is assumed that the composition (3) has the advantages similar to those of Embodiment 1.

First, in the method of forming the fine unevenness illustrated in FIGS. 1A and 1B, light irradiation may be used to solidify the composition (3) of the uneven layer 12 illustrated in FIG. 1A. Here, using the light irradiation, photoacid is generated from the photoacid generator contained in the composition (3). By using the generated photoacid as a catalyst, it is possible to promote polycondensation of the metal alkoxide. For this reason, it is possible to increase a viscosity of the composition (3). Here, since a light source for light irradiation may be appropriately selected depending on constituents of the composition (3), a UV-LED light source, a metal halide light source, a high-pressure mercury lamp light source, and the like may be employed without a particular limitation. In addition, if an integral light amount from the start of light irradiation to the end of the irradiation is preferably set to 500 to 5000 mJ/cm$^2$, it is possible to improve a transfer precision, which is desirable. More preferably, the integral light amount is set to 800 to 2500 mJ/cm$^2$. Furthermore, light irradiation may be performed using a plurality of light sources. Both the light irradiation and the heating may be used together. Here, "used together" means that the light irradiation and the heating may be performed simultaneously, or the heating is performed after the light irradiation. By performing the heating, it is possible to further promote polycondensation of the metal alkoxide, so that it is possible to improve (3-1) a transfer precision. The heating temperature may be appropriately selected depending on a material of the resin mold 11 and the composition (3). Preferably, the heating temperature may be set to approximately 45° C. to 180° C. In addition, the heating time may be preferably set to 15 seconds to 30 minutes. Although a film thickness of the composition (3) depends on constituents of the composition (3) or a type of the fine unevenness, the film thickness is preferably set to approximately 3 μM or smaller because it is possible to obtain a fast transfer speed and guarantee a transfer precision, which is desirable. In order to further exert the advantages of the present invention, the film thickness is more preferably set to 1.5 μm or smaller, and most preferably 1.2 inn or smaller. In addition, the lower limit is preferably equal to or greater than a volume of the fine unevenness. In order to further improve a transfer precision, the lower limit is more preferably set to 1.2 times or greater of the volume of the fine unevenness, and most preferably 1.5 times or greater of the volume of the fine unevenness.

In the method of forming the fine unevenness of FIGS. 2A to 2C, light irradiation may be used to solidify the uneven layer 23 made of the gelated composition (3) interposed between the processing target 24 and the resin mold 21 illustrated in FIG. 2B. By performing the light irradiation, photoacid is generated from the photoacid generator contained in the composition (3). By using the generated photoacid as a catalyst, it is possible to promote polycondensation of the metal alkoxide. For this reason, it is possible to increase a viscosity of the composition (3). Here, since a light source for light irradiation may be appropriately selected depending on constituents of the composition (3), a UV-LED light source, a metal halide light source, a high-pressure mercury lamp light source, and the like may be employed without a particular limitation. In addition, if an integral light amount from the start of light irradiation to the end of the irradiation is preferably set to 500 to 5000 mJ/cm$^2$, it is possible to improve a transfer precision, which is desirable. More preferably, the integral light amount is set to 800 to 2500 mJ/cm$^2$. Furthermore, light irradiation may be performed using a plurality of light sources. Both the light irradiation and the heating may be used together. Here, "used together" means that the light irradiation and the heating may be performed simultaneously, or the heating is performed after the light irradiation. By performing the heating, it is possible to further promote polycondensation of the metal alkoxide, so that it is possible to improve (3-1) a transfer precision. The heating temperature may be appropriately selected depending on a material of the resin mold 11 and the composition (3). Preferably, the heating temperature may be set to approximately 45° C. to 180° C. In addition, the heating time may be preferably set to 15 seconds to 30 minutes. Although a film thickness of the composition (3) depends on constituents of the composition (3) or a type of the fine unevenness, the film thickness is preferably set to approximately 5 μm or smaller because it is possible to obtain a fast transfer speed and guarantee a transfer precision, which is desirable. In order to further exert the advantages of the present invention, the film thickness is more preferably set to 3 μm or smaller, and most preferably 1.5 μm or smaller. In addition, the lower limit is preferably equal to or greater than a volume of the fine unevenness. In order to further improve a transfer precision, the lower limit is more preferably set to 1.2 times or greater of the volume of the fine unevenness, and most preferably 1.5 times or greater of the volume of the fine unevenness.

In the case of the composition (3), after the structure 26 of FIG. 2C is obtained, the structure 26 may be baked to volatilize organic components.

In the method of forming the fine unevenness illustrated in FIGS. 3A to 3C, the solidification of the uneven layer 32 of FIG. 3A is preferably performed through heating within a temperature range of 20 to 200° C. from the viewpoint of a solidification (condensation) speed or (3-1) a transfer precision. In particular, the solidification is preferably performed through multistage heating for slowly performing the heating across 2 to 5 stages. In addition, along with the aforementioned heating, the uneven layer 32 may be disposed under a decompressive atmosphere. If the uneven layer 32 is disposed under a decompressive atmosphere, it is possible to remove water or alcohol generated in the sol-gel reaction and increase a reaction speed toward condensation in the sol-gel reaction.

In the solidification of the adhesive layer 34 illustrated in FIG. 3B, light irradiation may be effectively used. By performing the light irradiation, photoacid is generated from the photoacid generator contained in the composition (3). By using the generated photoacid as a catalyst, it is possible to promote polycondensation of the metal alkoxide. For this reason, it is possible to increase a viscosity of the composition (3). Here, since a light source for light irradiation may be appropriately selected depending on constituents of the composition (3), a UV-LED light source, a metal halide light source, a high-pressure mercury lamp light source, and the like may be employed without a particular limitation. In addition, if an integral light amount from the start of light irradiation to the end of the irradiation is preferably set to 500 to 5000 mJ/cm$^2$, it is possible to improve a transfer precision, which is desirable. More preferably, the integral light amount is set to 800 to 2500 mJ/cm$^2$. Furthermore, the light irradiation may be performed using a plurality of light sources. Both the light irradiation and the heating may be used together. Here, "used together" means that the light irradiation and the heating may be performed simultaneously, or the heating is performed after the light irradiation. By performing the heating, it is possible to further promote polycondensation of the metal alkoxide, so that it is possible to improve (3-1) a transfer precision. The heating temperature may be appropriately selected depending on a material of the resin mold 11 and the composition (3). Preferably, the heating temperature may be set to approximately 45° C. to 180° C. In addition, the heating time may be preferably set to 15 seconds to 30 minutes. Although a thickness of the adhesive layer 34 depends on a composition of the adhesive layer 34 or a type of the fine unevenness, the thickness is preferably set to approximately 3 μm or smaller because it is possible to obtain a fast transfer speed and guarantee a transfer precision, which is desirable. In order to further exert the advantages of the present invention, the thickness is more preferably set to 1.5 μm or smaller, and most preferably 1.2 μm or smaller. In addition, the lower limit is preferably set to 30 nm or higher, more preferably 100 nm or higher, and most preferably 300 nm or higher from the viewpoint of improvement of adhesiveness.

Condensation may be further promoted by performing heating for the structure 37 illustrated in FIG. 3C.

In the overall processes described above, only the portion where light is irradiated is photopolymerized by forming a mask on the resin mold in the light irradiation, so that it is possible to perform patterning through development (negative development). In addition, in the process exemplarily described in conjunction with FIGS. 3A to 3C, the patterning may be performed by including the photoacid generator and the chelating agent in the composition (3) of the adhesive layer 34 even when the photoacid generator and the chelating agent are excluded from the composition (3) of the uneven layer 32.

In the method of forming the fine unevenness illustrated in FIGS. 1A to 3C, by using a reel-like resin mold in the resin molds 11, 21, and 31, it is possible to fabricate the layered products 14, 26, and 37 through a simple lamination process. If a roll-to-roll process is applied, it is possible to windingly recover the resin mold having the composition (3). By winding out the resin mold having the composition (3), it is possible to fabricate the fine unevenness in a large area.

Such a fine unevenness may be transferred to, for example, a transparent conductive oxide (TCO) surface of an LED element manufactured through a wire method. By transferring such a fine unevenness, it is possible to obtain overall advantages of Embodiment 3 including (3-1) transfer precision, (3-2) environmental resistance, heat resistance, light resistance, (3-3) refractive index variability, (3-4) a throughput, and (3-5) anti-moisture stability, and more effectively emit light with an LED element.

The fine unevenness is transferred to the TCO surface of an LED element through the following process. First, the composition (3) according to Embodiment 3 is coated on a fine uneven surface of the resin mold having a fine unevenness on its surface. Here, the coating needs to be performed in a uniform manner, so that (3-5) anti-moisture stability as an advantage of Embodiment 3 is exerted. Subsequently, curing is performed until stickiness of the composition (3) is eliminated. Then, a cover film is put on the surface of the composition (3).

A thin film of the composition (3) serving as an adhesive layer is formed on the TCO surface, and partial condensation is promoted through a sol-gel reaction. Here, (3-5) anti-moisture stability as an advantage of Embodiment 3 is also exerted. Subsequently, the surface of the composition (3) obtained after releasing the cover film is put on the adhesive layer formed on the TCO surface. This state means a state in which the fine unevenness formed of the solidified composition (3) on the TCO surface is protected by the resin mold in a fine unevenness scale. In addition, the composition (3) used to form the fine unevenness and the composition (3) used as the adhesive layer may be identical to or different from each other if they are formed according to Embodiment 3.

Then, light is irradiated using a mask from the resin mold to a system including the TCO surface, the adhesive layer, the composition (3), and the resin mold. Subsequently, the resin mold is released, so that the fine unevenness made of the solidified composition (3) may be formed on the TCO surface. Since an inversion structure of the fine unevenness of the resin mold is transferred to the fine unevenness made of the solidified composition (3) with a high precision, (3-1) a transfer precision as an advantage of Embodiment 3 is exerted.

If photoacid generated by the photoacid generator is used as a catalyst, a solidification speed of the composition (3) increases, so that (3-4) throughput as an advantage of Embodiment 3 is exerted. Finally, by performing baking, condensation is further promoted, and organic components are volatilized. In particular, in a case where the fine unevenness is used at an atmosphere in which solar light or ultraviolet light is continuously irradiated, it is preferable that organic components be volatilized through baking in order to suppress deterioration. The baking temperature is preferably set to 200 to 800° C., and more preferably 250 to 550° C. Although the baking time may be changed depending on a volume of the composition (3) and the amount of the photopolymerizable group, the baking time is preferably set to approximately 10 to 90 minutes, and more preferably 30 to 60 minutes.

In addition, the composition (3) according to Embodiment 3 may be coated on a fine uneven surface of the resin mold having the fine unevenness on its surface, a protection film may be bonded, and then, the resulting material may be windingly recovered while the composition (3) is stably gelated, so that the fine unevenness can be similarly transferred to the TCO surface (sapphire surface) without using the adhesive layer in the aforementioned operation.

Meanwhile, the patterning may be performed by irradiating light using a mask from the resin mold and then performing development, so that the patterned fine unevenness made of the solidified composition (3) can be formed on the TCO surface. Through the patterning, a portion where the fine unevenness exists and a portion where no fine unevenness exists are formed. The portion where no fine unevenness is formed serves as an electrode portion of an LED element.

If a refractive index of the material forming the fine unevenness made of an inorganic material on the TCO surface matches with a refractive index of the TCO surface, it is possible to suppress reflection of light on the formed interface and more effectively emit light with an LED element. Here, (3-3) refractive index variability as an advantage of Embodiment 3 is exerted. In addition, an LED element generates heat during the use because a light source generates ultraviolet light. Furthermore, for use in several tens of thousands of hours or for a long time, the fabricated fine unevenness is required to have ultraviolet resistance and heat resistance. Here, (3-2) environmental resistance, heat resistance, or light resistance as an advantage of the composition (3) of Embodiment 3 is exerted.

In addition, using the similar method, the fine unevenness may be applied to a surface of a solar cell to improve electricity generating efficiency of the solar cell or may be applied to an antireflection structure (fine unevenness structure) in various types of glass, a wire grid structure (fine unevenness structure), and the like. In any case, it is necessary to allow the fine unevenness to exhibit a desired functionality. In any optical use, it is necessary to provide a refractive index suitable for each processing target. Furthermore, in the case of use for a solar cell or the antireflection structure used in a window, it is necessary to provide integrity against solar light, wind, or rain. In the case of a wire grid structure used in short-wavelength light, it is necessary to provide heat resistance for a long time. Any requirement can be satisfied by exerting overall advantages of Embodiment 3 including (3-1) transfer precision, (3-2) environmental resistance, heat resistance, light resistance, (3-3) refractive index variability, (3-4) throughput, and (3-5) anti-moisture stability.

If overall advantages of Embodiment 3 including (3-1) a transfer precision, (3-2) environmental resistance, heat resistance, light resistance, (3-3) refractive index variability, (3-4) throughput, and (3-5) anti-moisture stability are exerted, fine fabrication may be easily applied to a difficult-to-process material such as the sapphire substrate of an LED described above. In this case, (3-2) environmental resistance, heat resistance, light resistance, and (3-3) refractive index variability may be recognized as a strength of dry-etching resistance to an organic material.

Similar to the composition (1) according to Embodiment 1, the composition (3) according to Embodiment 3 may be used as a method of forming a fine unevenness on a processing target as described in conjunction with FIGS. 4A to 4F. The advantages of the composition (3) are as follows.

Here, unless specified otherwise, it is assumed that the composition (3) has the same advantages as those described above in Embodiment 1.

For filling the concave portion 102a of the fine uneven layer 102 of the mold 100 illustrated in FIG. 4A (3-4), anti-moisture stability as an advantage of Embodiment 3 is exerted.

The bonding between the organic layer 104 and the filling layer 103 made of the composition (3) described in conjunction with FIG. 4B may be preferably performed through energy beam irradiation. By performing heating after the energy beam irradiation, it is possible to further promote polycondensation of the composition (3). Here, (3-4) throughput as an advantage of Embodiment 3 is exerted.

In the transferring of the filling layer 103 and the organic layer 104 onto the processing target 106 described in conjunction with FIG. 4C, (3-1) a transfer precision as an advantage of Embodiment 3 is exerted.

In the dry etching of the organic layer 104 illustrated in FIG. 4D, dry etching resistance to an organic material, (3-2) environmental resistance, heat resistance, light resistance, or (3-3) refractive index variability is exerted as an advantage of Embodiment 3. In addition, the dry-etching resistance to an organic material may be exerted if the composition (3) is robust to an external environment, and control is made to obtain a high refractive index.

As the resin mold that has a fine unevenness on its surface and is used to transfer the composition (3), the mold used to transfer the composition (1) described above may be used.

The processing target for forming a fine unevenness made of the solidified composition (3) may include, but not particularly limited to, the processing target used to form the fine unevenness made of the solidified composition (1) described above.

As a configuration of the fine unevenness according to Embodiment 3 or a relationship between the configuration and the field of use thereof, the configurations of the fine unevenness of the composition (1) described above may be employed.

As described above, in the configuration of Embodiment 3, since the composition (3) contains a silicone compound, mold releasability unique to silicone is exhibited. Therefore, a transfer precision of the fine unevenness is improved when the resin mold is released from a system including the resin mold, the composition (3), and the processing target. In addition, since the steric hindrance caused by a silicone compound is exhibited so as to reduce a probability of collision (reaction) of unreacted functional groups of metal alkoxides, solution anti-moisture stability is improved. Moreover, it is possible to retain environmental resistance, heat resistance, or light resistance of the fine unevenness.

In the configuration of Embodiment 3, since the photoacid generator is contained in the composition (3), the photoacid generator generates photoacid serving as a catalyst for promoting a sol-gel reaction by irradiating light onto the composition (3). Therefore, it is possible to improve a solidification speed and obtain an excellent throughput.

Furthermore, in the configuration of Embodiment 3, since metal alkoxides having different metal species are included in the composition (3), it is possible to change an interatomic distance by changing the amount thereof ($C_{M1}/C_{Si}$) and implement refractive index variability.

Embodiment 4

Hereinafter, Embodiment 4 of the present invention will be described in detail.

The inventors find a fact that, out of the advantages of the composition (1) described above including (1-1) a transfer precision, (1-2) environmental resistance, heat resistance, light resistance, (1-3) refractive index variability, (1-4) anti-moisture stability, (1-5) a leveling, and (1-6) adhesiveness, in particular, (1-1) a transfer precision, (1-2) environmental resistance, heat resistance, light resistance, (1-3) refractive index variability, (1-4) anti-moisture stability, and (1-6) adhesiveness are improved, if a composition of the fine unevenness contains silicon (Si) and a metal element M1 other than silicon (Si), including a metalloxane bond (—Si—O-M1-) obtained by binding silicon (Si) and the metal element M1 by interposing oxygen, the metal element M1 other that silicon (Si) includes at least a metal element selected from a group consisting of Ti, Zr, Zn, Sn, B, In, and Al, and a ratio $C_{pM1}/C_{pSi}$ between a concentration $C_{pSi}$ of silicon (Si) and a concentration $C_{pM1}$ of the metal element M1 other than silicon (Si) is set to 0.02 or higher and 20 or lower.

The inorganic composition for transferring a fine unevenness according to Embodiment 4 (hereinafter, referred to as a composition (4)) contains silicon (Si) and a metal element M1 other than silicon (Si) including a metalloxane bond (—Si—O-M1-) in which the silicon (Si) and the metal element M1 other than silicon (Si) are chained by interposing oxygen. As a result, a density of the composition (4) as a solution is improved, and reactivity decreases. For this reason, (1-1) transfer precision, (1-2) environmental resistance, heat resistance, light resistance, (1-3) refractive index variability, (1-4) anti-moisture stability, and (1-6) adhesiveness are improved.

Furthermore, if the ratio $C_{pM1}/C_{pSi}$ between a concentration $C_{pSi}$ of silicon (Si) and a concentration $C_{pM1}$ of a metal element M1 other than silicon (Si) is set to 0.02 or higher and 20 or lower, a solution including the metalloxane bond is formed within a predetermined range of the metal element concentration ratio. Therefore, a density can be easily controlled, so that (1-3) refractive index variability and (1-1) a transfer precision are improved. From the viewpoint of similar advantages, the ratio $C_{pM1}/C_{pSi}$ is preferably set to 0.05 or higher and 20 or lower, and most preferably 0.1 or higher and 15 or lower. In addition, in order to improve a physical strength of the solidified composition (4), the ratio $C_{pM1}/C_{pSi}$ is more preferably set to 0.3 or higher and 10 or lower, and most preferably 0.5 or higher and 5 or lower. Furthermore, a plurality of metal elements M1 other than silicon (Si) may be included. For example, in a case where two or more types of metal elements are included, a total concentration of the metal elements is set to the concentration $C_{pM1}$ of the metal element M1 other than Si.

If the metal element M1 other that silicon (Si) is selected from a group consisting of Ti, Zr, Zn, Sn, B, In, and Al, stability of the metalloxane bond is improved. Therefore, (1-1) transfer precision, (1-3) refractive index variability, (1-4) anti-moisture stability, and (1-6) adhesiveness are improved. In particular, in order to further exert the aforementioned advantages, the metal element M1 other than silicon (Si) is preferably selected from a group consisting of Ti, Zr, Zn, and B. Most preferably, the metal element M1 other than silicon (Si) is selected from Ti or Zr.

It is defined that the metalloxane bond (—Si—O—M1-) has a state in which at least four or more metal elements are chained by interposing an oxygen atom. That is, it is defined that metal elements are condensed in the form of —O-Ma-O-Mb-O-Mc-O-Md—O— and so on (where Ma, Mb, Mc, and Md denote metal elements (Si or M1) including at least one or more Si). For example, in a case where the composition (4) having a metal element (Ti) other than silicon (Si) includes a metalloxane bond —O—Ti—O—Si—O—, a metalloxane bond of the composition (4) according to the present invention satisfies a condition n≥2 in a general formula [—Ti—O—Si—O-]$_n$. However, the metalloxane bond does not always have an alternating arrangement such as —O—Ti—O—Si—. For this reason, it is assumed that the metalloxane bond includes at least one or more Si elements in the general formula —O-Ma-O-Mb-O-Mc-O-Md—O—. If n is set to 10 or greater in a general formula [-Me-O—]$_n$ of the metalloxane bond (where Me denotes silicon (Si) or a metal element M1 other than silicon (Si)), (1-1) a transfer precision, (1-2) environmental resistance, heat resistance, light resistance, (1-3) refractive index variability, (1-4) anti-moisture stability, and (1-6) adhesiveness are further improved. From the viewpoint of similar advantages, n is preferably set to 15 or greater.

In the composition (4), a siloxane bond is preferably included instead of or in addition to the metalloxane bond described above. Here, the siloxane bond is defined as [—Si—O-]$_n$ (where n≥10). If n≥10, flexibility unique to the siloxane bond is exhibited, so that (1-1) a transfer precision is improved. In addition, it is possible to improve (1-5) a leveling due to low energy unique to the siloxane bond. Furthermore, if the siloxane bond is included, it is possible to increase a distance between metal elements M1. Therefore, it is possible to improve (1-4) anti-moisture stability. In order to further exert such advantages, it is preferable that n≥30, more preferably n≥50, and most preferably n≥100. In order to perform control to have a low refractive index and improve anti-moisture stability, it is preferable that n≥200, and more preferably n≥500. Meanwhile, in order to improve (1-1) a transfer precision, it is preferably that n≤100000, more preferably n≤10000, and most preferably n≤8000. In addition, in order to perform control to have a high refractive index, it is preferable that n≤5000, and more preferably n≤3000.

If an aryl group bound with silicon (Si) is included, it is possible to improve (1-4) anti-moisture stability using a large molecular volume of the aryl group.

In the composition (4), from the viewpoint of (1-1) a transfer precision, (1-3) refractive index variability, and (1-4) anti-moisture stability, a viscosity at a temperature of 25° C. is preferably set to 30 cP or higher and 10000 cP or lower. In particular, in order to improve (1-3) refractive index variability, the viscosity is preferably set to 50 cP or higher. In addition, in order to improve (1-1) a transfer precision and (1-4) anti-moisture stability, the viscosity is more preferably set to 100 cP or higher, and most preferably 150 cP or higher. In order to improve (1-1) a transfer precision, the viscosity is more preferably set to 8000 cP or lower, and most preferably 5000 cP or lower. It is assumed that the viscosity is a value measured when the solvent content is equal to or smaller than 5%.

If a radius of inertia is set to 5 nm or smaller in a case where the composition (4) is dissolved into a propylene glycol monomethyl ether solvent having a concentration of 3 weight %, (1-1) a transfer precision and (1-4) anti-moisture stability are improved, which is desirable. In particular, the radius of inertia is preferably set to 3 nm or smaller, more preferably 1.5 nm or smaller, and most preferably 1 nm or smaller. Here, the radius of inertia is a radius computed by applying a Gunier plot to the measurement result obtained through a small-angle X-ray scattering measurement using X-rays having a wavelength of 0.154 nm.

As a material of the composition (4), the material of the composition (1) described above may be used. In particular, the material of the composition (4) may be manufactured by partially condensing the material of the composition (1). Here, the partial condensation may be performed through dehydration-based polycondensation and/or dealcoholization reaction-based polycondensation. For example, it is possible to obtain the composition (4) by heating a solution including the composition (1), water, and a solvent (such as alcohol, ketone, and ether) within a temperature range of 20 to 150° C. and performing hydrolysis and polycondensation. The polycondensation degree can be controlled and appropriately selected based on a temperature, a reaction time, and a pressure (pressure deficit). If the hydrolysis/polycondensation is slowly performed by using moisture in the environmental atmosphere (water vapor based on humidity) without adding water, it is possible to reduce the distribution of the number of bound elements in the metalloxane bond. Furthermore, in order to promote polycondensation, energy beams may be irradiated. Here, since a light source of the energy beams may be appropriately selected depending on a type of the metal alkoxide, a UV-LED light source, a metal halide light source, a high-pressure mercury lamp light source, and the like may be employed without a particular limitation. In particular, by adding a photoacid generator to the metal alkoxide and irradiating energy beams to the composition, photoacid is generated from the photoacid generator. By using the generated photoacid as a catalyst, it is possible to promote polycondensation of the metal alkoxide to obtain the composition (4). In addition, in order to control a condensation degree and a steric arrangement of the composition (4), the composition (4) may be obtained by performing the aforementioned operation while the metal alkoxide in the composition (1) is chelated.

If the composition (4) contains a chemical structure Me-OR (where Me denotes any one of silicon (Si) and the metal elements M1 other than silicon (Si), and R denotes an element corresponding to alcohol in a chemical structure HOR), it is possible to further improve (1-1) a transfer precision, which is desirable. This is because a chemical reaction caused by polycondensation can be used by including such a portion. An element R in a chemical structure Me-OR may include, for example, an ethoxy group, a methoxy group, a propyl group, an isopropyl group, or the like.

A solvent used in the composition (4) may include the solvent of the composition (1) of Embodiment 1.

A method of forming a fine unevenness on a processing target using the composition (4) may employ the techniques described in the method of Embodiment 1. The advantages of the composition (4) are similar to those of the composition (1). In particular, (1-1) a transfer precision, (1-2) environmental resistance, heat resistance, or light resistance, (1-3) refractive index variability, (1-4) anti-moisture stability, and (1-6) adhesiveness are improved. Furthermore, by adding the photoacid generator described in the composition (3) of Embodiment 3 to the composition (4), it is possible to provide the advantages of the composition (3) in addition to the aforementioned advantages.

Embodiment 5

Hereinafter, Embodiment 5 of the present invention will be described in detail.

The inventors find a fact that the advantages of the composition (2) described above including (2-1) a transfer precision, (2-2) environmental resistance, heat resistance, light resistance, (2-3) refractive index variability, (2-4) throughput, or (2-5) anti-moisture stability are further improved, if a composition of the fine unevenness contains: silicon (Si) and a metal element M1 other than silicon (Si), including a metalloxane bond (—Si—O-M1-) obtained by combining silicon (Si) and a metal element M1 by interposing oxygen; any one of an acryl group, a methacrylic group, an acryloyl group, a methacryloyl group, an acryloxy group, a methacryloxy group, a vinyl group, an epoxy group, or an oxetane group; and a photopolymerization initiator, the metal element M1 includes at least a metal element selected from a group consisting of Ti, Zr, Zn, Sn, B, In, and Al, and a ratio $C_{pM1}/C_{pSi}$ between a concentration $C_{pSi}$ of silicon (Si) and a concentration $C_{pM1}$ of the metal element M1 other than silicon (Si) is set to 0.01 or higher and 4.5 or lower. An inorganic composition for transferring a fine unevenness according to Embodiment 5 (hereinafter, simply referred to as a composition (5)) contains silicon (Si) and a metal element M1 other than silicon (Si), and the silicon (Si) and the metal element M1 other than silicon (Si) makes a metalloxane bond (—Si—O-M1-) chained by interposing oxygen. As a result, a density of the composition (5) as a solution is improved, and reactivity is lowered. For this reason, (2-1) transfer precision, (2-2) environmental resistance, heat resistance, light resistance, (2-3) refractive index variability, and (2-5) anti-moisture stability are improved.

If the ratio $C_{pM1}/C_{pSi}$ between a concentration $C_{pSi}$ of silicon (Si) and a concentration $C_{pM1}$ of the metal element M1 other than silicon (Si) is set to 0.01 or higher and 4.5 or lower, a solution including the metalloxane bond is formed within a predetermined range of the metal element concentration ratio. Therefore, a density can be easily controlled, so that (2-3) refractive index variability and (2-1) a transfer precision are improved. From the viewpoint of similar advantages, the ratio $C_{pM1}/C_{pSi}$ is preferably set to 0.05 or higher and 4 or lower, and more preferably 0.1 or higher and 3.5 or lower. In addition, in order to improve a physical strength of the solidified composition (5), the ratio $C_{pM1}/C_{pSi}$ is more preferably set to 0.3 or higher and 3 or lower, and most preferably 0.5 or higher and 2.5 or lower. Furthermore, a plurality of metal elements M1 other than silicon (Si) may be included. For example, in a case where two or more types of metal elements are included, a total concentration of the metal elements is set to the concentration $C_{pM1}$ of the metal element M1 other than silicon (Si).

If the metal element M1 other than silicon (Si) is selected from a group consisting of Ti, Zr, Zn, Sn, B, In, and Al, stability of the metalloxane bond is improved. Therefore, (2-1) a transfer precision, (2-3) refractive index variability, (2-4) anti-moisture stability, and (2-6) adhesiveness are improved. In particular, in order to further exert the aforementioned advantages, the metal element M1 other than silicon (Si) is preferably selected from a group consisting of Ti, Zr, Zn, and B. Most preferably, the metal element M1 is selected from Ti or Zr.

It is defined that the metalloxane bond (—Si—O-M1-) has a state in which at least four or more metal elements are chained by interposing an oxygen atom. That is, it is defined that metal elements are condensed in the form of —O-Ma-O-Mb-O-Mc-O-Md—O— and so on (where Ma, Mb, Mc, and Md denote silicon (Si) or metal elements M1, including at least one or more silicon elements (Si)). For example, in a case where the composition (5) having a metal element (Ti) other than silicon (Si) includes a metalloxane bond —O—Ti—O—Si—O—, a metalloxane bond of the composition (5) according to the present invention satisfies a condition n≥2 in a general formula [—Ti—O—Si—O—]$_n$. However, the metalloxane bond does not always have an alternating arrangement such as —O—Ti—O—Si—. For this reason, it is assumed that the metalloxane bond includes at least one or more silicon elements (Si) in the general formula —O-Ma-O-Mb-O-Mc-O-Md—O—. If n is set to 10 or greater in a general formula $[\text{-Me-O-}]_n$ of the metalloxane bond (where Me denotes silicon (Si) or a metal element other than silicon (Si)), (2-1) a transfer precision, (2-2) environmental resistance, heat resistance, light resistance, (2-3) refractive index variability, and (2-5) anti-moisture stability are further improved. From the viewpoint of similar advantages, n is preferably set to 15 or greater.

In the composition (5), a siloxane bond is preferably included instead of or in addition to the metalloxane bond described above. Here, the siloxane bond is defined as $[\text{—Si—O-}]_n$ (where n≥10). If n≥10, flexibility unique to the siloxane bond is exhibited, so that (2-1) a transfer precision is improved. In addition, it is possible to improve a leveling due to low energy unique to the siloxane bond. Furthermore, if the siloxane bond is included, it is possible to increase a distance between metal elements M1. Therefore, it is possible to improve (2-5) anti-moisture stability. In order to further exert such advantages, it is preferable that n≥30, more preferably n≥50, and most preferably n≥100. In order to perform control to have a low refractive index and improve anti-moisture stability, it is preferable that n≥200, and more preferably n≥500. Meanwhile, in order to improve (2-1) a transfer precision, it is preferably that n≤100000, more preferably n≤10000, and most preferably n≤8000. In addition, in order to perform control to have a high refractive index, it is preferable that n≤5000, and more preferably n≤3000.

The composition (5) includes any one of an acryl group, a methacrylic group, an acryloyl group, a methacryloyl group, an acryloxy group, a methacryloxy group, a vinyl group, an epoxy group, or an oxetane group and a photopolymerization initiator. By satisfying such a requirement, it is possible to apply characteristics of an organic material and significantly improve a reaction speed. For this reason, (2-1) a transfer precision and (2-4) throughput are further improved. In particular, in order to improve (2-4) throughput, the composition (5) preferably contains an acryl group, a methacrylic group, an acryloyl group, a methacryloyl group, an acryloxy group, a methacryloxy group, or a vinyl group. From the viewpoint of adhesiveness for a processing target when a fine unevenness is provided to the processing target using the composition (5), it is preferable that an epoxy group or an oxetane group be contained.

If the composition (5) contains a chemical structure Me-OR (where Me denotes silicon (Si) and metal elements M1 other than silicon (Si), and R denotes an element corresponding to alcohol in a chemical structure HOR), it is possible to further improve (2-1) a transfer precision, which is desirable. This is because a chemical reaction caused by polycondensation can be used by containing such a portion. An element R in a chemical structure Me-OR may include, for example, an ethoxy group, a methoxy group, a propyl group, an isopropyl group, and the like.

If an aryl group bound with silicon (Si) is included, it is possible to improve (2-5) anti-moisture stability using a large molecular volume of the aryl group.

In the composition (5), from the viewpoint of (2-1) a transfer precision, (2-3) refractive index variability, and (2-5) anti-moisture stability, a viscosity at a temperature of 25° C. is preferably set to 30 cP or higher and 10000 cP or lower. In particular, in order to improve (2-3) refractive index variability, the viscosity is preferably set to 50 cP or higher. In addition, in order to improve (2-1) a transfer precision and (2-5) anti-moisture stability, the viscosity is preferably set to 100 cP or higher, and more preferably 150 cP or higher. In order to improve (2-1) a transfer precision, the viscosity is more preferably set to 8000 cP or lower, and most preferably 5000 cP or lower. In addition, it is assumed that the viscosity is a value measured when the solvent content is equal to or smaller than 5%.

If a radius of inertia is set to 5 nm or smaller in a case where the composition (5) is dissolved into a propylene glycol monomethyl ether solvent having a concentration of 3 weight %, (2-1) a transfer precision and (2-5) anti-moisture stability are improved, which is desirable. In particular, the radius of inertia is preferably set to 3 nm or smaller, more preferably 1.5 nm or smaller, and most preferably 1 nm or smaller. Here, the radius of inertia is a radius computed by applying a Gunier plot to the measurement result obtained through a small-angle X-ray scattering measurement using X-rays having a wavelength of 0.154 nm.

A solvent used in the composition (5) may include the solvent of the composition (2) described in Embodiment 2.

As a material of the composition (5), the material of the composition (2) described above may be used. In particular, fabrication may be made by partially condensing the material of the composition (2). Here, the partial condensation may be performed through dehydration-based polycondensation and/or dealcoholization reaction-based polycondensation. For example, it is possible to obtain the composition (5) by heating a solution including the composition (2), water, and a solvent (such as alcohol, ketone, and ether) within a temperature range of 20 to 150° C. and performing hydrolysis and polycondensation. The polycondensation degree can be controlled and appropriately selected based on a temperature, a reaction time, and a pressure (pressure deficit). If the hydrolysis/polycondensation is slowly performed by using moisture in the environmental atmosphere (water vapor based on humidity) without adding water, it is possible to reduce the distribution of the number of bound elements in the metalloxane bond. Furthermore, in order to promote polycondensation, energy beams may be irradiated. Here, since a light source of the energy beams may be appropriately selected depending on a type of the metal alkoxide, a UV-LED light source, a metal halide light source, a high-pressure mercury lamp light source, and the like may be employed without a particular limitation. In particular, by adding a photoacid generator to the metal alkoxide and irradiating energy beams to the composition, photoacid is generated from the photoacid generator. By using the generated photoacid as a catalyst, it is possible to promote polycondensation of the metal alkoxide to obtain the composition (5). In addition, in order to control a condensation degree and a steric arrangement of the composition (5), the composition (5) may be obtained by performing the aforementioned operation while the metal alkoxide in the composition (2) is chelated.

A method of forming a fine unevenness on a processing target using the composition (5) may employ the techniques described in the method of Embodiment 2. In addition, the advantages of the composition (5) are further exerted in comparison with those of the composition (2). Furthermore, the advantages of the composition (3) may be provided in addition to the aforementioned advantages by adding the photoacid generator used in the composition (3) of Embodiment 3 to the composition (5).

The compositions (1) to (5) according to Embodiments 1 to 5 described above may be variously used in the transferring of the fine unevenness of resin mold. Specifically, the compositions (1) to (5) may be used in fabrication in the fields of an optical device such as a microlens array, a wire grid type polarization, moth-eye antireflection film, diffraction gratings, and a photonic crystal element, or nanoimprint lithography of a patterned media. In addition, the compositions (1) to (5) may be used to fabricate a biochemical device such as a cell culture sheet, a fat culture chip, and a biosensor element. Furthermore, the compositions (1) to (5) may be used in various fields such as various electrodes of batteries or capacitors, a micro/nano-channel, a heat-sinking surface, and a heat-resistance surface. Moreover, the compositions (1) to (5) may be used to form a flat film without transferring the fine unevenness of the resin mold, for example, in a barrier film against various gases or liquids, a hard coat material, a multilayer (single layer) antireflection film, and the like. In addition, the compositions (1) to (5) may be used as a mask when fine fabrication is applied to a difficult-to-process material.

Next, applications of the present invention will be described, in which the compositions (1) to (5) according to Embodiments 1 to 5 are used to form a fine unevenness on a processing target.

FIGS. 6 and 7 are schematic cross-sectional views illustrating a method of forming a fine unevenness on a processing target using an inorganic composition for transferring a fine unevenness according to the present invention.

Figure 6A:
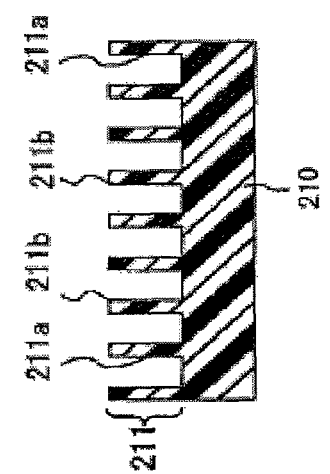
FIGS. 6A to 6C are schematic cross-sectional views illustrating a method of forming a fine unevenness on a processing target using an inorganic composition for transferring a fine unevenness according to the present embodiment.

As illustrated in FIG. 6A, a mold 210 has an unevenness structure 211 on a principal surface thereof. The unevenness structure 211 includes a plurality of concave portions 211a and a plurality of convex portions 211b. The mold 210 is, for example, a resin mold having a film shape or a sheet shape.

Figure 6B:
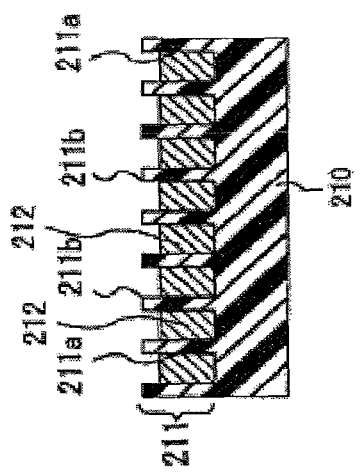

First, as illustrated in FIG. 6B, the concave portion 211a of the unevenness structure 211 of the mold 210 is filled with the compositions (1) to (5) according to Embodiments 1 to 5 to provide a second mask layer 212 for patterning a first mask layer described below.

Figure 6C:
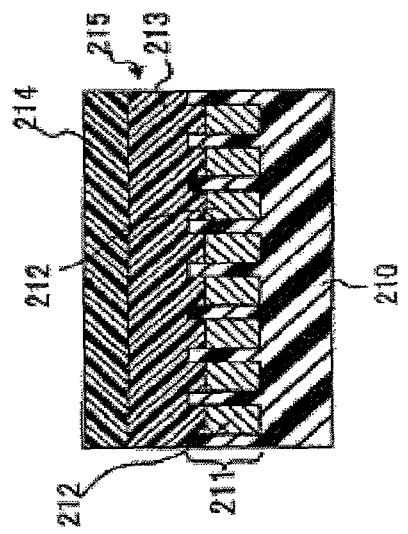

Next, as illustrated in FIG. 6C, the first mask layer 213 is formed over the unevenness structure 211 including the second mask layer 212. The first mask layer 213 is used in the patterning of the processing target described below. The first mask layer 213 is made of, for example, photosolidifiable resin or thermosetting resin.

In addition, as illustrated in FIG. 6C, a protection layer 214 may be provided over the first mask layer 213. The protection layer 214 protects the first mask layer 213 and is not compulsory.

Here, a layered product including the mold 210, the second mask layer 212, and the first mask layer 213 is referred to as a layered product 215 for forming a fine pattern or, simply, a layered product 215.

Then, a processing target 220 illustrated in FIG. 7A is prepared. The processing target 220 may be, for example, a sapphire substrate. First, as illustrated in FIG. 7B, after removing the protection layer 214 from the principal surface of the processing target 220, the layered product 215 is laminated (thermocompressive bonding) such that an exposed surface of the first mask layer 213 faces a principal surface of the processing target 220. Subsequently, energy beams are irradiated onto the layered product 215 to solidify the first mask layer 213 and bond the layered product 215 to the processing target 220.

Then, as illustrated in FIG. 7C, the mold 210 is released from the first and second mask layers 213 and 212. As a result, an intermediate structure 221 including the processing target 220 and the first and second mask layers 213 and 212 is obtained.

Then, by using the second mask layer 212 as a mask, the first mask layer 213 is patterned, for example, through ashing as illustrated in FIG. 7D. In addition, for example, reactive ion etching is performed for the processing target 220 by using the patterned first mask layer 213 as a mask, so as to form a fine unevenness pattern 222 on a principal surface of the processing target 220 as illustrated in FIG. 7E. Finally, the first mask layer 213 remaining on the principal surface of the processing target 220 is removed so as to obtain the processing target 220 having the fine unevenness pattern 222 as illustrated in FIG. 7F.

In this application, the processes until the layered product 215 is obtained from the mold 210 illustrated in FIGS. 6A to 6C are performed using a single line (hereinafter, referred to as a first line). The subsequent processes in FIGS. 7A to 7F are performed using another line (hereinafter, referred to as a second line). More preferably, the first and second lines are built in different utilities. For this reason, in the layered product 215, for example, the mold 210 has a film shape. If the layered product 215 has flexibility, the layered product 215 is stored and delivered in a roll shape. In addition, if the mold 210 has a sheet shape, a plurality of layered products 215 are stored or delivered in a stacked state.

More preferably, the first line is a supplier line of the layered product 215, and the second line is a user line of the layered product 215. In this manner, if the supplier produces the layered product 215 in advance and provides the layered product 215 to a user, the following advantages can be obtained.

(1) It is possible to perform fine fabrication for the processing target 220 by reflecting a precision of the fine unevenness of the mold 210 included in the layered product 215. That is, it is possible to guarantee a precision of the fine structure using the layered product 215 and perform fine fabrication for the processing target 220 without using a complicated process or apparatus.

(2) It is possible to use the layered product 215 in a place optimal to manufacture a device using the fabricated processing target 220. That is, it is possible to manufacture a device having a stable functionality.

As described above, by using the first line as a supplier line of the layered product 215 and using the second line as a user line of the layered product 215, it is possible to use the layered product 215 in an environment optimal to fabricate the processing target 220 and manufacture a device using the fabricated processing target 220. For this reason, it is possible to improve a throughput of fabricating the processing target 220 and assembling a device. Furthermore, the layered product 215 is a layered product including a mold 210 and a functional layer provided on an unevenness structure 211 of the mold 210. That is, a mask layer arrangement precision that rules a fabrication precision of the processing target 220 can be guaranteed using a precision of the unevenness structure 211 of the mold 210 of the layered product 215. As described above, by using the first line as a supplier line of the layered product 215 and using the second line as a user line of the layered product 215, it is possible to fabricate and use the processing target 220 with a high precision using the layered product 215 in an environment optimal to manufacture a device using the fabricated processing target 220.

In a case where the composition (1) according to Embodiment 1 is applied to the method of forming a fine unevenness on a processing target described above, the following advantages can be obtained. By using the composition (1), a filling effect for filling the composition (1) in the concave portion 211a of the unevenness structure 211 of the mold 210 is improved because a leveling caused by the silicone contained in the composition (1) is improved, and energy stabilization is promoted when the composition (1) containing the metal alkoxide is coated and filled. Furthermore, by using the composition (1), a precision for fabricating the first mask layer 213 is improved because the metal alkoxide contained in the composition (1) moves toward a side wall of the first mask layer 213 when the first mask layer is fabricated.

In a case where the composition (2) according to Embodiment 2 is applied to the method of forming a fine unevenness on a processing target described above, the following advantages can be obtained. By using the composition (2), transfer precisions of the first and second mask layers 213 and 212 are improved in addition to the advantages of the composition (1) described above because the composition (2) contains a silane coupling agent having a photopolymerizable group, so that a bonding force between the composition (2) and the first mask layer 213 increases at the time of light irradiation in FIG. 7B.

In a case where the composition (3) according to Embodiment 3 is applied to the method of forming a fine unevenness on a processing target described above, the following advantages can be obtained. By using the composition (3), a fabrication precision of the first mask layer 213 is improved in addition to the advantage of the composition (1) described above. This is because the composition (3) contains a photoacid generator, so that photoacid is generated at the time of light irradiation in FIG. 7B to promote solidification of the composition (3), an etching selectivity between the composition (3) and the first mask layer 213 is improved, and dry etching resistance (physical stability) of the composition (3) is improved.

In a case where the composition (4) according to Embodiment 4 is applied to the method of forming a fine unevenness on a processing target described above, the following advantages can be obtained. By using the composition (4), a precision for fabricating the first mask layer 213 is improved because a side wall of the first mask layer 213 is protected by the metalloxane bond included in the composition (4) when the first mask layer 213 is fabricated. In addition, arrangement stability for the inner side of the concave portion 211a of the unevenness structure 211 is improved. For this reason, it is possible to reduce a deviation of the second mask layer 212 when the first mask layer 213 is coated, so that a fabrication precision of the processing target is improved.

In a case where the composition (5) according to Embodiment 5 is applied to the method of forming a fine unevenness on a processing target described above, the following advantages can be obtained. By using the composition (5), transfer precisions of the first and second mask layers 212 and 213 are improved in addition to the advantages of the composition (4) described above. This is because the composition (4) contains a photopolymerizable group, so that a bonding force between the composition (4) and the first mask layer 213 increases at the time of light irradiation in FIG. 7B.

Hereinafter, examples for verifying advantages of the embodiments of the present invention will be described.

Example of Composition (1)

First, an example for clarifying advantages of the composition (1) according to Embodiment 1 will be described. Evaluation was made by performing Tests 1-1 to 1-6 and a refractive index measurement. Abbreviations in each of the following tables have the following meanings. In the compositional ratios in each table, a total sum of the applied metal alkoxides is expressed as 100 parts by mass.

DACHP:
    fluorine-contained urethane(meth)acrylate (OPTOOL DAC HP produced by DAIKIN INDUSTRIES, ltd.)

M350:
    trimethylolpropane (EO-modified)triacrylate (M350 produced by TOAGOSEI CO., LTD.)

I.184:
    1-hydroxy-cyclohexyl-phenyl-ketone (Irgacure™ 184 produced by BASF Corporation)

I.369:
    2-benzyl-2-dimethylamino-1-(4-morpholinophenyl)-butanone-1 (Irgacure™ 369 produced by BASF Corporation)

TTB:
    titanium(IV) tetrabutoxid monomer (produced by Wako Pure Chemical Industries, Ltd.)

TTiP:
    titanium tetraisopropoxide (produced by Wako Pure Chemical Industries, Ltd.)

DEDFS:
    diethoxydiphenylsilane (LS-5990 produced by Shin-Etsu Silicone Co., Ltd.)

TEOS:
    tetraethoxysilane (LS-2430 produced by Shin-Etsu Silicone Co., Ltd.)

TEB:
    triethoxyborane (produced by TOKYO CHEMICAL INDUSTRY CO., LTD.)

SH710:
    phenyl-modified silicone (produced by Dow Corning Toray Corporation)

X21-5841:
    —OH-modified silicone (produced by Shin-Etsu Silicone Co., Ltd.)

KR213:
    silicone alkoxy oligomer (produced by Shin-Etsu Silicone Co., Ltd.)

SH200(20c):
    polydimethylsiloxane (produced by Dow Corning Toray Corporation)

Silicone:
    a total sum of the applied silicone $C_{M1}/C_{Si}$: a ratio between a morality $C_{M1}$ of the metal alkoxide having a metal species M1 and a morality $C_{Si}$ of the metal alkoxide having a metal species Si measured through an XPS method for a thin film of the composition (1). In this example, the ratio $C_{M1}/C_{Si}$ was computed based on a dose.

Es/Eb: a ratio between a surface fluorine element concentration Es and an average fluorine element concentration Eb measured through an XPS method for the resin mold having a fine unevenness on a surface.

The surface fluorine element concentration of the resin mold was measured through an XPS (X-ray Photoelectron Spectroscopy) method. In the XPS method, a penetration length of X-rays on a sample surface reaches several nanometers, which is very shallow. Therefore, the XPS measurement value was employed as the fluorine element concentration Es of the resin mold surface. The resin mold was diced into small pieces having a size of approximately 2 mm by 2 mm, and a slot type mask having a size of 1 mm by 2 mm was covered, so that XPS measurement was performed under the following condition.

<XPS Measurement Condition>
Measurement Station: ESCALAB250 produced by Thermo Fisher Scientific Inc.
Excitation Source: mono. AlKα 15 kV×10 mA Analysis Size: about 1 mm (elliptical shape)
Survey Area
  Survey Scan: 0 to 1,100 eV
  Narrow Scan: F 1 s, C 1 s, O 1 s, N 1 s
Pass Energy
  Survey Scan: 100 eV
  Narrow Scan: 20 eV Meanwhile, in order to measure an average fluorine element concentration Eb in the resin of the resin mold, physically sliced fragments were decomposed through a flask combustion method, and then, an ion-chromatography analysis was performed, so that an average fluorine element concentration Eb in the resin was measured.

In addition, the resin molds used in each test were manufactured as follows.

(a) Cylindrical Master Mold Fabrication (for Fabricating a Master Mold for Fabricating a Resin Mold)

By using quartz glass as a base material of the cylindrical master mold, a fine unevenness was formed on a surface of the quartz glass through direct-write lithography using a semiconductor laser. DURASURF HD-1101Z (produced by DAIKIN INDUSTRIES, ltd) was coated on a surface of the quartz glass roll having a fine surface unevenness, and the resulting material was heated at a temperature of 60° C. for one hour and was then disposed at a room temperature for 24 hours to fix the coating. Then, the resulting quartz glass was rinsed three times using DURASURF HD-ZV (produced by DAIKIN INDUSTRIES, ltd), and a releasing treatment was performed.

(B) Resin Mold Fabrication

Source materials corresponding to resin types of Table 1 were mixed. For overall solutions, the following process was performed. In the process of forming the resin mold (B) from the resin mold (A) described below, the same resin used to fabricate the resin mold (A) is also used to form the resin mold (B).

TABLE 1

| Resin No. | DACHP [g] | M350 [g] | I.184 [g] | I.369 [g] | Es/Eb |
|---|---|---|---|---|---|
| 1 | 10.0 | 100.0 | 5.0 | — | 74.1 |
| 2 | 15.0 | 100.0 | 5.5 | 2.0 | 55.4 |
| 3 | 17.5 | 100.0 | 5.5 | 2.0 | 49.0 |

Photosolidifiable resin was coated on an easy adhesion surface of a PET film (A4100, produced by TOYOBO CO., LTD.) having a width of 300 mm and a thickness of 100 μm until the coated film thickness reaches 6 μm using a Micro Gravure coating (produced by Yasui Seiki Co., Ltd.). Then, the PET film having the coated photosolidifiable resin was pressedly bonded to the cylindrical master mold using a nip roll (0.1 MPa). Ultraviolet rays were irradiated using a UV light exposure apparatus (H-bulb) produced by Fusion UV Systems Japan K. K such that an integral exposure light amount under a lamp center becomes 600 mJ/cm$^2$ under an atmospheric pressure at a temperature of 25° C. and a humidity of 60% to continuously perform photosolidification, so that a reel-like resin mold (A) (a length of 200 m and a width of 300 mm) having a surface having the transferred fine unevenness was obtained. A shape of the surface fine unevenness of the reel-like resin mold (A) was observed using a scanning electron microscope (SEM). As a result, a neighboring distance between convex portions was 250 nm, and a height of the convex portion was 250 nm.

The same photosolidifiable resin as that used to fabricate the resin mold (A) was coated on an easy adhesion surface of a PET film (A4100, produced by TOYOBO CO., LTD.) having a width of 300 mm and a thickness of 100 μm using a Micro Gravure coating (produced by Yasui Seiki Co., Ltd.) until the coated film thickness reaches 6 μm. Then, the PET film having the coated photosolidifiable resin is pressedly bonded to the fine unevenness surface of the resin mold (A) obtained by directly transferring a fine unevenness from the cylindrical master mold using a nip roll (0.1 MPa), and ultraviolet light is irradiated using a UV light exposure apparatus (H-bulb) produced by Fusion UV Systems Japan K. K such that an integral exposure light amount under a lamp center becomes 600 mJ/cm$^2$ under an atmospheric pressure at a temperature of 25° C. and a humidity of 60% to continuously perform photosolidification, so that a plurality of reel-like resin mold (B) (having a length of 200 m and a width of 300 mm) having a surface where the same fine unevenness as that of the cylindrical master mold is transferred were obtained. A shape of the surface fine unevenness of the reel-like resin mold (B) was observed using a scanning electron microscope (SEM). As a result, a neighboring distance between concave portions was 250 nm, and a height of the concave portion was 250 nm.

A ratio Es/Eb between the surface fluorine element concentration Es and the average fluorine element concentration Eb of the resulting resin mold (B) was written on Table 1. Hereinafter, the resin mold (B) is referred to as a resin mold. In addition, in the following tests in which the resin mold is used, the same test was performed for three types of resin molds (Resin Nos. 1 to 3).

(Test 1-1) Anti-Moisture Stability

The prepared composition (1) was diluted with isopropyl alcohol (IPA) by 10 times and was cast on a quartz substrate, and appearance of the composition (1) was observed through visual inspection. A test was performed under an atmospheric pressure at a temperature of 24° C. and a humidity of 49%. If the composition (1) is thinned, a surface area per volume increases. In addition, if the alcohol solvent is diluted, reaction with water vapor is easily generated when the solvent is dried after the casting. When the composition (1) is reacted with water vapor, a film surface of the composition (1) becomes clouded.

Meanwhile, the prepared composition (1) was cast on a quartz substrate without dilution, and appearance of the composition (1) was observed through visual inspection. If the composition (1) is thinned, a surface area per volume increases. If the composition (1) is reacted with water vapor, a wrinkle or undulation is formed on a film surface of the composition (1).

Anti-moisture stability was evaluated through visual inspection by performing the aforementioned test.

x: when clouding is generated as IPA is volatilized after casting.

Δ: when slight clouding is generated as IPA is volatilized after casting, and a wrinkle or undulation is generated by condensation on a film surface of the composition (1) within 3 minutes.

○: when clouding is not generated as IPA is volatilized after casting, and a wrinkle or undulation is generated by condensation on a film surface of the composition (1) within 5 minutes.

◎: when clouding is not generated as IPA is volatilized, and a wrinkle or undulation caused by condensation on a film surface of the composition (1) is not generated for 5 minutes.

(Test 1-2) Leveling

The composition (1) diluted with methyl ethyl ketone (MEK) by 1.5 times was coated on a fine unevenness surface of the resin mold using a bar coater at a speed of 50 mm/sec. Since fluorine elements are biasedly precipitated on a surface of the resin mold, the resin mold has a water-repellent property. For this reason, if a leveling is deteriorated, the coated solution is repelled even in the coating. This phenomenon was observed and evaluated through visual inspection.

x: when repelling occurs across the entire surface of the fine unevenness so that the composition (1) forms a dot shape.

Δ: when repelling slightly occurs across the entire surface of the fine unevenness so that a dot shape is partially generated.

○: when a coating capability is excellent across the entire surface of the fine unevenness, but repelling significantly occurs at an interface between a structural portion and a non-structural portion.

◎: when a coating capability is excellent across the entire surface of the fine unevenness, and repelling does not significantly occur at an interface between a structural portion and a non-structural portion.

(Test 1-3) Separability from Cover Film

The prepared composition (1) was diluted with IPA by 3 times, and a film was formed on a polyethylene (PE) film through a spin coat method. Subsequently, the resulting material was disposed at a room temperature for 5 minutes and was then put on the fine unevenness surface of the resin mold. After the putting on, curing was performed at a temperature of 80° C. for 30 minutes, and then, the temperature returns to a room temperature. Then, the PE film was separated.

x: when separation resistance of the PE film is high, and the PE film is bent in the separation.

Δ: when the thin film of the composition (1) is formed on the fine unevenness surface of the resin mold in spite of a separation-resistant feeling of the PE film.

○: when, in the process of returning to the room temperature, the PE film is partially separated by itself, and the remaining portion has weak adherence so that the film may be touched and taken off, and when the thin film of the composition (1) is formed on the fine unevenness surface of the resin mold.

◎: when, in the process of returning to the room temperature, the PE film is separated by itself, and the thin film of the composition (1) is formed on the fine unevenness surface of the resin mold.

(Test 1-4) Transfer 1

A film of the prepared composition (1) was formed on an ITO membrane on a quartz substrate through a spin coat method. The film was disposed at a room temperature for 3 minutes and is then heated at a temperature of 80° C. for 30 seconds. Subsequently, the resulting resin mold was put on the film surface of the composition (1). Then, the resulting material was pressed under a pressure of 0.05 MPa for 5 minutes and was then cured at a room temperature. Finally, the resin mold was separated.

After separating the resin mold, a surface of the quartz substrate side where a film of the composition (1) was formed was observed through visual inspection and AFM.

x: when the composition (1) is attached to the resin mold side and is not transferred onto the quartz substrate, or when solidification of the composition (1) is not sufficient.

Δ: when the composition (1) is partially attached to the resin mold side.

○: when the composition (1) exists on the quartz substrate, the fine unevenness is also transferred, and a fine defect is partially generated.

◎: when the composition (1) exists on the quartz substrate, and the fine unevenness is also transferred.

(Test 1-5) Transfer 2

A film of the prepared composition (1) was formed on the resin mold using a bar coater. Subsequently, the film of the composition (1) formed on the resin mold was disposed at a room temperature for 5 minutes and was put on a quartz substrate. Then, the resulting material was pressed under a pressure of 0.05 MPa for 5 minutes and was cured at a room temperature. Finally, the resin mold was separated. Evaluation of the transfer precision was similar to that of Test 4 (Transfer 1).

(Test 1-6) Transfer 3

A film of the prepared composition (1) was formed on the resin mold using a bar coater. Subsequently, the film of the composition (1) formed on the resin mold was disposed at a room temperature for 5 minutes. Subsequently, the film of the composition (1) was disposed at a temperature of 80° C. for 5 minutes to remove stickiness. Subsequently, a polyethylene film was put on a surface of the composition (1) having no stickiness opposite to the resin mold and was then stored.

A film of the composition (1) similar to the film of the composition (1) formed on the resin mold was formed on an ITO membrane on a quartz substrate through a spin coat method and was disposed at a room temperature for 3 minutes. Then, the resulting material was heated at a temperature of 80° C. for 30 seconds. Subsequently, the polyethylene film on the film of the composition (1) formed on the resin mold was separated, and a surface of the film of the composition (1) having no stickiness was put on a surface of the film of the composition (1) formed on the ITO film. Then, the resulting material was pressed under a pressure of 0.05 MPa for 5 minutes and was cured at a room temperature. Finally, the resin mold was separated. Evaluation of a transfer precision was similar to that of Test 4 (Transfer 1).

Example 1

Reagents corresponding to the sample numbers in Table 2 were mixed to prepare the composition (1). Tests 1-1 to 1-6 were performed for the composition (1). The results are shown in Table 3.

TABLE 2

| Sample No. | SH710 [g] | X21-58 41 [g] | TTB [g] | DEDFS [g] | TEOS [g] | silicone dose [g] | $C_{M1}/C_{Si}$ |
|---|---|---|---|---|---|---|---|
| 1-1 | 0.0 | 0.0 | 71.4 | 23.8 | 4.8 | 0.0 | 1.90 |
| 1-2 | 0.2 | 0.0 | 71.4 | 23.8 | 4.8 | 0.2 | 1.90 |
| 1-3 | 0.2 | 0.2 | 71.4 | 23.8 | 4.8 | 0.5 | 1.90 |
| 1-4 | 0.5 | 0.5 | 71.4 | 23.8 | 4.8 | 1.0 | 1.90 |
| 1-5 | 4.8 | 4.8 | 71.4 | 23.8 | 4.8 | 9.5 | 1.90 |
| 1-6 | 11.9 | 11.9 | 71.4 | 23.8 | 4.8 | 23.8 | 1.90 |
| 1-7 | 23.8 | 23.8 | 71.4 | 23.8 | 4.8 | 47.6 | 1.90 |
| 1-8 | 47.6 | 47.6 | 71.4 | 23.8 | 4.8 | 95.2 | 1.90 |

TABLE 3

| Sample No. | Test 1-1 Stability | Test 1-2 Leveling Effect | Test 1-3 PE Separability | Test 1-4 Transfer 1 | Test 1-5 Transfer 2 | Test 1-6 Transfer 3 |
|---|---|---|---|---|---|---|
| 1-1 | X | X | X | ○ | X | X |
| 1-2 | Δ | Δ | ○ | ○ | Δ | Δ |
| 1-3 | ○ | ○ | ◎ | ○ | ○ | ○ |
| 1-4 | ○ | ○ | ◎ | ○ | ○ | ○ |

TABLE 3-continued

| Sample No. | Test 1-1 Stability | Test 1-2 Leveling Effect | Test1-3 PE Separability | Test 1-4 Transfer 1 | Test 1-5 Transfer 2 | Test 1-6 Transfer 3 |
|---|---|---|---|---|---|---|
| 1-5 | ◎ | ◎ | ◎ | ○ | ○ | ○ |
| 1-6 | ◎ | ◎ | ◎ | ○ | ○ | ○ |
| 1-7 | ◎ | ◎ | ◎ | Δ | Δ | Δ |
| 1-8 | ◎ | ◎ | ◎ | X | X | X |

From the aforementioned description, it is recognized that, when a silicone dose is between 0.2 and 47.6 parts by mass, (1-1) a transfer precision, (1-4) anti-moisture stability, (1-5) leveling, and (1-6) adhesiveness are exerted, so that various test items are highly evaluated.

Example 2

For the composition (1) of Sample No. 1-4 in Example 1-1, a partial condensation condition was changed as shown in Table 4. The partial condensation was performed by maturing the solution obtained by mixing the reagents under an atmosphere at a temperature of 80° C., and the condensation time was changed. In such a composition (1), Tests 1-1 to 1-6 described above were performed. The results are shown in Table 5. In the evaluation items in Table 5, the following item was added.
○+: improvement was made in comparison with the evaluation item ○ in Tests 1-1 to 1-6, but did not reach the evaluation item ◎.

In addition, Time in Table 4 refers to a condensation time.

TABLE 4

| Sample No. | SH710 [g] | X21-5841 [g] | TTB [g] | DEDFS [g] | TEOSg [g] | Time [h] | $C_{M1}/C_{Si}$ |
|---|---|---|---|---|---|---|---|
| 1-4 | 0.5 | 0.5 | 71.4 | 23.8 | 4.8 | 0 | 1.90 |
| 1-9 | 0.5 | 0.5 | 71.4 | 23.8 | 4.8 | 1 | 1.90 |
| 1-10 | 0.5 | 0.5 | 71.4 | 23.8 | 4.8 | 2 | 1.90 |
| 1-11 | 0.5 | 0.5 | 71.4 | 23.8 | 4.8 | 4 | 1.90 |
| 1-12 | 0.5 | 0.5 | 71.4 | 23.8 | 4.8 | 6 | 1.90 |

TABLE 5

| Sample No. | Test 1-1 stability | Test 1-2 Leveling Effect | Test 1-3 PE Separability | Test 1-4 Transfer 1 | Test 1-5 Transfer 2 | Test 1-6 Transfer 3 |
|---|---|---|---|---|---|---|
| 1-4 | ○ | ○ | ◎ | ○ | ○ | ○ |
| 1-9 | ○ | ○ | ◎ | ○ | ○ | ○ |
| 1-10 | ○+ | ○ | ◎ | ○+ | ○+ | ○+ |
| 1-11 | ◎ | ○ | ◎ | ◎ | ◎ | ◎ |
| 1-12 | ◎ | ○ | ◎ | ◎ | ◎ | ◎ |

From the aforementioned description, it is recognized that various test items are more highly evaluated by applying partial condensation for at least 2 hours.

Example 3

Tests 1-1 to 1-6 described above were similarly performed for the compositions (1) corresponding to the sample numbers of Table 6 having compositions different from the compositions (1) of Examples 1 and 2. The results of tests are shown in Table 7.

TABLE 6

| Sample No. | SH710 [g] | X21-5841 [g] | SH20020c [g] | KR213 [g] | TTB [g] | DEDFS [g] | TEB [g] | TTiP [g] | TEOS [g] | silicone dose [g] | $C_{M1}/C_{Si}$ |
|---|---|---|---|---|---|---|---|---|---|---|---|
| 1-13 | 4.8 | 4.8 | 0.0 | 0.0 | 71.4 | 23.8 | 0.0 | 0.0 | 4.8 | 9.5 | 1.90 |
| 1-14 | 4.5 | 4.5 | 0.0 | 0.0 | 68.2 | 22.7 | 0.0 | 4.5 | 4.5 | 9.1 | 2.06 |
| 1-15 | 0.0 | 4.8 | 4.8 | 0.0 | 71.4 | 23.8 | 0.0 | 0.0 | 4.8 | 9.5 | 1.90 |
| 1-16 | 4.8 | 0.0 | 0.0 | 4.8 | 71.4 | 23.8 | 0.0 | 0.0 | 4.8 | 9.5 | 1.90 |
| 1-17 | 4.8 | 10.5 | 0.0 | 4.8 | 71.4 | 23.8 | 0.0 | 0.0 | 4.8 | 20.0 | 1.90 |
| 1-18 | 4.8 | 0.0 | 4.8 | 0.0 | 71.4 | 23.8 | 0.0 | 0.0 | 4.8 | 9.5 | 1.90 |
| 1-19 | 4.8 | 2.4 | 2.4 | 0.0 | 71.4 | 23.8 | 0.0 | 0.0 | 4.8 | 9.5 | 1.90 |
| 1-20 | 4.5 | 4.5 | 0.0 | 0.0 | 67.9 | 22.6 | 0.0 | 5.0 | 4.5 | 9.0 | 2.07 |
| 1-21 | 4.8 | 4.8 | 0.0 | 0.0 | 71.4 | 23.8 | 5.0 | 0.0 | 4.8 | 9.5 | 1.90 |

TABLE 7

| Sample No. | Test 1-1 Stability | Test 1-2 Leveling Effect | Test 1-3 PE Separability | Test 1-4 Transfer 1 | Test 1-5 Transfer 2 | Test 1-6 Transfer 3 |
|---|---|---|---|---|---|---|
| 1-13 | ◎ | ◎ | ◎ | ◎ | ◎ | ◎ |
| 1-14 | ◎ | ◎ | ◎ | ◎ | ◎ | ◎ |
| 1-15 | ◎ | ◎ | ◎ | ◎ | ◎ | ◎ |
| 1-16 | ◎ | ◎ | ◎ | ◎ | ◎ | ◎ |
| 1-17 | ◎ | ◎ | ◎ | ◎ | ◎ | ◎ |
| 1-18 | ◎ | ◎ | ◎ | ◎ | ◎ | ◎ |
| 1-19 | ◎ | ◎ | ◎ | ◎ | ◎ | ◎ |
| 1-20 | ◎ | ◎ | ◎ | ◎ | ◎ | ◎ |
| 1-21 | ◎ | ◎ | ◎ | ◎ | ◎ | ◎ |

From the aforementioned description, it is recognized that overall items of Tests 1-1 to 1-6 are highly evaluated also in other compositions across a silicone dose range of Example 1.

Example 4

Figure 8:
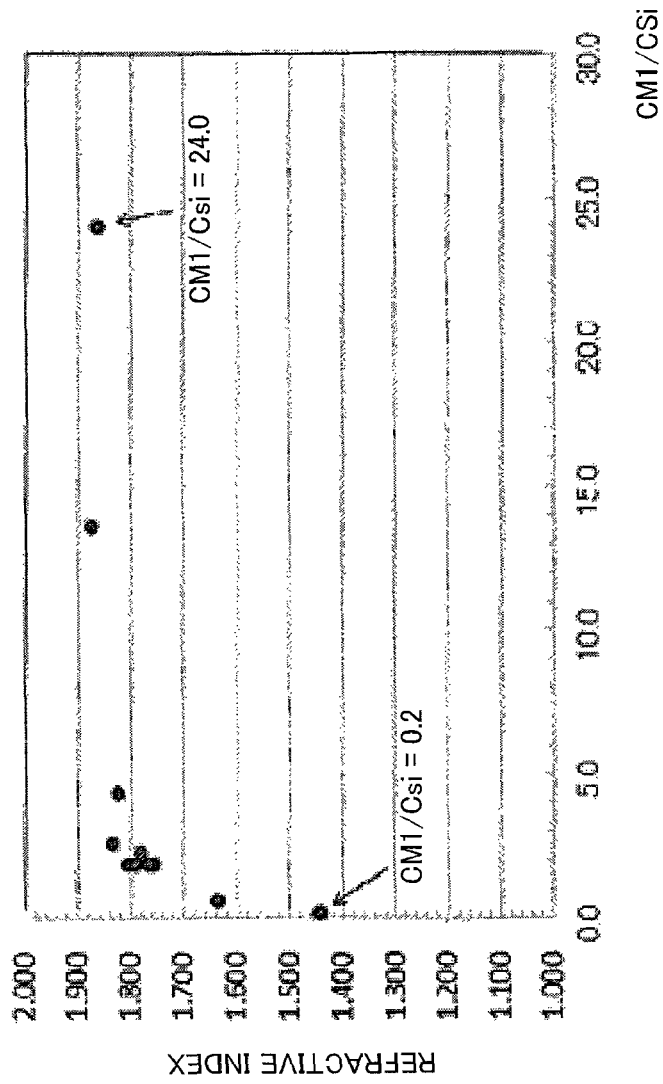
FIG. 8 is a graph illustrating an experiment result in Example 4 according to the present invention.

A refractive index was measured for the composition marked as "○" in overall evaluations of Tests 1-1 to 1-6. A thin film was formed on a quartz substrate by diluting the prepared composition (1) with MEK. Subsequently, the resulting material was disposed at a room temperature for 5 minutes and was then heated at a temperature of 105 to 150° C. A film thickness of the obtained sample was controlled to 1 μm or smaller. A refractive index was measured using spectroscopic ellipsometry. The measurement result is shown in FIG. 8. In the graph of FIG. 8, the abscissa denotes a value of $C_{M1}/C_{Si}$, and the ordinate denotes a refractive index.

From the aforementioned description, it is recognized that a refractive index can be flexibly changed within a range of 1.443 to 1.834 (wavelength of 460 nm) for the $C_{M1}/C_{Si}$ range of 0.2 to 24.

Comparative Example 1

Reagents corresponding to the sample numbers of Table 8 were mixed and applied to each test. In the case of Sample No. 1-22 ($C_{M1}/C_{Si}$=0.03) and Sample No. 1-23 ($C_{M1}/C_{Si}$=0.10), the coated film became clouded in Test 1-1, so that it was difficult to perform a transfer capability test. In addition, a scattering was significantly generated due to the clouding, and it was difficult to measure a refractive index using ellipsometry. Meanwhile, in the case of Sample No. 1-24 ($C_{M1}/C_{Si}$=79.2) and Sample No. 1-25 ($C_{M1}/C_{Si}$=39.4), a lot of defects were detected in the fine unevenness in every transfer capability test, so that it was difficult to perform transfer.

TABLE 8

| Sample No. | SH710 [g] | X21-5841 [g] | SH20020c [g] | KR213 [g] | TTB [g] | DEDFS [g] | TEB [g] | TTiP [g] | TEOS [g] | $C_{M1}/C_{Si}$ | silicone dose [g] |
|---|---|---|---|---|---|---|---|---|---|---|---|
| 1-22 | 4.8 | 4.8 | 0.0 | 0.0 | 4.8 | 23.8 | 0.0 | 0.0 | 71.4 | 0.03 | 9.5 |
| 1-23 | 4.8 | 4.8 | 0.0 | 0.0 | 14.3 | 23.8 | 0.0 | 0.0 | 61.9 | 0.10 | 9.5 |
| 1-24 | 2.5 | 0.0 | 0.0 | 0.0 | 99.0 | 1.0 | 0.0 | 0.0 | 0.0 | 79.2 | 2.5 |
| 1-25 | 2.5 | 0.0 | 0.0 | 0.0 | 98.0 | 2.0 | 0.0 | 0.0 | 0.0 | 39.4 | 2.5 |

Example of Composition (2)

Hereinafter, examples performed for clarifying advantages of the second embodiment will be described. Evaluation was made by performing Tests 2-1 to 2-6 and refractive index measurement as follows. Abbreviations in each table have the following meanings. In the compositional ratios in each table, a total sum of the applied metal alkoxides is expressed as 100 parts by mass. In addition, the photopolymerization initiator was added by 5% with respect to a total amount of metal alkoxides having photopolymerizability and silicone elements having a photopolymerizable group. As an initiator, the same initiator as that used in fabrication of the resin mold was used.

Abbreviations in each table have the following meanings. Description will not be repeated for those described in examples of the composition (1).

3APTMS: 3-acryloxypropyltrimethoxysilane (KBM5103 produced by Shin-Etsu Chemical Co., Ltd.)

Photopolymerizable amount: metal alkoxides having photopolymerizable group/(metal alkoxides+silicone)×100

The same test was applied to three types of resin molds fabricated using Resin Nos. 1 to 3 described in Table 1 as an example of the composition (1) described above.

(Test 2-1) Anti-Moisture Stability

The prepared composition (2) was diluted with isopropyl alcohol (IPA) by 10 times and was cast on a quartz substrate, and appearance of the composition (2) was observed through visual inspection. A test was performed under an atmospheric pressure at a temperature of 23° C. and a humidity of 49%. If the composition (2) is thinned, a surface area per volume increases. In addition, if the composition (2) is diluted with the alcohol solvent, reaction with water vapor is easily generated when the solvent is dried after the casting. When the composition (2) is reacted with water vapor, a film surface of the composition (2) becomes clouded.

Meanwhile, the prepared composition (2) was cast on a quartz substrate without dilution, and appearance of the composition (2) was observed through visual inspection. If the composition (2) is thinned, a surface area per volume increases. When the composition (2) is reacted with water vapor, a wrinkle or undulation is formed on a film surface of the composition (2).

Anti-moisture stability was evaluated through visual inspection by performing the aforementioned test.

x: when clouding is generated as IPA is volatilized after casting.

Δ: when slight clouding is generated as IPA is volatilized after casting, and a wrinkle or undulation is generated by condensation on a film surface of the composition (2) within 3 minutes.

○: when clouding is not generated as IPA is volatilized after casting, and a wrinkle or undulation is generated by condensation on a film surface of the composition (2) within 5 minutes.

◎: when clouding is not generated as IPA is volatilized, and a wrinkle or undulation caused by condensation on a film surface of the composition (2) is not generated for 5 minutes or longer.

(Test 2-2) Photopolymerizability

The prepared composition (2) was put in a vial and was agitated using an agitator. In this state, UV-light was irradiated, and a liquid behavior was observed through visual inspection.

x: when there was no change in a solution, and there was no change in a rotation speed of the agitator.

Δ: when the solution was thickened, and a rotational speed of the agitator was slightly lowered.

○: when the solution was thickened, and a rotational speed of the agitator was significantly lowered.

◎: when the solution was thickened, and the agitator was not rotated.

Although the evaluation was made by classifying the photopolymerizability into 4 grades (x to ◎), a sufficient effect was obtained in the grades equal to or higher than Δ from the viewpoint of improvement of throughput for transferring a fine unevenness, and transfer can be made only through light irradiation in the grade ◎.

(Test 2-3) Separability from Cover Film

The prepared composition (2) was diluted with IPA by 3 times, and a film was formed on a polyethylene (PE) film through a spin coat method. Subsequently, the resulting material was disposed at a room temperature for 5 minutes and was then put on the fine unevenness surface of the resin mold. After the putting on, curing was performed at a temperature of 80° C. for 30 minutes, and then, the temperature returns to a room temperature. Then, the PE film was separated.

x: when separation resistance of the PE film is high, and the PE film is bent in the separation.

Δ: when the thin film of the composition (2) is formed on the fine unevenness surface of the resin mold in spite of a separation-resistant feeling of the PE film.

○: when, in the process of returning to the room temperature, the PE film is partially separated by itself, and the remaining portion has weak adherence so that the film may be touched and taken off, and the thin film of the composition (2) is formed on the fine unevenness surface of the resin mold.

⊚: when, in the process of returning to the room temperature, the PE film is separated by itself, and the thin film of the composition (2) is formed on the fine unevenness surface of the resin mold.

(Test 2-4) Transfer 1

A film of the prepared composition (2) was formed on an ITO membrane on a quartz substrate through a spin coat method. The film was disposed at a room temperature for 3 minutes and was then heated at a temperature of 80° C. for 30 seconds. Subsequently, the obtained resin mold was put on the film surface of the composition (2). Then, the resulting material was pressed under a pressure of 0.05 MPa for 5 minutes, UV-light was irradiated, and then, the resulting material was cured at a room temperature. Finally, the resin mold was separated.

After separating the resin mold, a surface of the quartz substrate side where a film of the composition (2) was formed was observed through visual inspection and AFM.

x: when the composition (2) is attached to the resin mold side and is not transferred onto the quartz substrate, or when solidification of the composition (2) is not sufficient.

Δ: when the composition (2) is partially attached to the resin mold side.

○: when the composition (2) exists on the quartz substrate, the fine unevenness is also transferred, and a fine defect is partially generated.

⊚: when the composition (2) exists on the quartz substrate, and the fine unevenness is also transferred.

(Test 2-5) Transfer 2

A film of the prepared composition (2) was formed on the resin mold using a bar coater. Subsequently, the film of the composition (2) formed on the resin mold was disposed at a room temperature for 5 minutes and was put on a quartz substrate. Then, the resulting material was pressed under a pressure of 0.05 MPa for 5 minutes, UV-light was irradiated, and the resulting material was cured at a room temperature. Finally, the resin mold was separated. Evaluation of the transfer precision was similar to that of Test 2-4 (Transfer 1).

(Test 2-6) Transfer 3

A film of the prepared composition (2) was formed on the resin mold using a bar coater. Subsequently, the film of the composition (1) formed on the resin mold was disposed at a room temperature for 5 minutes. Subsequently, the film of the composition (2) was disposed at a temperature of 80° C. for 5 minutes to remove stickiness. Subsequently, a polyethylene film was put on a surface of the composition (2) having no stickiness opposite to the resin mold and was then stored.

A film of the composition (2) similar to the film of the composition (2) formed on the resin mold was formed on a quartz substrate obtained using an ITO film through a spin coat method and was disposed at a room temperature for 3 minutes. Then, the resulting material was heated at a temperature of 80° C. for 30 seconds. Subsequently, the polyethylene film on the film of the composition (2) formed on the resin mold was separated, and a surface of the film of the composition (2) having no stickiness was put on a surface of the film of the composition (2) formed on the ITO film. Then, the resulting material was pressed under a pressure of 0.05 MPa for 5 minutes, UV-light was irradiated, and the resulting material was cured at a room temperature. Finally, the resin mold was separated. Evaluation of a transfer precision was similar to that of Test 2-4 (Transfer 1).

Example 5

Reagents corresponding to the sample numbers in Table 9 were mixed to prepare the composition (2). Tests 2-1 to 2-6 were performed for the composition (2) described above. The results are shown in Table 10.

TABLE 9

| Sample No. | X22-164A [g] | SH710 [g] | TTB [g] | DEDFS [g] | 3APTMS [g] | Sicone Dose [g] |
|---|---|---|---|---|---|---|
| 2-1 | 0.0 | 0.0 | 71.4 | 23.8 | 4.8 | 0.0 |
| 2-2 | 0.2 | 0.0 | 71.4 | 23.8 | 4.8 | 0.2 |
| 2-3 | 0.2 | 0.2 | 71.4 | 23.8 | 4.8 | 0.5 |
| 2-4 | 0.5 | 0.5 | 71.4 | 23.8 | 4.8 | 1.0 |
| 2-5 | 2.4 | 2.4 | 71.4 | 23.8 | 4.8 | 4.8 |
| 2-6 | 4.8 | 4.8 | 71.4 | 23.8 | 4.8 | 9.5 |
| 2-7 | 11.9 | 11.9 | 71.4 | 23.8 | 4.8 | 23.8 |
| 2-8 | 23.8 | 23.8 | 71.4 | 23.8 | 4.8 | 47.6 |
| 2-9 | 47.6 | 47.6 | 71.4 | 23.8 | 4.8 | 95.2 |

TABLE 10

| Sample No. | Test 2-1 Stability | Test 2-3 PE separability | Test 2-4 Transfer 1 | Test 2-5 Transfer 2 | Test 2-6 Transfer 3 |
|---|---|---|---|---|---|
| 2-1 | X | X | ○ | X | X |
| 2-2 | Δ | X | ○ | X | X |
| 2-3 | ○ | ○ | ○ | Δ | Δ |
| 2-4 | ○ | ⊚ | ○ | ○ | ○ |
| 2-5 | ○ | ⊚ | ○ | ○ | ○ |
| 2-6 | ⊚ | ⊚ | ○ | ○ | ○ |
| 2-7 | ⊚ | ⊚ | ○ | ○ | ○ |
| 2-8 | ⊚ | ⊚ | Δ | Δ | Δ |
| 2-9 | ⊚ | ⊚ | X | X | X |

From the aforementioned description, it is recognized that, when a silicone dose is between 0.24 and 47.6 parts by mass, (2-1) a transfer precision and (2-4) anti-moisture stability are exerted, so that various test items are highly evaluated.

Example 6

For the compositions (2) of Sample No. 2-4 in Example 5, a partial condensation condition was changed as shown in Table 11. The partial condensation was performed by maturing the solution obtained by mixing the reagents under an atmosphere at a temperature of 80° C., and the condensation time was changed. In such a composition (2), Tests 2-1 to 2-6 described above were performed. The results are shown in Table 12. In the evaluation items in Table 12, the following item was added.

○+: improvement was made in comparison with the evaluation item ○ in Tests 2-1 to 2-6, but did not reach the evaluation item ⊚

TABLE 11

| Sample No. | X22-164A [g] | SH710 [g] | TTB [g] | DEDFS [g] | 3APTMS [g] | Silicone Dose [g] | Time [h] |
|---|---|---|---|---|---|---|---|
| 2-4 | 0.5 | 0.5 | 71.4 | 23.8 | 4.8 | 1.0 | 0 |
| 2-10 | 0.5 | 0.5 | 71.4 | 23.8 | 4.8 | 1.0 | 1 |
| 2-11 | 0.5 | 0.5 | 71.4 | 23.8 | 4.8 | 1.0 | 2 |

TABLE 11-continued

| Sample No. | X22-164A [g] | SH710 [g] | TTB [g] | DEDFS [g] | 3APTMS [g] | Silicone Dose [g] | Time [h] |
|---|---|---|---|---|---|---|---|
| 2-12 | 0.5 | 0.5 | 71.4 | 23.8 | 4.8 | 1.0 | 4 |
| 2-13 | 0.5 | 0.5 | 71.4 | 23.8 | 4.8 | 1.0 | 6 |

TABLE 12

| Sample No. | Test 2-1 Stability | Test 2-3 PE separability | Test 2-4 Transfer 1 | Test 2-5 Transfer 2 | Test 2-6 Transfer 3 |
|---|---|---|---|---|---|
| 2-4 | ◯ | ◎ | ◯ | ◯ | ◯ |
| 2-10 | ◯ | ◎ | ◯ | ◯ | ◯ |
| 2-11 | ◯+ | ◎ | ◯+ | ◯+ | ◯+ |
| 2-12 | ◎ | ◎ | ◎ | ◎ | ◎ |
| 2-13 | ◎ | ◎ | ◎ | ◎ | ◎ |

In addition, Time in Table 11 refers to a condensation time.

From the aforementioned description, it is recognized that various test items are more highly evaluated by applying partial condensation at least for 2 hours or longer.

Example 7

Tests 2-1 to 2-6 described above were similarly performed for the compositions (2) corresponding to the sample numbers of Table 13 having compositions different from the compositions (2) of Examples 5 and 6. The results are shown in Table 14.

Example 8

Similar tests were performed for the composition marked as "◯" or higher in overall evaluations of Tests 2-1, 2-3, 2-4, 2-5, and 2-6 and marked as "Δ" or higher in the photopolymerizability evaluation of Test 2-2 and the following compositions. As a result, it was recognized that evaluation results in each test are not bad, and they may be similarly applied.

3APTMS was changed to any one of D2632, G0261, G0210, or V0042.

Any one of D2632, G0261, G0210, or V0042 was equally mixed with 3APTMS.

X22-164A was changed to KR2020.

KR213 was equally mixed with SH710.

TTiP or TEB of 5% was added to the overall metal alkoxides included in the composition (2).

TTiP: titanium tetraisopropoxide (produced by Wako Pure Chemical Industries, Ltd.)

TEB: triethoxyborane (produced by TOKYO CHEMICAL INDUSTRY CO., LTD.)

KR213: silicone alkoxy oligomer (produced by Shin-Etsu Silicone Co., Ltd.)

D2632: diethoxy(3-glycidyloxypropyl)methylsilane (produced by TOKYO CHEMICAL INDUSTRY CO., LTD.)

G0261: 3-glycidyloxypropyl(dimethoxy)methylsilane (produced by TOKYO CHEMICAL INDUSTRY CO., LTD.)

G0210: glycidyloxypropyltrimethoxysilane (produced by TOKYO CHEMICAL INDUSTRY CO., LTD.)

TABLE 13

| Sample No. | X22-164A [g] | SH710 [g] | TTB [g] | DEDFS [g] | 3APTMS [g] | silicone dose [g] | Time [h] | Photopolymerizable Amount [%] |
|---|---|---|---|---|---|---|---|---|
| 2-14 | 0.4 | 0.4 | 66.7 | 22.2 | 2.2 | 0.9 | 0 | 2.4 |
| 2-15 | 0.5 | 0.5 | 71.4 | 23.8 | 4.8 | 1.0 | 0 | 4.7 |
| 2-16 | 0.4 | 0.4 | 60.0 | 20.0 | 20.0 | 0.8 | 0 | 19.8 |
| 2-17 | 0.3 | 0.3 | 50.0 | 16.7 | 33.3 | 0.7 | 0 | 33.1 |
| 2-18 | 0.3 | 0.3 | 42.9 | 14.3 | 42.9 | 0.6 | 0 | 42.6 |
| 2-19 | 0.3 | 0.3 | 37.5 | 12.5 | 50.0 | 0.5 | 0 | 49.8 |
| 2-20 | 0.2 | 0.2 | 33.3 | 11.1 | 55.6 | 0.4 | 0 | 55.3 |

TABLE 14

| Sample No. | Test 2-1 Stability | Test 2-2 photopolymerizability | Test 2-3 PE separability | Test 2-4 Transfer 1 | Test 2-5 Transfer 2 | Test 2-6 Transfer 3 |
|---|---|---|---|---|---|---|
| 2-14 | ◎ | X | ◎ | ◎ | ◎ | ◎ |
| 2-15 | ◎ | X | ◎ | ◎ | ◎ | ◎ |
| 2-16 | ◎ | Δ | ◎ | ◎ | ◎ | ◎ |
| 2-17 | ◎ | ◯ | ◎ | ◎ | ◎ | ◎ |
| 2-18 | ◎ | ◯ | ◎ | ◎ | ◎ | ◎ |
| 2-19 | ◎ | ◎ | ◎ | ◎ | ◎ | ◎ |
| 2-20 | ◎ | ◎ | ◎ | ◎ | ◎ | ◎ |

Time in Table 13 refers to a condensation time.

From the aforementioned description, it is recognized that solidifiability is improved if a metal alkoxide having a photopolymerizable group is contained by 19.8 weight % or more, preferably 33.1 weight % or more, and more preferably 49.8 weight % or more.

V0042: vinyltrimethoxysilane (produced by TOKYO CHEMICAL INDUSTRY CO., LTD.)

KR2020: vinyl group-contained phenyl methyl silicone resin (produced by Shin-Etsu Silicone Co., Ltd.)

SR-7010: vinyl group-contained phenyl methyl silicone resin (produced by Dow Corning Toray Corporation)

Example 9

A refractive index was measured for the composition marked as "○" or higher in overall evaluations of Tests 2-1, 2-3, 2-4, 2-5, and 2-6 and marked as "Δ" or higher in the photopolymerizability evaluation of Test 2-2. Table 15 shows a list of the measured refractive indices. The refractive indices were measured as follows: a thin film was formed on a quartz substrate by diluting the prepared composition (2) with MEK; subsequently, the resulting material was disposed at a room temperature for 5 minutes and was then heated at a temperature described in Table 15 for an hour or longer; a film thickness of the obtained sample was controlled to 1 μm or smaller; and a refractive index was measured using spectroscopic ellipsometery.

TABLE 15

| Sample No. | Time [h] | Heating Temperature [° C.] | $C_{M1}/C_{Si}$ | Refractive Index (460.5 nm) |
|---|---|---|---|---|
| 2-21 | 2 | 150 | 1.95 | 1.620 |
| 2-22 | 2 | 180 | 1.95 | 1.642 |
| 2-23 | 2 | 200 | 1.95 | 1.639 |
| 2-24 | 2 | 250 | 1.95 | 1.593 |
| 2-25 | 2 | 270 | 1.95 | 1.587 |
| 2-26 | 0 | 200 | 1.05 | 1.622 |
| 2-27 | 3 | 200 | 1.95 | 1.646 |
| 2-28 | 4 | 200 | 1.95 | 1.711 |
| 2-29 | 2 | 200 | 1.05 | 1.600 |
| 2-30 | 2 | 200 | 4.56 | 1.650 |
| 2-31 | 2 | 200 | 0.49 | 1.622 |
| 2-32 | 2 | 200 | 1.95 | 1.611 |
| 2-33 | 2 | 200 | 1.95 | 1.595 |
| 2-34 | 2 | 150 | 0.22 | 1.644 |
| 2-35 | 2 | 150 | 0.04 | 1.571 |

Time in Table 15 refers to a condensation time.

From the result, it is recognized that a refractive index can be flexibly changed within a range of 1.571 to 1.711 (wavelength of 460 nm) for the $C_{M1}/C_{Si}$ range of 0.04 to 4.56.

Comparative Example 2

Solutions having $C_{M1}/C_{Si}$ ratios set to 0.01, 0.02, 5.00, and 8.00 were prepared, and the aforementioned transfer test was performed. As a result, for the samples having $C_{M1}/C_{Si}$ ratios set to 0.01 and 0.02, the solution became clouded before putting on the resin mold, so that it was difficult to perform transfer. In addition, even in the refractive index measurement, it was difficult to form a transparent thin film and measure a refractive index. Meanwhile, for the samples having $C_{M1}/C_{Si}$ ratios set to 5.00 and 8.00, the fine unevenness was broken when the resin mold was released.

Example of Composition (3)

Hereinafter, an example performed for clarifying advantages of Embodiment 3 will be described. Evaluation was made by performing Tests 3-1 to 3-4 and refractive index measurement as follows. Abbreviations in each table have the same meanings as those described in the examples of the compositions (1) and (2). In the compositional ratios in each table, a total sum of the applied metal alkoxides is expressed as 100 parts by mass. In addition, although not described in the tables, DTS102 (diphenyl[4-(phenylthio)phenyl]sulfonium hexafluorophosphate (produced by Midori Kogaku Co., Ltd.)) was used as a photoacid generator, and 0.55 parts by mass of the photoacid generator (DTS102) was dissolved and added into 6.67 parts by mass of a solvent of propylene carbonate and 66.7 parts by mass of propylene glycol monomethyl ether with respect to 100 parts by mass of the metal alkoxide.

Similar tests were performed for three types of resin molds (Resin Nos. 1 to 3) described in Table 1 as an example of the aforementioned composition (1).

(Test 3-1) Anti-Moisture Stability

The prepared composition (3) was diluted with isopropyl alcohol (IPA) by 10 times and was cast on a quartz substrate, and appearance of the composition (3) was observed through visual inspection. A test was performed under an atmospheric pressure at a temperature of 23° C. and a humidity of 49%. If the composition (3) is thinned, a surface area per volume increases. In addition, if the composition (3) is diluted with the alcohol solvent, reaction with water vapor is easily generated when the solvent is dried after the casting. When the composition (3) is reacted with water vapor, a film surface of the composition (3) becomes clouded.

Meanwhile, the prepared composition (3) was cast on a quartz substrate without dilution, and appearance of the composition (3) was observed through visual inspection. If the composition (3) is thinned, a surface area per volume increases. When the composition (3) is reacted with water vapor, a wrinkle or undulation is formed on a film surface of the composition (3).

Anti-moisture stability was evaluated through visual inspection by performing the aforementioned test.

x: when clouding is generated as IPA is volatilized after casting.

Δ: when slight clouding is generated as IPA is volatilized after casting, and a wrinkle or undulation is generated by condensation on a film surface of the composition (3) within 3 minutes.

○: when clouding is not generated as IPA is volatilized after casting, and a wrinkle or undulation is generated by condensation on a film surface of the composition (3) within 5 minutes.

◎: when clouding is not generated as IPA is volatilized, and a wrinkle or undulation caused by condensation on a film surface of the composition (3) is not generated for 5 minutes or longer.

(Test 3-2) Transfer 1

A film of the prepared composition (3) was formed on an ITO membrane on a quartz substrate through a spin coat method. The film was disposed at a room temperature for 3 minutes and was then heated at a temperature of 80° C. for 30 seconds. Subsequently, the resulting resin mold was put on the film surface of the composition (3). Then, the resulting material was pressed under a pressure of 0.05 MPa for 5 minutes, UV-light was irradiated, and then, the resulting material was cured at a room temperature. Finally, the resin mold was separated.

After separating the resin mold, a surface of the quartz substrate side where a film of the composition (3) was formed was observed through visual inspection and AFM.

x: when the composition (3) is attached to the resin mold side and is not transferred onto the quartz substrate, or when solidification of the composition (3) is not sufficient.

Δ: when the composition (3) is partially attached to the resin mold side.

○: when the composition (3) exists on the quartz substrate, the fine unevenness is also transferred, and a fine defect is partially generated.

◎: when the composition (3) exists on the quartz substrate, and the fine unevenness is also transferred.

(Test 3-3) Transfer 2

A film of the prepared composition (3) was formed on the resin mold using a bar coater. Subsequently, the film of the composition (3) formed on the resin mold was disposed at a room temperature for 5 minutes and was put on a quartz substrate. Then, the resulting material was pressed under a pressure of 0.05 MPa for 5 minutes, UV-light was irradiated, and then, the resulting material was cured at a room temperature. Finally, the resin mold was separated. Evaluation of the transfer precision was similar to that of Test 4 (Transfer 1).

(Test 3-4) Transfer 3

A film of the prepared composition (3) was formed on the resin mold using a bar coater. Subsequently, the film of the composition (3) formed on the resin mold was disposed at a room temperature for 5 minutes. Subsequently, the film of the composition (3) was disposed at a temperature of 80° C. for 5 minutes to remove stickiness. Subsequently, a polyethylene film was put on a surface of the composition (3) having no stickiness opposite to the resin mold and was then stored.

A film of the composition (3) similar to the film of the composition (3) formed on the resin mold was formed on a quartz substrate obtained using an ITO film through a spin coat method and was disposed at a room temperature for 3 minutes. Then, the resulting material was heated at a temperature of 80° C. for 30 seconds. Subsequently, the polyethylene film on the film of the composition (3) formed on the resin mold was separated, and a surface of the film of the composition (3) having no stickiness was put on a surface of the film of the composition (3) formed on the ITO film. Then, the resulting material was pressed under a pressure of 0.05 MPa for 5 minutes, UV-light was irradiated, and then, the resulting material was cured at a room temperature. Finally, the resin mold was separated. Evaluation of a transfer precision was similar to that of Test 4 (Transfer 1).

Example 10

Reagents corresponding to the sample numbers in Table 16 were mixed to prepare the composition (3). Tests 3-1 to 3-4 were performed for the composition (3) described above. The results are shown in Table 17.

TABLE 16

| Sample No. | SH710 [g] | X21-5841 [g] | TTB [g] | DEDFS [g] | TEOS [g] | Silicon Dose [g] | $C_{M1}/C_{Si}$ |
|---|---|---|---|---|---|---|---|
| 3-1 | 0.0 | 0.0 | 71.4 | 23.8 | 4.8 | 0.0 | 1.90 |
| 3-2 | 0.2 | 0.0 | 71.4 | 23.8 | 4.8 | 0.2 | 1.90 |
| 3-3 | 0.2 | 0.2 | 71.4 | 23.8 | 4.8 | 0.5 | 1.90 |
| 3-4 | 0.5 | 0.5 | 71.4 | 23.8 | 4.8 | 1.0 | 1.90 |
| 3-5 | 4.8 | 4.8 | 71.4 | 23.8 | 4.8 | 9.5 | 1.90 |
| 3-6 | 11.9 | 11.9 | 71.4 | 23.8 | 4.8 | 23.8 | 1.90 |
| 3-7 | 23.8 | 23.8 | 71.4 | 23.8 | 4.8 | 47.6 | 1.90 |
| 3-8 | 47.6 | 47.6 | 71.4 | 23.8 | 4.8 | 95.2 | 1.90 |

TABLE 17

| Sample No. | Test 3-1 Stability | Test 3-2 Transfer 1 | Test 3-3 Transfer 2 | Test 3-4 Transfer 3 |
|---|---|---|---|---|
| 3-1 | X | ◯ | ◯ | ◯ |
| 3-2 | Δ | ◯ | ◯ | ◯ |
| 3-3 | ◯ | ◯ | ◯ | ◯ |
| 3-4 | ◯ | ◯ | ◯ | ◯ |
| 3-5 | ◎ | ◯ | ◯ | ◯ |
| 3-6 | ◎ | ◯ | ◯ | ◯ |
| 3-7 | ◎ | Δ | Δ | Δ |
| 3-8 | ◎ | X | X | X |

From the aforementioned description, it is recognized that, when a silicone dose is between 0.2 and 47.6 parts by mass, (3-1) a transfer precision and (3-4) anti-moisture stability are exerted, so that various test items are highly evaluated.

Example 11

For the composition (3) of Sample No. 3-2 in Example 10, a chelating agent is added as shown in Table 18. After adding the chelating agent, agitation was performed for 30 minutes or longer. The result is shown in Table 19.

TABLE 18

| Sample No. | SH710 [g] | X21-5841 [g] | TTB [g] | DEDFS [g] | TEOS [g] | BzAc |
|---|---|---|---|---|---|---|
| 3-2 | 0.2 | 0.0 | 71.4 | 23.8 | 4.8 | 0.0 |
| 3-9 | 0.2 | 0.0 | 71.4 | 23.8 | 4.8 | 13.6 |
| 3-10 | 0.2 | 0.0 | 71.4 | 23.8 | 4.8 | 40.9 |
| 3-11 | 0.2 | 0.0 | 71.4 | 23.8 | 4.8 | 54.5 |
| 3-12 | 0.2 | 0.0 | 71.4 | 23.8 | 4.8 | 68.1 |

TABLE 19

| Sample No. | Test 3-1 Stability | Test 3-2 Transfer 1 | Test 3-3 Transfer 2 | Test 3-4 Transfer 3 |
|---|---|---|---|---|
| 3-2 | Δ | ◯ | ◯ | ◯ |
| 3-9 | Δ | ◯ | ◯ | ◯ |
| 3-10 | ◯ | ◯ | ◯ | ◯ |
| 3-11 | ◎ | ◯ | ◯ | ◯ |
| 3-12 | ◎ | ◯ | ◯ | ◯ |

From the aforementioned description, it is recognized that anti-moisture stability is improved by adding the chelating agent of 40.9 g or more, and preferably 54.5 g or more. In the solution No. 9, 0.1 mol of a chelating agent (BzAc) was added with respect to 1 mol of a functional group of titanium alkoxide (TTB). In Sample No. 3-10, 0.3 mol of a chelating agent was added.

Example 12

Partial condensation was performed for the composition (3) of Sample No. 3-4 in Example 10 as shown in Table 20. The partial condensation was performed by maturing under an atmosphere at a temperature of 80° C. The result is shown in Table 21. In the evaluation items, the following item was added.

◯+: improvement was made in comparison with the evaluation item ◯ in Tests 3-1 to 3-4, but did not reach the evaluation item ◎

TABLE 20

| Sample No. | SH710 [g] | X21-5841 [g] | TTB [g] | DEDFS [g] | TEOSg [g] | Time [g] | $C_{M1}/C_{Si}$ |
|---|---|---|---|---|---|---|---|
| 3-4 | 0.5 | 0.5 | 71.4 | 23.8 | 4.8 | 0 | 1.90 |
| 3-9 | 0.5 | 0.5 | 71.4 | 23.8 | 4.8 | 1 | 1.90 |
| 3-10 | 0.5 | 0.5 | 71.4 | 23.8 | 4.8 | 2 | 1.90 |
| 3-11 | 0.5 | 0.5 | 71.4 | 23.8 | 4.8 | 4 | 1.90 |
| 3-12 | 0.5 | 0.5 | 71.4 | 23.8 | 4.8 | 6 | 1.90 |

TABLE 21

| Sample No. | Test 3-1 Stability | Test 3-2 Transfer 1 | Test 3-3 Transfer 2 | Test 3-4 Transfer 3 |
|---|---|---|---|---|
| 3-4 | ○ | ○ | ○ | ○ |
| 3-9 | ○ | ○ | ○ | ○ |
| 3-10 | ○+ | ○+ | ○+ | ○+ |
| 3-11 | ◎ | ◎ | ◎ | ◎ |
| 3-12 | ◎ | ◎ | ◎ | ◎ |

Time in Table 20 refers to a condensation time.

From the aforementioned description, it is recognized that various test items are more highly evaluated by applying partial condensation for at least 2 hours or longer.

Example 13

Tests 3-1 to 3-4 described above were similarly performed for the compositions (3) corresponding to the sample numbers of Table 22 having compositions different from the compositions (3) of Examples 10 and 11. The results of tests are shown in Table 23.

TABLE 22

| Sample No. | SH710 [g] | X21-5841 [g] | SH20020c [g] | KR213 [g] | TTB [g] | DEDFS [g] | TEB [g] | TTiP [g] | TEOS [g] | Silicon Dose [g] | BzAc [g] |
|---|---|---|---|---|---|---|---|---|---|---|---|
| 3-13 | 4.8 | 4.8 | 0.0 | 0.0 | 71.4 | 23.8 | 0.0 | 0.0 | 4.8 | 9.5 | 68.1 |
| 3-14 | 4.5 | 4.5 | 0.0 | 0.0 | 68.2 | 22.7 | 0.0 | 4.5 | 4.5 | 9.1 | 66.9 |
| 3-15 | 0.0 | 4.8 | 4.8 | 0.0 | 71.4 | 23.8 | 0.0 | 0.0 | 4.8 | 9.5 | 68.1 |
| 3-16 | 4.8 | 0.0 | 0.0 | 4.8 | 71.4 | 23.8 | 0.0 | 0.0 | 4.8 | 9.5 | 68.1 |
| 3-17 | 4.8 | 10.5 | 0.0 | 4.8 | 71.4 | 23.8 | 0.0 | 0.0 | 4.8 | 20.0 | 68.1 |
| 3-18 | 4.8 | 0.0 | 4.8 | 0.0 | 71.4 | 23.8 | 0.0 | 0.0 | 4.8 | 9.5 | 68.1 |
| 3-19 | 4.8 | 2.4 | 2.4 | 0.0 | 71.4 | 23.8 | 0.0 | 0.0 | 4.8 | 9.5 | 68.1 |
| 3-20 | 4.5 | 4.5 | 0.0 | 0.0 | 67.9 | 22.6 | 0.0 | 5.0 | 4.5 | 9.0 | 66.7 |
| 3-21 | 4.8 | 4.8 | 0.0 | 0.0 | 71.4 | 23.8 | 5.0 | 0.0 | 4.8 | 9.5 | 63.6 |

TABLE 23

| Sample No. | Test 3-1 Stability | Test 3-2 Transfer 1 | Test 3-3 Transfer 2 | Test 3-4 Transfer 3 |
|---|---|---|---|---|
| 3-13 | ◎ | ◎ | ◎ | ◎ |
| 3-14 | ◎ | ◎ | ◎ | ◎ |
| 3-15 | ◎ | ◎ | ◎ | ◎ |
| 3-16 | ◎ | ◎ | ◎ | ◎ |
| 3-17 | ◎ | ◎ | ◎ | ◎ |
| 3-18 | ◎ | ◎ | ◎ | ◎ |
| 3-19 | ◎ | ◎ | ◎ | ◎ |
| 3-20 | ◎ | ◎ | ◎ | ◎ |
| 3-21 | ◎ | ◎ | ◎ | ◎ |

From the aforementioned description, it is recognized that the items are highly evaluated also in other compositions.

Although not shown in the tables, the same test was performed for the following compositions, and the same result was obtained.

Example 14

Figure 9:
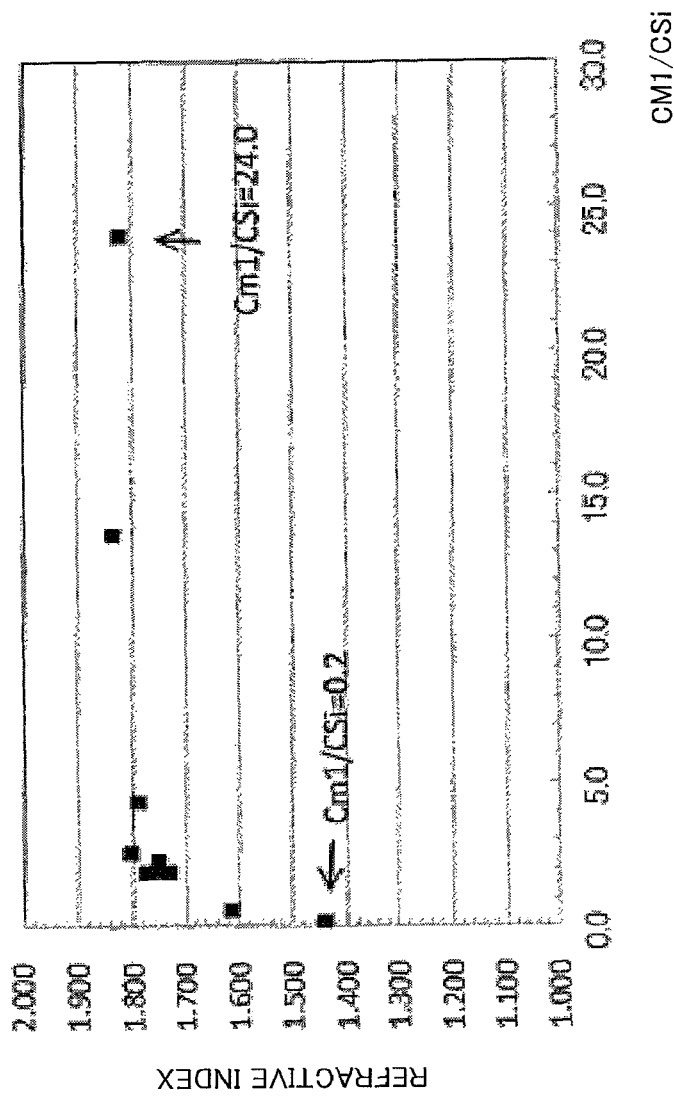
FIG. 9 is a graph illustrating an experiment result in Example 14 according to the present invention.

A refractive index was measured for the composition marked as "○" or higher in overall evaluations of Tests 3-1 to 3-4. The refractive indices were measured as follows: a thin film was formed on quartz by diluting the prepared composition (3) with MEK; subsequently, the resulting material was disposed at a room temperature for 5 minutes and was then heated at a temperature of 150 to 250° C. for an hour or longer; a film thickness of the obtained sample was controlled to 1 μm or smaller; and a refractive index was measured using spectroscopic ellipsometery. The measurement result is shown in Table 9. In the graph of FIG. 9, the abscissa denotes a value of $C_{M1}/C_{Si}$, and the ordinate denotes a refractive index.

From the aforementioned description, it is recognized that a refractive index can be flexibly changed within a range of 1.439 to 1.833 (wavelength of 550 nm) for the $C_{M1}/C_{Si}$ range of 0.2 to 24.0.

Comparative Example 3

Solutions having $C_{M1}/C_{Si}$ ratios set to 0.03, 0.10, 0.30, and 50 were prepared, and the aforementioned transfer test was performed. As a result, for the samples having $C_{M1}/C_{Si}$ ratios set to 0.03 and 0.10, the coated film became clouded, so that it was difficult to perform a transfer capability test. In addition, a scattering caused by the clouding was significant, and it was difficult to measure a refractive index using ellipsometry. Meanwhile, for the samples having $C_{M1}/C_{Si}$ ratios set to 0.30, and 50, a lot of defects were found in the fine unevenness in each transfer test, and it was difficult to perform transfer.

Example of Composition (4)

Example 15

Tests 1-1 to 1-6 of Example 1 were performed for the compositions described below. Silicone having a phenyl group in a side chain, titanium tetrabuthoxid (TTB), and tetraethoxysilane (TEOS) were mixed based on the ratios of Table 24. Subsequently, 2.2 ml of ethanol obtained by dissolving water at a concentration of 3 weight % was slowly distilled. In this case, agitation was strongly performed. Subsequently, agitation was performed under a pressure of 800 hPa at a temperature of 60° C. for 6 hours. Finally, the composition (4) was obtained by performing agitation under a pressure of 30 hPa for 2 hours.

The viscosity of the obtained solution was measured at a temperature of 25° C. The result is shown in Table 24.

TABLE 24

| Sample No. | Silicone | TTB | TEOS | $C_{PM1}/C_{PSi}$ | —Si—O—Ti— | Viscosity (cP) |
|---|---|---|---|---|---|---|
| 4-1 | 0.5 | 93.8 | 6.2 | 7.7 | ○ | 351 |
| 4-2 | 0.5 | 80.0 | 20.0 | 2.3 | ○ | 332 |
| 4-3 | 0.5 | 75.0 | 25.0 | 1.7 | ○ | 305 |
| 4-4 | 0.5 | 65.3 | 34.8 | 1.1 | ○ | 280 |
| 4-5 | 0.5 | 60.0 | 40.0 | 0.9 | ○ | 275 |
| 4-6 | 0.5 | 50.0 | 50.0 | 0.6 | ○ | 240 |
| 4-7 | 0.5 | 33.3 | 66.7 | 0.3 | ○ | 208 |
| 4-8 | 0.5 | 10.0 | 90.0 | 0.1 | ○ | 124 |

In addition, the obtained composition (4) is diluted with a propylene glycol monomethyl ether solvent at 3 weight %, and a small-angle X-ray scattering measurement was performed to obtain a radius of inertia. As a result, the radius of inertia was 1 nm or shorter in any sample. In addition, X-rays having a wavelength of 0.154 nm were used to perform the small-angle X-ray scattering measurement. For the obtained measurement result, a radius of inertia was obtained by applying a Gunier plot.

The obtained solution was diluted with propylene glycol monomethyl ether, and a thin film having a thickness of 1000 nm was formed on a polycarbonate substrate using a spin coat method. For the obtained thin films, a ratio $C_{PM1}/C_{PSi}$ between a concentration $C_{PSi}$ of silicon Si and a concentration $C_{PM1}$ of titanium (Ti) was obtained using an XPS method. The resulting ratios are shown in Table 24.

In addition, whether or not a metalloxane bond (—Si—O—Ti—), (—Ti—O—Ti—), and (—Si—O—Si—) is formed was determined using a solid-state nuclear magnetic resonance method (solid-state NMR) and Raman spectroscopy. If it was determined that a metalloxane bond is formed, a mark "0" was written in Table 24.

Tests 1-1 to 1-6 of Example 1 were performed using the compositions (4-1 to 4-8) described in Table 24. As a result, it was possible to obtain excellent results in overall Tests 1-1 to 1-6.

Meanwhile, for the compositions described in Table 24, a sample for which condensation is not performed was also fabricated. In the resulting sample, a metalloxane bond was not formed. Compared to a case where condensation is not performed, it was recognized that all of the results of Tests 1-1 to 1-6 were highly evaluated in a case where condensation is performed, that is, in a case where a metalloxane bond is formed. It is conceived that this is because the metalloxane bond is included, so that anti-moisture stability is improved as reactivity of the composition (4) is lowered, and a transfer precision is improved as the reactivity is lowered, and the like. Furthermore, similar to Example 1, a refractive index was measured using the compositions described in Table 24. As a result, it was possible to change a refractive index for a wavelength of 460 nm within a range of 1.612 to 1.834.

Example of Composition (5)

Example 16

Tests 2-1 to 2-6 of Example 2 were performed for the compositions described below. Silicone having a phenyl group in a side chain, titanium tetrabuthoxid (TTB), and 3-acryloxylpropyl trimethoxysilane (3-APTMS) were mixed based on the ratios of Table 25. Subsequently, 5.2 ml of ethanol obtained by dissolving water at a concentration of 3 weight % was slowly distilled. In this case, agitation was strongly performed. Subsequently, agitation was performed under a pressure of 800 hPa at a temperature of 60° C. for 6 hours. Then, agitation was performed under a pressure of 200 hPa at a temperature of 60° C. for 2 hours. Finally, agitation was performed under a pressure of 30 hPa for 2 hours.

A test is performed using the obtained composition. In this case, when light (UV) is irradiated, a photopolymerization initiator (Irgacure. 184) was added to the obtained composition based on the ratios described in Table 25.

The viscosity of the obtained solution was measured at a temperature of 25° C. The result is shown in Table 25.

TABLE 25

| Sample No. | Silicone | TTB | 3APMTS | Irgacure184 | $C_{PM1}/C_{PSi}$ | —Si—O—Ti— | Viscosity (cP) |
|---|---|---|---|---|---|---|---|
| 5-1 | 0.5 | 85.0 | 15.0 | 0.8 | 3.6 | ○ | 360 |
| 5-2 | 0.5 | 83.0 | 17.0 | 0.9 | 3.1 | ○ | 356 |
| 5-3 | 0.5 | 75.0 | 25.0 | 1.4 | 2.0 | ○ | 342 |
| 5-4 | 0.5 | 65.3 | 34.8 | 1.9 | 1.2 | ○ | 330 |
| 5-5 | 0.5 | 60.0 | 40.0 | 2.2 | 1.0 | ○ | 312 |
| 5-6 | 0.5 | 56.0 | 44.0 | 2.4 | 0.8 | ○ | 298 |
| 5-7 | 0.5 | 50.0 | 50.0 | 2.8 | 0.7 | ○ | 184 |
| 5-8 | 0.5 | 33.4 | 66.6 | 3.7 | 0.3 | ○ | 165 |

The obtained composition (5) is diluted with a propylene glycol monomethyl ether solvent at 3 weight %, and a small-angle X-ray scattering measurement was performed to obtain a radius of inertia. As a result, the radius of inertia was 1 nm or shorter in any sample. In addition, X-rays having a wavelength of 0.154 nm were used to perform the small-angle X-ray scattering measurement. For the obtained measurement result, a radius of inertia was obtained by applying a Gunier plot.

The obtained solution was diluted with propylene glycol monomethyl ether, and a thin film having a thickness of 1000 nm was formed on a polycarbonate substrate using a spin coat method. For the obtained thin films, a ratio $C_{PM1}/C_{PSi}$ between a concentration of silicon (Si) and a concentration $C_{PM1}$ of titanium (Ti) was obtained using an XPS method. The resulting ratios are shown in Table 25.

In addition, whether or not a metalloxane bond (Si—O—Ti) is formed was determined using a solid-state nuclear magnetic resonance method (solid-state NMR) and Raman spectroscopy. If it was determined that a metalloxane bond is formed, a mark "○" was written in Table 25.

Tests 2-1 to 2-6 of Example 2 were performed using the compositions (Sample Nos. 5-1 to 5-8) described in Table 25. As a result, it was possible to obtain excellent results in overall Tests 2-1 to 2-6. Meanwhile, for the compositions described in Table 25, a sample for which condensation is not performed was also prepared. In the obtained sample, a metalloxane bond was not formed. Compared to a case where condensation is not performed, it was recognized that all of the results of Tests 2-1 to 2-6 were highly evaluated in a case where condensation is performed, that is, in a case where a metalloxane bond is formed. It is conceived that this is because the metalloxane bond is included, so that anti-moisture stability is improved as reactivity of the composition (5) is lowered, and a transfer precision is improved as the reactivity is lowered, and the like. Furthermore, similar to Example 1, a refractive index was measured using the compositions described in Table 25. As a result, it was possible to change a refractive index for a wavelength of 460 nm within a range of 1.641 to 1.788.

Example 17

Subsequently, a sapphire substrate was fabricated using the composition (1) described in Sample No. 1-2 of Table 2, the composition (2) described in Sample No. 2-2 of Table 9, the composition (3) described in Sample No. 3-2 of Table 16, the composition (4) described in Sample No. 4-4 of Table 24, and the composition (5) described in Sample No. 5-4 of Table 25. Hereinafter, the composition in this case will be referred to as a "sample composition" regardless of the composition (1) described in Sample No. 1-2 of Table 2, the composition (2) described in Sample No. 2-2 of Table 9, the composition (3) described in Sample No. 3-2 of Table 16, the composition (4) described in Sample No. 4-4 of Table 24, or the composition (5) described in Sample No. 5-4 of Table 25.

(a) Cylindrical Master Mold Fabrication (for Fabricating a Master Mold for Fabricating a Resin Mold)

By using quartz glass as a base material of the cylindrical master mold, an unevenness was formed on a surface of the quartz glass through direct-write lithography using a semiconductor laser. First, a resist layer was formed on a surface of the quartz glass through a sputtering method. The sputtering method was performed at electric power of RF100W by using CuO (containing silicon (Si) of 8 atm %) having a diameter of 3 inches as a target (resist layer) to form a resist layer of 20 nm. Subsequently, exposure was performed using a semiconductor laser having a wavelength of 405 nm while the cylindrical master mold is rotated. Then, the resist layer subjected to the exposure was developed. The development of the resist layer was performed using a glycine water solution of 0.03 wt % for 240 sec. Then, dry etching was performed for an etching layer (quartz glass) by using the developed resist layer as a mask. The dry etching was performed by using SF6 as an etching gas under a gas pressure of 1 Pa at electric power of 300 W for 5 minutes. Then, only the residue of the resist layer was peeled off from the cylindrical master mold having a fine structure on its surface using hydrochloric acid (pH 1). The peeling-off time was set to 6 minutes.

DURASURF HD-1101Z (produced by DAIKIN INDUSTRIES, ltd) was coated on a surface unevenness of the obtained cylindrical master mold, and the resulting material was heated at a temperature of 60° C. for one hour and was then disposed at a room temperature for 24 hours to fix the coating. Then, the resulting material was rinsed three times using DURASURF HD-ZV (produced by DAIKIN INDUSTRIES, ltd), and a releasing treatment was performed.

A shape or an arrangement of the unevenness provided on a surface of the cylindrical master mold was controlled using a semiconductor laser output power, an operation pattern, or an operation speed.

Subsequently, an unevenness made of resin was formed on a film by transferring the unevenness from the cylindrical master mold using a continuous UV transfer method.

(b) Fabrication of Reel-Like Resin Mold A

The following material 1 was used as a transfer material.

The material 1 was obtained by mixing materials with a mixing ratio (DACHP:M350:I.184:I.369=17.5 g:100 g:5.5 g:2.0 g).

The material 1 was coated on an easy adhesion surface of a PET film (A4100, produced by TOYOBO CO., LTD.) having a width of 300 mm and a thickness of 100 μm using a Micro Gravure coating (produced by Yasui Seiki Co., Ltd.) until the coated film thickness reaches 6 μm. Then, the PET film having the coated material 1 was pressedly bonded to the cylindrical master mold using a nip roll (0.1 MPa). Ultraviolet rays were irradiated using a UV light exposure apparatus (H-bulb) produced by Fusion UV Systems Japan K. K such that an integral exposure light amount under a lamp center becomes 1200 mJ/cm$^2$ under an atmospheric pressure at a temperature of 25° C. and a humidity of 60% to continuously perform photosolidification, so that a reel-like resin mold (A) (a length of 200 m and a width of 300 mm) having the transferred unevenness on the surface was obtained.

Then, a resin mold B was fabricated through a continuous UV transfer method by using the reel-like resin mold A as a template.

(c) Fabrication of Resin Mold B

Transfer was performed for the material 1 in the process of fabricating the resin mold B.

The material 1 was coated on an easy adhesion surface of a PET film (A4100, produced by TOYOBO CO., LTD.) having a width of 300 mm and a thickness of 100 μm using a Micro Gravure coating (produced by Yasui Seiki Co., Ltd.) until the coated film thickness reaches 6 μm. Then, the PET film having the coated material 1 was pressedly bonded to a surface of the unevenness of the resin mold A using a nip roll (0.1 MPa). Ultraviolet rays were irradiated using a UV light exposure apparatus (H-bulb) produced by Fusion UV Systems Japan K. K such that an integral exposure light amount under a lamp center becomes 1000 mJ/cm$^2$ under an atmospheric pressure at a temperature of 25° C. and a humidity of 60% to continuously perform photosolidification, so that a plurality of reel-like resin mold B (having a length of 200 m and a width of 300 mm) having the transferred unevenness similar to that of the cylindrical master mold on the surface were obtained.

The obtained resin mold B was observed using a scanning electron microscope. As a result, a plurality of independent concave portions are arranged, in which a pitch in a y-axis direction was 200 nm, a pitch in an x-axis direction was 173 nm, a diameter of an opening was 180 nm, a depth was 200 nm, and a ratio Es/Eb was 48.

(d) Filling of Sample Composition

Next, fine pores (concave portions) of the resin mold B were filled with the sample composition.

The sample composition was diluted with a propylene glycol monomethyl ether solvent at 1.5 weight % and was used as a material for coating the sample composition on the resin mold B. In addition, the coating was set such that a volume of the solid content of the sample composition in a unit plane area is smaller than a volume of the fine pores (concave portions) in a unit plane area.

(e) Formation of Organic Layer

An organic layer was formed on a surface of the sample composition filled in the resin mold B.

The following material was used as a material of the organic layer.

A mixture was prepared with a mixing ratio (benzyl-based binder resin:M211b:PO-A:M350:I.184:1.369=150 g:40 g:40 g:20 g:11 g:4 g). As the benzyl-based binder resin, a methyl ethyl ketone solution, which is a copolymer, containing 80 mass % of benzyl methacrylate and 20 mass % of methacrylic acid (solid content=50%, weight-average molecular weight=56000, acid equivalent=430, dispersion degree=2.7) was used. The masses described above are masses of solid contents.

A material of the organic layer was diluted with a propylene glycol monomethyl ether solvent and was used as a material for coating the organic layer on the resin mold B filled with the sample composition.

The diluted sample composition was coated on the unevenness surface of the resin mold B using a Micro Gravure coating (produced by Yasui Seiki Co., Ltd.). Then, the resulting material was disposed under an atmospheric pressure at a temperature of 25° C. and a humidity of 60% for 5 minutes, and was then disposed under an atmospheric pressure at a temperature of 80° C. and a humidity of 60% for 5 minutes to remove the solvent. Subsequently, the diluted organic layer material was coated on the unevenness surface of the resin mold filled with the sample composition using a Micro Gravure coating (produced by Yasui Seiki Co., Ltd.). Then, the resulting material was disposed under an atmospheric pressure at a temperature of 25° C. and a humidity of 60% for 10 minutes to remove the solvent. The obtained reel (sheet) where the sample composition was filled and the organic layer was formed is referred to as a "sample sheet." After removing the solvent, a PE-based protection layer that can absorb visible light was put on the sample sheet, and the sample sheet was windingly recovered. At the time of analysis or application of the sample sheet described below, operation was made by winding out the sample sheet and separating the protection layer.

The obtained sample sheet was observed using a scanning electron microscope. As a result, it was observed that the sample composition was filled in a plurality of independent concave portions of the resin mold B. The filling rate was 65% as a depth filling rate. Furthermore, it was observed that the organic layer was formed on an unevenness of the resin mold B filled with the sample composition. A thickness of the formed organic layer was 450 nm as a distance from an interface between the sample composition and the organic layer to a surface where the organic layer is exposed.

(f) Fabrication of Sapphire Substrate

A sapphire substrate was fabricated using a sample sheet. As the sapphire substrate, a double-sided c-plane sapphire substrate having a diameter of 2 inches was used.

A UV-O3 treatment was applied to the sapphire substrate for 10 minutes to perform cleaning and remove particles. Subsequently, a surface of the organic layer of the sample sheet was directly thermocompressively bonded to the sapphire substrate. The thermocompressive bonding was made under a pressure of 0.01 MPa at a temperature of 80° C. Then, UV-light was irradiated across the resin mold with an integral light amount of 1200 mJ/cm$^2$. Subsequently, the resulting material was disposed on a hot plate heated to 120° C. for 30 seconds. Then, the resin mold was separated while a temperature of the sapphire substrate was equal to or lower than 30° C. The obtained sapphire was observed using a scanning electron microscope. As a result, a layered product including the sample composition, the organic layer, and the sapphire was formed, and the sample composition was arranged on top of the convex portion of the organic layer.

In addition, a shape of the transferred sample composition was equal to a shape of the sample sheet. Therefore, it was recognized that the sample composition was transferred with a high transfer precision.

For the obtained layered product including the sample composition, the organic layer, and the sapphire, oxygen ashing was performed from the sample composition surface side. Through the oxygen ashing, the organic layer was anisotropically etched by using the sample composition as a mask. The oxygen ashing was performed until the sapphire surface is exposed. The oxygen ashing was interrupted in the middle, and a titanium (Ti) mapping analysis was performed for the fabricated layered product ((sample composition/organic layer)/sapphire) using a transmission electron microscope and energy-dispersive X-ray spectroscopy. As a result, it was observed that titanium (Ti) was attached to the side face of the fabricated organic layer. A thickness of titanium (Ti) was approximately 5 nm or smaller.

Subsequently, the sapphire substrate was etched. Plasma etching was performed under a processing pressure of 0.1 to 6.5 Pa using only a BCl$_3$ gas or a gas mixture (having a ratio of the gas flow rate set to BCl$_3$:Cl$_2$:Ar=90 ccm:10 to 85 sccm:15 sccm) and an inductively coupled plasma RIE apparatus.

After the dry etching, the sapphire substrate was rinsed using a piranha solution.

The obtained fine-fabricated sapphire was observed using a scanning electron microscope. As a result, it was identified that a plurality of convex portions are formed on the sapphire substrate along an interval (pitch) of the fine unevenness of the sample sheet. A bottom diameter of the convex portion was approximately 100 nm, and a height thereof was 130 nm. In addition, a side face of the convex portion was upwardly curved, and there was no flat portion (table top) on top of the convex portion. This is obtained from a combination of advantages of the compositions (1) to (5), including a transfer precision, a leveling, anti-moisture stability, etching resistance to an organic material (such as environmental resistance or refractive index variability), and the like.

A plurality of convex portions were formed on the sapphire surface even when any one of the compositions (1) to (5) is used. However, a warping shape of the side face of the convex portion formed on the sapphire surface was different depending on the compositions (1) to (5). In particular, when the compositions (4) and (5) are used, there was substantially no warp in the side face of the convex portion of the sapphire surface. It is conceived that this is because the compositions (4) and (5) contain a metalloxane bond in a solution state, so that a density in the solution state is high. That is, when the organic layer is fabricated by using the composition as a mask, etching resistance to oxygen is higher. Meanwhile, since the metal alkoxide having a metal species Ti and the metal alkoxide having a metal species Si are bound sufficiently strongly, it is possible to suppress roughness from being formed in the side face of the organic layer when the metal alkoxide having a metal species Si is first exposed to oxygen.

While embodiments of the present invention have been described, the present invention may be variously changed or modified without limiting to the embodiments described above. In the aforementioned embodiments, the sizes or shapes of elements illustrated in the accompanying drawings may be appropriately changed or modified without limitation. Other changes, alterations, or modifications can be appropriately made without departing from the scope or spirit of the present invention.

INDUSTRIAL APPLICABILITY

As described above, it is possible to fabricate a fine unevenness made of an inorganic material capable of controlling a high refractive index through a suitable transfer process. For example, the invention may be advantageously applied to manufacturing of an optical element or a biomaterial having a control target in a nano/micrometer size area.

This application is based on and claims priority to Japanese Unexamined Patent Application Nos. 2011-137449 (filed on Jun. 21, 2011), 2011-137604 (filed on Jun. 21, 2011), and 2011-137719 (filed on Jun. 21, 2011), the entire content of which is incorporated herein by reference.

The invention claimed is:

1. An inorganic composition for transferring a fine unevenness comprising:
   a silicone compound; and
   at least two metal alkoxides, wherein
   the metal alkoxides comprise a metal alkoxide having a metal species M1, where M1 denotes at least one metal element selected from a group consisting of Ti, Zr, Zn, Sn, B, In, and Al, and a metal alkoxide having a metal species Si,
   a ratio ($C_{M1}/C_{Si}$) between a molarity ($C_{M1}$) of the metal alkoxide having the metal species M1 and a molarity ($C_{Si}$) of the metal alkoxide having the metal species Si in the inorganic composition for transferring a fine unevenness satisfies a condition of Equation (1): $0.04 \leq C_{M1}/C_{Si} \leq 4.56$, and
   the inorganic composition is prepared by mixing said silicone compound and said at least two metal alkoxides.

2. An inorganic composition for transferring a fine unevenness comprising:
   a silicone compound;
   at least two metal alkoxides; and
   an photopolymerization initiator, wherein
   the metal alkoxides comprise a metal alkoxide having a metal species M1, where M1 denotes at least one metal element selected from a group consisting of Ti, Zr, Zn, Sn, B, In, and Al, and a metal alkoxide having a metal species Si,
   the metal alkoxide having the metal species Si includes a metal alkoxide having any one of an acryl group, a methacryl group, an acryloyl group, a methacryloyl group, an acryloxy group, a methacryloxy group, a vinyl group, an epoxy group, or an oxetane group in a single molecule,
   a ratio between a molarity $C_{M1}$ of the metal alkoxide having the metal species M1 and a molarity $C_{Si}$ of the metal alkoxide having the metal species Si in the inorganic composition for transferring a fine unevenness satisfies a condition of Equation (2): $0.04 \leq C_{M1}/C_{Si} \leq 4.56$, and
   the inorganic composition is prepared by mixing said silicone compound and said at least two metal alkoxides.

3. An inorganic composition for transferring a fine unevenness comprising:
   a silicone compound;
   at least two metal alkoxides; and
   a photoacid generator, wherein
   the metal alkoxides comprise a metal alkoxide having a metal species M1, where M1 denotes at least one metal element selected from a group consisting of Ti, Zr, Zn, Sn, B, In, and Al, and a metal alkoxide having a metal species Si,
   a ratio between a molarity $C_{M1}$ of the metal alkoxide having the metal species M1 and a molarity $C_{Si}$, of the metal alkoxide having the metal species Si in the inorganic composition for transferring a fine unevenness satisfies a condition of Equation (3): $0.04 \leq C_{M1}/C_{Si} \leq 4.56$, and
   the inorganic composition is prepared by mixing said silicone compound and said at least two metal alkoxides.

4. The inorganic composition for transferring a fine unevenness according to claim 1, wherein at least any one of the silicone compound or the metal alkoxides includes an aryl group.

5. The inorganic composition for transferring a fine unevenness according to claim 4, wherein the aryl group is bound with silicon (Si).

6. The inorganic composition for transferring a fine unevenness according to claim 1, wherein the metal alkoxide is a partially condensed material.

7. The inorganic composition for transferring a fine unevenness according to claim 1, further containing a fluorine-contained silane coupling agent.

8. The inorganic composition for transferring a fine unevenness according to claim 1, wherein, when the composition is dissolved in a propylene glycol monomethyl ether solvent at a concentration of 3 weight %, and a small-angle X-ray scattering measurement using X-rays having a wavelength of 0.154 nm is performed for the solution, a radius of inertia computed by applying a Gunier plot to a result of the measurement is 5 nm or shorter.

9. The inorganic composition for transferring a fine unevenness according to claim 1, wherein the metal alkoxides are condensed in a chain of —O-M1-O-M2-O-M3-O-M4-O—, where M1, M2, M3, and M4 denote metal elements, which are identical to each other or different from each other.

10. The inorganic composition for transferring a fine unevenness according to claim 1, wherein the metal alkoxides are condensed into a general formula $[\text{—O-M-}]_n$, where M =Ti or Si, and n ≥4.

* * * * *